(12) United States Patent
Hachisuka et al.

(10) Patent No.: US 7,563,668 B2
(45) Date of Patent: Jul. 21, 2009

(54) SEMICONDUCTOR DEVICE AND METHOD OF MANUFACTURING SAME

(75) Inventors: Atsushi Hachisuka, Tokyo (JP); Atsushi Amo, Tokyo (JP); Tatsuo Kasaoka, Tokyo (JP); Shunji Kubo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 413 days.

(21) Appl. No.: 11/556,269

(22) Filed: Nov. 3, 2006

(65) Prior Publication Data

US 2007/0059885 A1    Mar. 15, 2007

Related U.S. Application Data

(62) Division of application No. 10/370,711, filed on Feb. 24, 2003, now Pat. No. 7,145,240.

(30) Foreign Application Priority Data

Oct. 7, 2002    (JP)    ............... 2002-293714

(51) Int. Cl.
*H01L 21/8242*    (2006.01)
(52) U.S. Cl. .................. 438/241; 257/E21.658
(58) Field of Classification Search ................. 438/241, 438/256, 399; 257/E21.658
See application file for complete search history.

(56) References Cited

U.S. PATENT DOCUMENTS

| | | | |
|---|---|---|---|
| 6,353,269 B1 * | 3/2002 | Huang | ............ 438/241 |
| 6,406,968 B1 | 6/2002 | Chien et al. | |
| 6,436,763 B1 * | 8/2002 | Huang et al. | ............ 438/255 |
| 6,483,162 B2 | 11/2002 | Kwon et al. | |
| 6,506,647 B2 | 1/2003 | Kuroda et al. | |
| 6,534,809 B2 | 3/2003 | Moise et al. | |
| 6,635,528 B2 | 10/2003 | Gilbert et al. | |
| 6,656,748 B2 | 12/2003 | Hall et al. | |
| 6,723,631 B2 | 4/2004 | Noguchi et al. | |

FOREIGN PATENT DOCUMENTS

| | | |
|---|---|---|
| JP | 8-107188 | 4/1996 |
| JP | 11-307742 | 11/1999 |
| JP | 2000-332216 | 3/2000 |
| JP | 2000-150827 | 5/2000 |
| JP | 2000-307085 | 11/2000 |
| JP | 2001-068643 | 3/2001 |
| JP | 2001-210798 | 8/2001 |
| JP | 2002-076300 | 3/2002 |
| JP | 2001-118241 | 4/2002 |

* cited by examiner

*Primary Examiner*—Chandra Chaudhari
(74) *Attorney, Agent, or Firm*—Oblon, Spivak, McClelland, Maier & Neustadt, P.C.

(57) ABSTRACT

A technique for enhancing the performance of a memory- and logic-equipped semiconductor device is provided. The semiconductor device comprises a semiconductor substrate (1), an insulating layer (19) on the semiconductor substrate (1), a plurality of contact plugs (16, 66) in the insulating layer (19), and an insulating layer (30) where capacitors (82), a plurality of contact plugs (25, 75), barrier metal layers (27, 87) and copper interconnections (29, 88) are formed. Source/drain regions (9) in the upper surface of the semiconductor substrate (1) are electrically connected to the copper interconnections (29). One of adjacent source/drain regions (59) in the upper surface of the semiconductor substrate (1) is electrically connected to the copper interconnection (88), while the other is electrically connected to the capacitor (82).

10 Claims, 51 Drawing Sheets

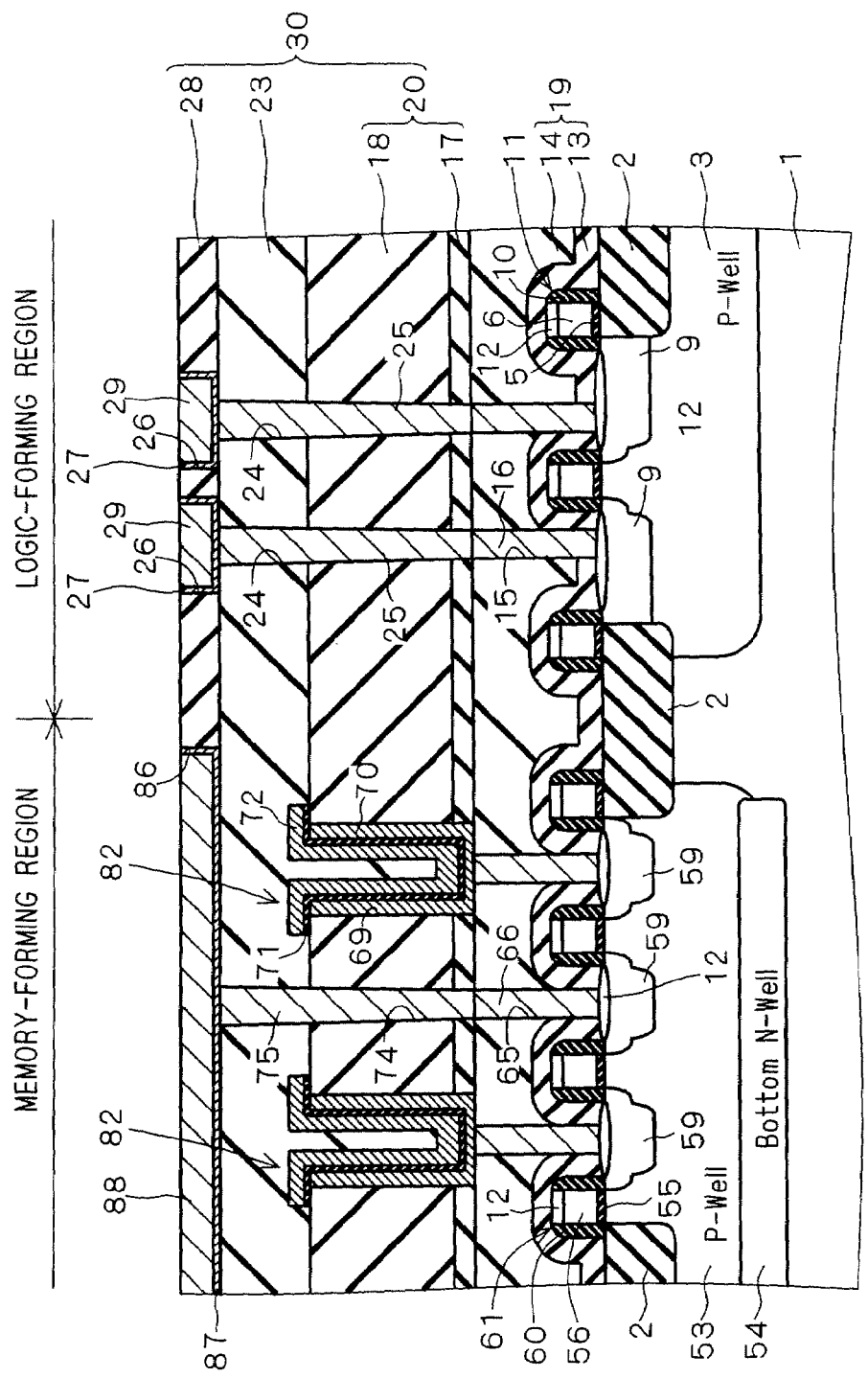
F I G. 1

SEMICONDUCTOR DEVICE AND METHOD OF MANUFACTURING SAME

Semiconductor Device and Method of Manufacturing Same This application is a Division of and claims the benefit of priority under 35 USC §120 from U.S. Ser. No. 10/370,711, filed Feb. 24, 2003, and claims the benefit of priority under 35 U.S.C. §119 from Japanese Patent Application No. 2002-293714, filed Oct. 7, 2002, the entire contents of each which are incorporated herein by reference.

BACKGROUND OF THE INVENTION

1. Field of the Invention

The present invention relates to a memory- and logic-embedded semiconductor device in which a memory and a logic devices are formed on a single semiconductor substrate, and also relates to a method of manufacturing the same.

2. Description of the Background Art

FIGS. 39 through 51 are cross-sectional views showing a sequence of process steps in a conventional method of manufacturing a memory- and logic-embedded semiconductor device. Conventional memory- and logic-embedded semiconductor devices employ, for example, DRAMs with memory cells having CUB (Capacitor Under Bit line) structures for their memory devices and salicided dual gate CMOS transistors for their logic devices.

First, as shown in FIG. 39, by means of the well-known LOCOS isolation or trench isolation technique, an element isolation insulating film 2 is formed in the upper surface of a semiconductor substrate 1 which is, for example, an n-type silicon substrate. Then, p-type well regions 3, 53 and an n-type well region 54 are formed in the upper surface of the semiconductor substrate 1. More specifically, the well region 53 is formed in the upper surface of the semiconductor substrate 1 in a region where a memory device is to be formed (hereinafter referred to as a "memory-forming region"), and the well region 54 is formed at the bottom of the well region 53. The well region 3 is formed in the upper surface of the semiconductor substrate 1 in a region where a logic device is to be formed (hereinafter referred to as a "logic-forming region"). Then, channel implantation is performed.

Then, a plurality of gate structures 61 are formed with a predetermined distance from each other on the semiconductor substrate 1 in the memory-forming region. Each of the gate structures 61 is configured such that a gate insulating film 55 using for example silicon oxide film, a gate electrode 56 using for example polycrystalline silicon film, and a silicon oxide film 57 using for example TEOS film are stacked in this order. On the semiconductor substrate 1 in the logic-forming region, a plurality of gate structures 11 are formed with a predetermined distance from each other. Each of the gate structures 11 is configured such that a gate insulating film 5 using for example silicon oxide film, a gate electrode 6 using for example polycrystalline silicon film, and a silicon oxide film 7 using for example TEOS film are stacked in this order.

Using the gate structures 11, 61 and the element isolation insulating film 2 as masks, impurities such as phosphorus or arsenic are ion implanted in relatively low concentrations into the upper surface of the semiconductor substrate 1. This forms n⁻ impurity regions 58a in the upper surface of the semiconductor substrate 1 in the memory-forming region and n⁻ impurity regions 8a in the upper surface of the semiconductor substrate 1 in the logic-forming region.

Then, as shown in FIG. 40, after formation of a silicon nitride film over the entire surface by, for example, CVD, the silicon nitride film is etched by anisotropic dry etching techniques which exhibit a high etch rate in a direction along the depth of the semiconductor substrate 1. This forms sidewalls 60 on the side surfaces of the gate structures 61 and sidewalls 10 on the side surfaces of the gate structures 11.

Then, using the gate structures 11 and 61, the element isolation insulating film 2 and the sidewalls 10 and 60 as masks, impurities such as phosphorus or arsenic are ion implanted in relatively high concentrations into the upper surface of the semiconductor substrate 1. This forms n⁺ impurity regions 58b in the upper surface of the semiconductor substrate 1 in the memory-forming region and n⁺ impurity regions 8b in the upper surface of the semiconductor substrate 1 in the logic-forming region.

Through the above process steps, a plurality of source/drain regions 59, each consisting of the impurity regions 58a and 58b, are formed with a predetermined distance from each other in the upper surface of the semiconductor substrate 1 in the memory-forming region, and the gate structures 61 each are formed on the upper surface of the semiconductor substrate 1 between the adjacent source/drain regions 59. Also, a plurality of source/drain regions 9, each consisting of the impurity regions 8a and 8b, are formed with a predetermined distance from each other in the upper surface of the semiconductor substrate 1 in the logic-forming region, and the gate structures 11 each are formed on the upper surface of the semiconductor substrate 1 between the adjacent source/drain regions 9.

For the following reason, the impurity regions 8b and 58b are formed deeper than the impurity regions 8a and 58a. That is, during formation of a cobalt silicide film 12 later to be described on the semiconductor substrate 1, the cobalt silicide film 12 may be partly formed deeply. Thus, in order to avoid electrical connections between the cobalt silicide film 12 and the well regions 3 and 53, the impurity regions 8b and 58b are formed deeper than the impurity regions 8a and 58a. At this time, if the concentration of the impurity regions 58b is too high, a leakage current flowing in a direction along the channel may be increased, thereby causing deterioration in charge retention properties (also referred to as "refresh properties") of the memory device. To prevent such degradation, the concentration of the impurity regions 58b in the memory-forming region is set to be lower than that of the impurity regions 8b in the logic-forming region.

Then, as shown in FIG. 41, the silicon oxide films 57 of the gate structures 61 and the silicon oxide films 7 of the gate structures 11 are removed with, for example, hydrofluoric acid.

Then, a cobalt film is formed over the entire surface using, for example, a sputtering method. Then, for example by thermal treatment using a lamp annealer, cobalt is reacted with contacting silicon. Thereby, as shown in FIG. 42, the upper surface of the semiconductor substrate 1 is partially silicided to form the cobalt silicide films 12 on the source/drain regions 9 and 59. Simultaneously, the upper surfaces of the gate electrodes 6 and 56 are silicided to form the cobalt silicide films 12. This results in the formation of the gate structures 11 each having the cobalt silicide film 12 on its gate electrode 6 and the formation of the gate structures 61 each having the cobalt silicide film 12 on its gate electrode 56. Afterwards, the unreacted cobalt film is removed.

Then, as shown in FIG. 43, an insulating layer 19 consisting of a stopper film 13 and an interlayer insulation film 14 is formed on the semiconductor substrate 1 to cover the gate structures 11 and 61. More specifically, the stopper film 13 is formed over the entire surface and thereafter the interlayer insulation film 14 is formed on the stopper film 13. The interlayer insulation film 14 is then planarized by, for example, CMP. This forms the insulating layer 19 having a flat upper surface on the semiconductor substrate 1. Here, the stopper film 13 is formed of, for example, silicon nitride film and the interlayer insulation film 14 is formed of, for example, BPTEOS film.

Then, as shown in FIG. 44, contact plugs 16 and 66 are formed in the insulating layer 19. The contact plugs 16 are electrically connected through the cobalt silicide films 12 to the semiconductor substrate 1 in the logic-forming region, and their upper surfaces are exposed from the interlayer insulation film 14 of the insulating layer 19. The contact plugs 66 are electrically connected through the cobalt silicide films 12 to the semiconductor substrate 1 in the memory-forming region, and their upper surfaces are exposed from the interlayer insulation film 14 of the insulating layer 19. Hereinbelow, concrete expression is given to a method of forming the contact plugs 16 and 66.

First, contact holes 65 which extend to the cobalt silicide films 12 on the semiconductor substrate 1 in the memory-forming region and contact holes 15 which extend to the cobalt silicide films 12 on the semiconductor substrate 1 in the logic-forming region are formed in the insulating layer 19.

To form the contact holes 15 and 65, a photoresist (not shown) having a predetermined opening pattern is first formed using photolithographic techniques on the interlayer insulation film 14 of the insulating layer 19. Then, using the photoresist as a mask and the stopper film 13 as an etch stop, the interlayer insulation film 14 is removed by etching. The etching at this time adopts anisotropic dry etching using a gas mixture of $C_5F_8$, $O_2$ and Ar. The photoresist is then removed and the exposed stopper film 13 is also removed by etching. The etching at this time adopts anisotropic dry etching using a gas mixture of $CHF_3$, $O_2$ and Ar. Thereby, the contact holes 15 which are located on the sides of the gate electrodes 6 above the source/drain regions 9 and the contact holes 65 which are located on the sides of the gate electrodes 56 above the source/drain regions 59 are formed in the insulating layer 19 in the logic-forming region and the memory-forming region, respectively.

Then, a multilayer film consisting of a barrier metal layer formed of, for example, titanium nitride and a high-melting metal layer formed of, for example, titanium or tungsten are formed over the entire surface. Then, the multilayer film on the upper surface of the insulating layer 19 is removed by CMP. This forms the contact plugs 16 which are formed of the barrier metal layer and the high-melting metal layers and fill in the contact holes 15, and the contact plugs 66 which are formed of the barrier metal layer and the high-melting metal layers and fill in the contact holes 65. Consequently, the source/drain regions 59 and the contact plugs 66 are electrically connected to each other, and the source/drain regions 9 and the contact plugs 16 are electrically connected to each other. Although not shown, contact plugs which are electrically connected through the cobalt silicide films 12 to the gate electrodes 56 or 6 are also formed in the insulating layer 19.

Then, as shown in FIG. 45, an insulating layer 20 consisting of a stopper film 17 and an interlayer insulation film 18 is formed over the entire surface. More specifically, the stopper film 17 formed of, for example, silicon nitride film is first formed over the entire surface. Then, the interlayer insulation film 18 is formed on the stopper film 17. This forms the insulating layer 20 on the insulating layer 19 and the contact plugs 16 and 66. The interlayer insulation film 18 is formed of, for example, BPTEOS film.

Then, as shown in FIG. 46, openings 69 are formed in the insulating layer 20 to expose some of the plurality of contact plugs 66, more specifically, the contact plugs 66 which are each electrically connected to one of the adjacent source/drain regions 59.

To form the openings 69, a photoresist (not shown) having a predetermined opening pattern is first formed on the interlayer insulation film 18 of the insulating layer 20. Then, using the photoresist as a mask and the stopper film 17 as an etch stop, the interlayer insulation film 18 is removed by etching. The etching at this time adopts anisotropic dry etching using a gas mixture of $C_5F_8$, $O_2$ and Ar. The photoresist is then removed and the exposed stopper film 17 is also removed by etching. The etching at this time adopts anisotropic dry etching using a gas mixture of $CHF_3$, $O_2$ and Ar. This forms the openings 69 in the insulating layer 20.

Then, DRAM memory cell capacitors which are in contact with the exposed contact plugs 66 are formed in the openings 69. More specifically, a metal film including a high-melting metal such as ruthenium is formed over the entire surface. The openings 69 are then covered with a photoresist (not shown) and the metal film on the upper surface of the interlayer insulation film 18 is removed by anisotropic dry etching. This forms, as shown in FIG. 47, lower electrodes 70 of the capacitors including a high-melting metal such as ruthenium, in the openings 69. Although the metal film on the upper surface of the interlayer insulation film 18 is removed by anisotropic dry etching, it may be removed by CMP.

Then, after an insulation film of tantalum pentoxide and a metal film including a high-melting metal such as ruthenium are stacked in this order over the entire surface, those films are patterned using a photoresist. This forms, as shown in FIG. 48, dielectric films 71 of the capacitors, which are formed of tantalum pentoxide, and upper electrodes 72 of the capacitors, which include a high-melting metal such as ruthenium, thereby completing the formation of the capacitors 82 in the openings 69.

Then, as shown in FIG. 49, an insulating layer 23 is formed over the entire surface and planarized by CMP. That is, the insulating layer 23 is formed on the interlayer insulation film 18 of the insulating layer 20 to cover the capacitors 82. The insulating layer 23 is formed of, for example, TEOS film and serves as an interlayer insulation film.

Then, contact holes 24 and 74 are formed in the insulating layers 20 and 23. The contact holes 24 extend from the upper surface of the insulating layer 23 to the contact plugs 16, and the contact holes 74 extend from the upper surface of the insulating layer 23 to the contact plugs 66 which are not in contact with the capacitors 82.

To form the contact holes 24 and 74, a photoresist (not shown) having a predetermined opening pattern is first formed on the insulating layer 23. Then, using the photoresist as a mask and the stopper film 17 as an etch stop, the insulating layer 23 and the interlayer insulation film 18 are removed by etching. The etching at this time adopts anisotropic dry etching using a gas mixture of $C_5F_8$, $O_2$ and Ar. The photoresist is then removed and the exposed stopper film 17 is also removed by etching. The etching at this time adopts anisotropic dry etching using a gas mixture of $CHF_3$, $O_2$ and Ar. This forms the contact holes 24 and 74. Although not shown, contact holes which extend from the upper surface of the insulating layer 23 to the upper electrodes 72 are also formed in the insulating layers 23, simultaneously with the contact holes 24 and 74.

Then, as shown in FIG. 50, contact plugs 25 of barrier metal layer and high-melting metal layer are formed to fill in the contact holes 24, and contact plugs 75 of barrier metal layer and high-melting metal layer are formed to fill in the contact holes 74. More specifically, a multilayer film formed of a barrier metal layer of, for example, titanium nitride, and a high-melting metal layer of, for example, titanium or tungsten is formed over the entire surface, with the barrier metal layer under the high-melting metal layer. Then, the multilayer film on the upper surface of the insulating layer 23 is removed by CMP. This forms the contact plugs 25 which are electrically connected to the contact plugs 16 and whose upper surfaces are exposed from the insulating layer 23, and the contact plugs 75 which are electrically connected to the contact plugs 66 not in contact with the capacitors 82 and whose upper surfaces are exposed from the insulating layer 23.

Then, as shown in FIG. 51, aluminum interconnections 127 sandwiched from above and below between titanium nitride layers 126 and 128 are formed on the insulating layer 23 to be electrically connected to the contact plugs 25, and aluminum interconnections 177 sandwiched from above and below between titanium nitride layers 176 and 178 are formed on the insulating layer 23 to be electrically connected to the contact plugs 75. The aluminum interconnections 177 are bit lines of the DRAM memory cells.

Through the aforementioned process steps, a memory device is formed in the memory-forming region and a logic device is formed in the logic-forming region.

The aforementioned conventional technique is disclosed in the inventors' early Japanese patent application No. 2002-090483.

Prior art reference information as to semiconductor devices with DRAM memory cells includes Japanese laid-open patent applications No. 8-107188, 11-307742 and 2000-307085.

As above described, it has been difficult in the conventional techniques to reduce the interconnect resistance in the semiconductor device since aluminum interconnections are formed in the upper layer. Accordingly, it has been difficult to improve the performance of the memory device formed in the memory-forming region and the logic device formed in the logic-forming region.

SUMMARY OF THE INVENTION

An object of the present invention is to provide a technique that allows enhancement of the performance of a memory- and logic-equipped semiconductor device.

According to an aspect of the present invention, a semiconductor device includes a semiconductor substrate, first and second insulating layers, first through fifth contact plugs, a capacitor, and first and second copper interconnections. The semiconductor substrate has a first region where a memory device is formed and a second region where a logic device is formed. The first insulating layer is formed on the semiconductor substrate. The first and second contact plugs are formed in the first insulating layer to be electrically connected to the semiconductor substrate in the first region and their upper surfaces are exposed from the first insulating layer. The third contact plug is formed in the first insulating layer to be electrically connected to the semiconductor substrate in the second region and its upper surface is exposed from the first insulating layer. The second insulating layer is formed on the first insulating layer and on the first through third contact plugs. The capacitor is formed in the second insulating layer to be electrically connected to the first contact plug. The fourth and fifth contact plugs are formed in the second insulating layer to be electrically connected to the second and third contact plugs, respectively. The first and second copper interconnections are formed in the second insulating layer to be electrically connected to the fourth and fifth contact plugs, respectively.

According to another aspect of the present invention, a method of manufacturing a semiconductor device includes the following steps (a) to (k). The step (a) is to prepare a semiconductor substrate having a first region where a memory device is formed and a second region where a logic device is formed. The step (b) is to form a first insulating layer on the semiconductor substrate. The step (c) is to form first through third contact plugs in the first insulating layer, the first and second contact plugs being electrically connected to the semiconductor substrate in the first region and having their upper surfaces exposed from the first insulating layer, the third contact plug being electrically connected to the semiconductor substrate in the second region and having its upper surface exposed from the first insulating layer. The step (d) is to form a second insulating layer on the first insulating layer and on the first through third contact plugs. The step (e) is to form a first opening in the second insulating layer to expose the first contact plug. The step (f) is to form a capacitor, which is in contact with the first contact plug, in the first opening. The step (g) is to form a third insulating layer on the second insulating layer to cover the capacitor. The step (h) is to form fourth and fifth contact plugs in the second and third insulating layers, the fourth contact plug being electrically connected to the second contact plug and having its upper surface exposed from the third insulating layer, the fifth contact plug being electrically connected to the third contact plug and having its upper surface exposed from the third insulating layer. The step (i) is to form a fourth insulating layer on the third insulating layer and on the fourth and fifth contact plugs. The step (j) is to form second and third openings in the fourth insulating layer to expose the fourth and fifth contact plugs, respectively. The step (k) is to form a first copper interconnection which fills in the second opening and is electrically connected to the fourth contact plug, and a second copper interconnection which fills in the third opening and is electrically connected to the fifth contact plug.

The use of copper interconnections as upper interconnections in the first and second regions can reduce wiring resistance as compared with the use of aluminum interconnections as the upper interconnections. This enhances the performance of the memory- and logic-equipped semiconductor device.

According to a still another aspect of the present invention, a method of manufacturing a semiconductor device includes the following steps (a) to (i). The step (a) is to prepare a semiconductor substrate having a first region where a memory device is formed and a second region where a logic device is formed. The step (b) is to form a first insulating layer on the semiconductor substrate. The step (c) is to form first through third contact plugs in the first insulating layer, the first and second contact plugs being electrically connected to the semiconductor substrate in the first region and having their upper surfaces exposed from the first insulating layer, the third contact plug being electrically connected to the semiconductor substrate in the second region and having its upper surface exposed from the first insulating layer. The step (d) is to form a second insulating layer on the first insulating layer and on the first through third contact plugs. The step (e) is to form a first opening in the second insulating layer to expose the first contact plug. The step (f) is to form a capacitor, which is in contact with the first contact plug, in the first opening. The step (g) is to form a third insulating layer on the second insulating layer to cover the capacitor. The step (h) is to form a first contact hole extending to the second contact plug and a second contact hole extending to the third contact plug, in the second and third insulating layers, and to form a second opening connected with the first contact hole and a third opening connected with the second contact hole in the third insulating layer. The step (i) is to fill the first contact hole and the second opening at one time with a copper material to form a fourth contact plug which fills in the first contact hole and a first copper interconnection which fills in the second opening, and to fill the second contact hole and the third opening at one time with a copper material to form a fifth contact plug which fills in the second contact hole and a second copper interconnection which fills in the third opening.

Since the first contact hole and the second opening are filled at one time with the copper material, the fourth contact plug and the first copper interconnection can be formed at the same time. Similarly, since the second contact hole and the third opening are filled at one time with the copper material, the fifth contact plug and the second copper interconnection can be formed at the same time. This reduces the number of manufacturing steps and achieves excellent mass productivity as compared with the case where the contact plugs and the copper interconnections are formed at different steps.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view showing a semiconductor device structure according to a first preferred embodiment of the present invention;

DESCRIPTION OF THE PREFERRED EMBODIMENTS

First Preferred Embodiment

Figure 2:
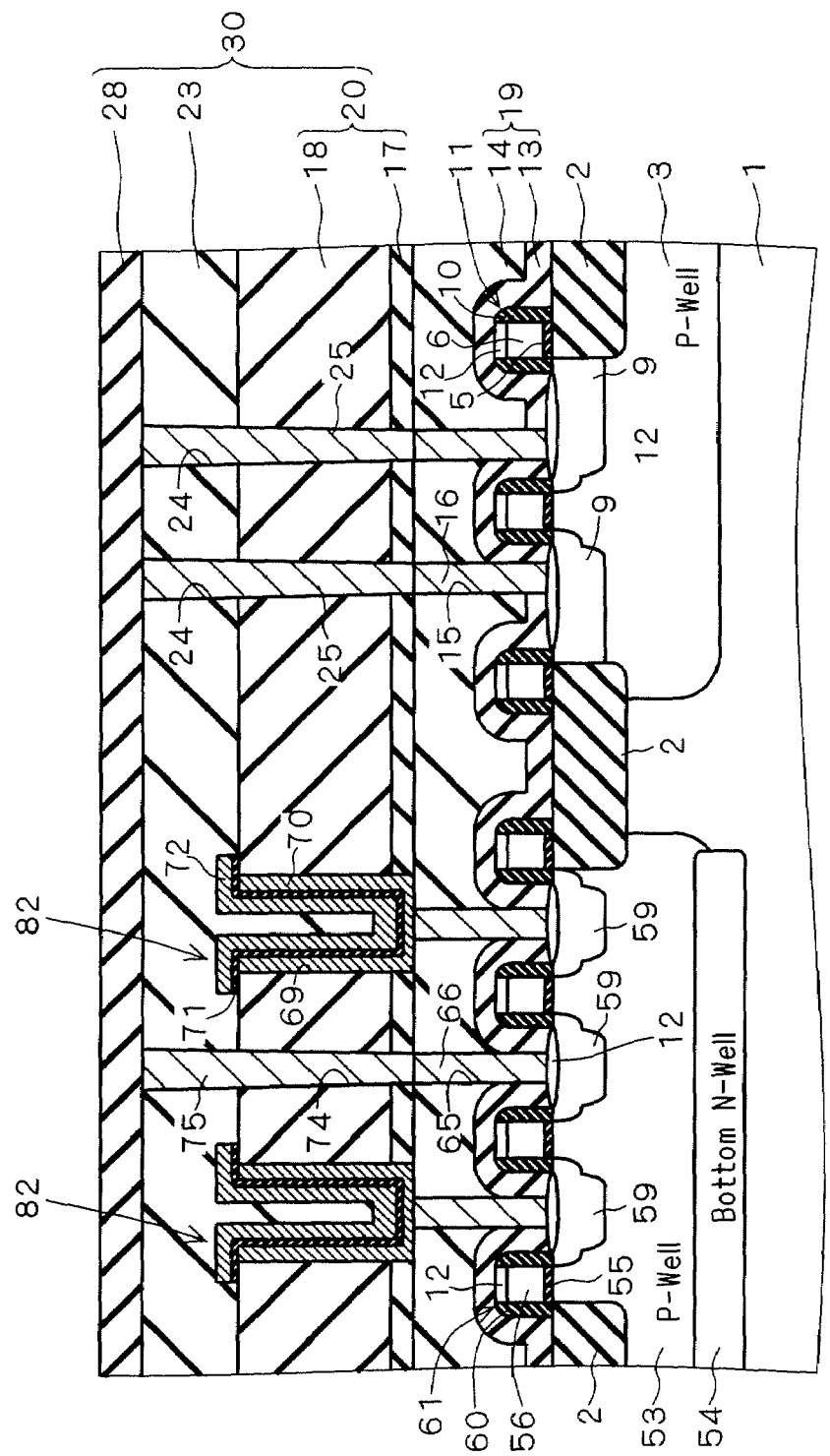
FIGS. 2 and 3 are cross-sectional views showing a sequence of process steps in a semiconductor device manufacturing method according to the first preferred embodiment of the present invention.

FIG. 1 is a cross-sectional view showing the structure of a semiconductor device according to a first preferred embodiment of the present invention. The semiconductor device of the first preferred embodiment is a memory- and logic-equipped semiconductor device which employs, for example, a DRAM with memory cells having CUB structures for its memory device and a salicided dual gate CMOS transistor for its logic device.

As shown in FIG. 1, the semiconductor device according to the first preferred embodiment comprises a semiconductor substrate 1, an insulating layer 19 which is formed on the semiconductor substrate 1 and consists of a stopper film 13 and an interlayer insulation film 14, a plurality of contact plugs 16 and 66 formed in the insulating layer 19, and an insulating layer 30 consisting of insulting layers 20, 23 and 28. The semiconductor device further comprises capacitors 82, a plurality of contact plugs 25 and 75, and copper interconnections 29 and 88, all of which are formed in the insulating layer 30.

The semiconductor substrate 1 is, for example, an n-type silicon substrate in the upper surface of which an element isolation insulating film 2 is formed. Also, a p-type well region 3 is formed in the upper surface of the semiconductor substrate 1 in a logic-forming region, and a p-type well region 53 is formed in the upper surface of the semiconductor substrate 1 in a memory-forming region. At the bottom of the well region 53, an n-type well region 54 is formed.

In the upper surface of the well region 3, a plurality of source/drain regions 9 are formed with a predetermined distance from each other, and in the upper surface of the well region 53, a plurality of source/drain regions 59 are formed with a predetermined distance from each other.

On the semiconductor substrate 1 in the memory-forming region, a plurality of gate structures 61 are formed with a predetermined distance from each other. Each of the gate structures 61 is configured such that a gate insulating film 55 using for example silicon oxide film, a gate electrode 56 using for example polycrystalline silicon film, and a cobalt silicide film 12 are stacked in this order. The gate structures 61 each are formed between the adjacent source/drain regions 59 on the upper surface of the semiconductor substrate 1 and have sidewalls 60 on their side surfaces.

On the semiconductor substrate 1 in the logic-forming region, a plurality of gate structures 11 are formed with a predetermined distance from each other. Each of the gate structures 11 is configured such that a gate insulating film 5 using for example silicon oxide film, a gate electrode 6 using for example polycrystalline silicon film, and the cobalt silicide film 12 are stacked in this order. The gate structures 11 each are formed between the adjacent source/drain regions 9 on the upper surface of the semiconductor substrate 1 and have sidewalls 10 on their side surfaces.

The cobalt silicide film 12 is also formed on each of the source/drain regions 9 and 59. The contact plugs 66 have their upper surfaces exposed from the insulating layer 19 and are electrically connected to the semiconductor substrate 1 in the memory-forming region, more specifically, the source/drain regions 59. The contact plugs 16 have their upper surfaces exposed from the insulating layer 19 and are electrically connected to the semiconductor substrate 1 in the logic-forming region, more specifically, the source/drain regions 9.

The insulating layer 30 is formed on the insulating layer 19 and the contact plugs 16 and 66. The capacitors 82 are electrically connected to some of the plurality of contact plugs 66, more specifically, the contact plugs 66 which are each electrically connected to one of the adjacent source/drain regions 59.

The contact plugs 25 are electrically connected to the contact plugs 16, and the contact plugs 75 are electrically connected to the contact plugs 66 which are not in electrical contact with the capacitors 82. The copper interconnections 29 are electrically connected through barrier metal layers 27 to the contact plugs 25, and the copper interconnections 88 are electrically connected through barrier metal layers 87 to the contact plugs 75. The copper interconnections 88 are bit lines of the DRAM memory cells and located above the capacitors 82.

Figure 51:
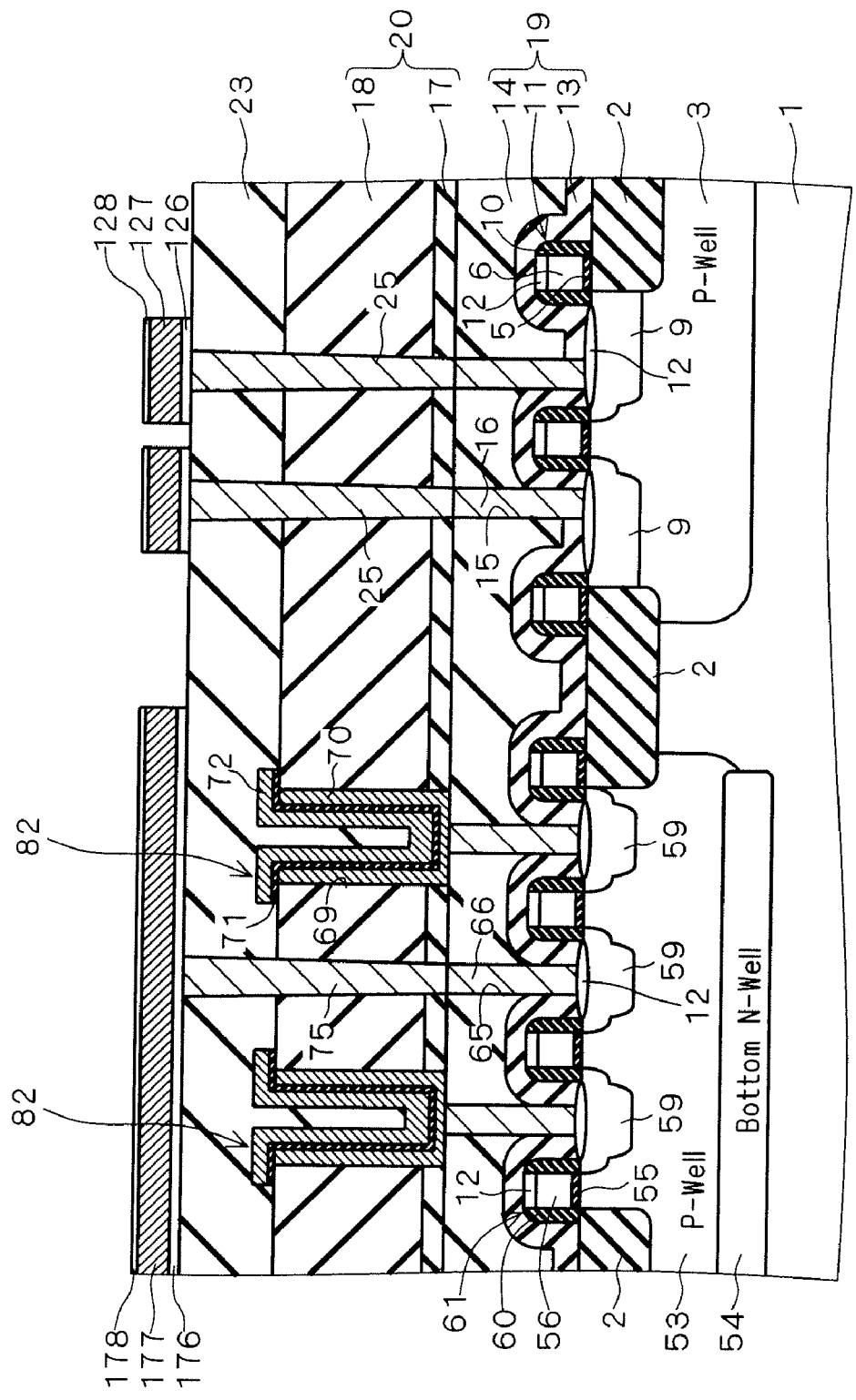

As above described, the semiconductor device according to the first preferred embodiment comprises the copper interconnections as its upper interconnections in the memory-forming region and in the logic-forming region and therefore can reduce wiring resistance as compared with the conventional semiconductor device (see FIG. 51) which employs aluminum interconnections for the upper interconnections. Thus, the performance of the memory- and logic-equipped semiconductor device can be enhanced.

Figure 3:
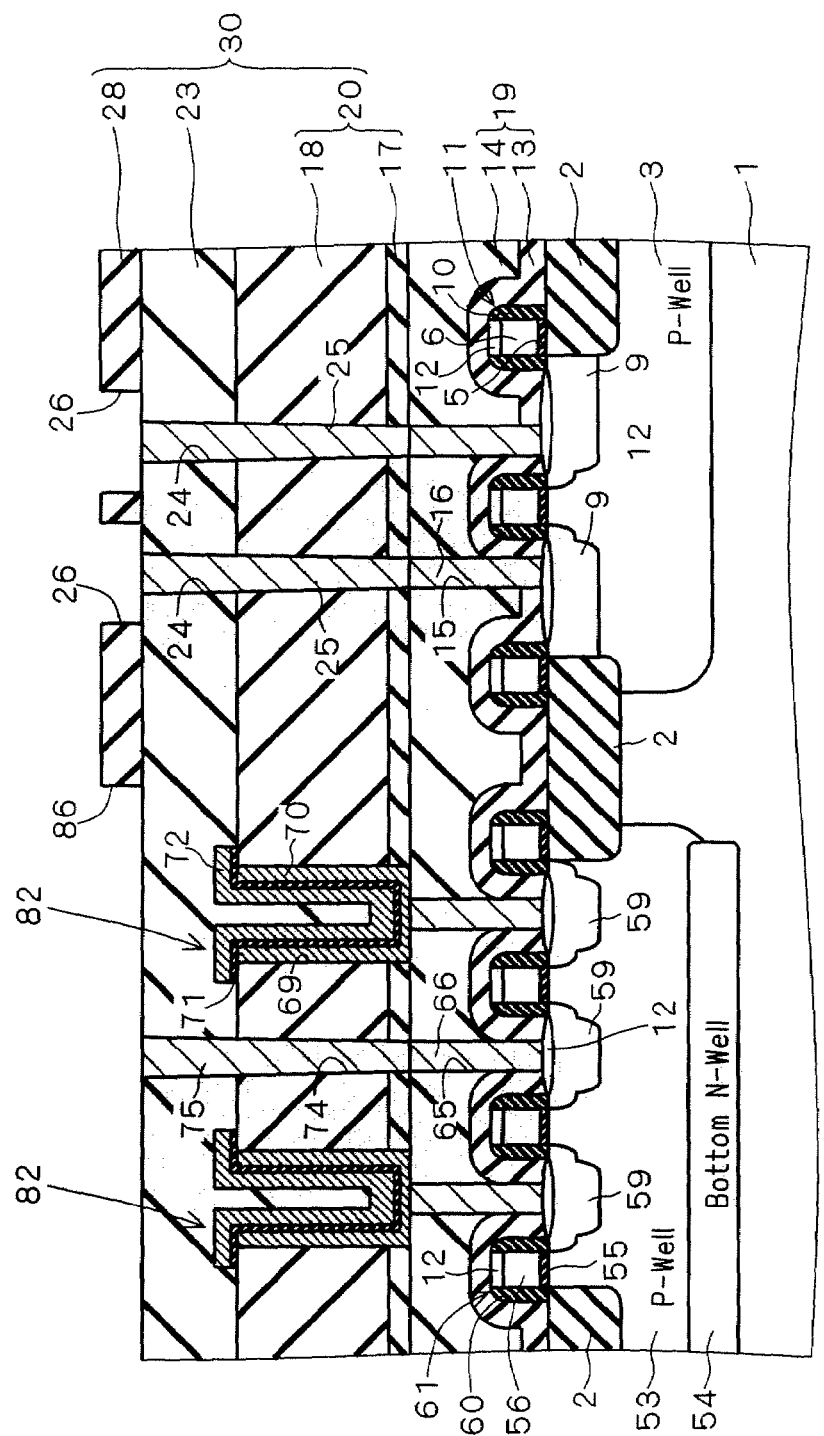

Next, a method of manufacturing the semiconductor device shown in FIG. 1 will be described. FIGS. 2 and 3 are cross-sectional views showing a sequence of process steps in a semiconductor device manufacturing method according to the first preferred embodiment. Hereinbelow, the method of manufacturing the semiconductor device shown in FIG. 1 is described with reference to FIGS. 2 and 3.

Figure 50:
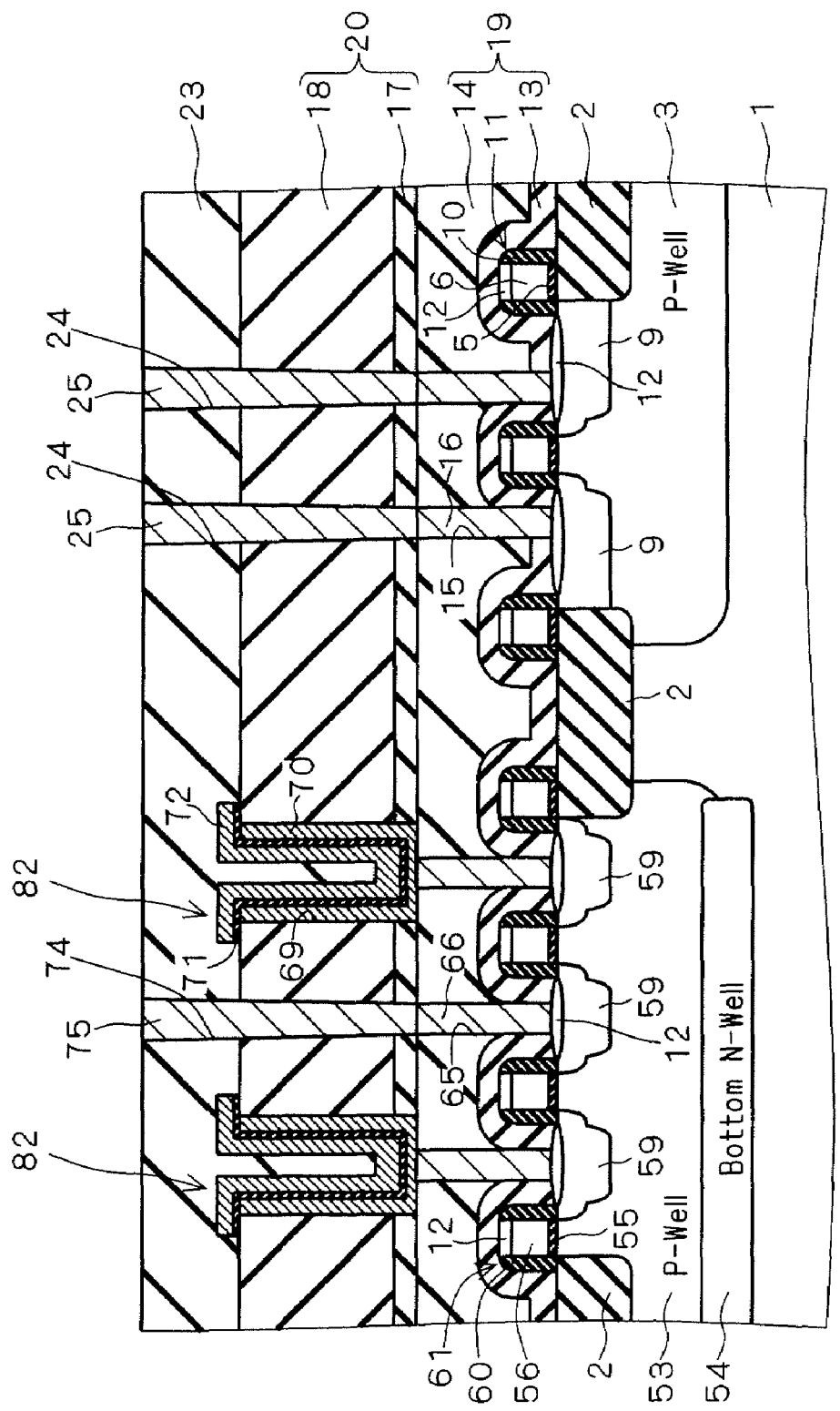

First, the structure shown in FIG. 50 is formed by using the previously-described conventional semiconductor device manufacturing method.

Then, as shown in FIG. 2, the insulating layer 28 of, for example, silicon oxide film is formed over the entire surface. That is, the insulating layer 28 is formed on the insulating layer 23 and the contact plugs 25 and 75.

Then, a photoresist (not shown) having a predetermined pattern is formed on the insulating layer 28 and, using the photoresist as a mask, the insulating layer 28 is removed by etching. This forms, as shown in FIG. 3, openings 26 and 86 which respectively expose the contact plugs 25 and 75, in the insulating layer 28.

Then, a barrier metal layer of, for example, tantalum nitride is formed over the entire surface and a copper material is formed over the entire surface to fill in the openings 26 and 86. The barrier metal layer and the copper material on the upper surface of the insulating layer 28 are then removed by, for example, CMP. This forms the copper interconnections 29 which fill in the openings 26 and which are electrically connected through the barrier metal layers 27 to the contact plugs 25, and the copper interconnections 88 which fill in the openings 86 and which are electrically connected through the barrier metal layers 87 to the contact plugs 66 not in electrical contact with the capacitors 82, thereby completing the structure shown in FIG. 1.

Through the aforementioned process steps, a memory device is formed in the memory-forming region and a logic device is formed in the logic-forming region.

As above described, the semiconductor device manufacturing method according to the first preferred embodiment employs the copper interconnections for its interconnections formed in the upper parts of the memory-forming region and the logic-forming region and therefore can reduce wiring resistance as compared with the conventional semiconductor device manufacturing method which employs aluminum interconnections for the upper interconnections. Thus, the performance of the memory- and logic-equipped semiconductor device can be enhanced.

Second Preferred Embodiment

Figure 46:
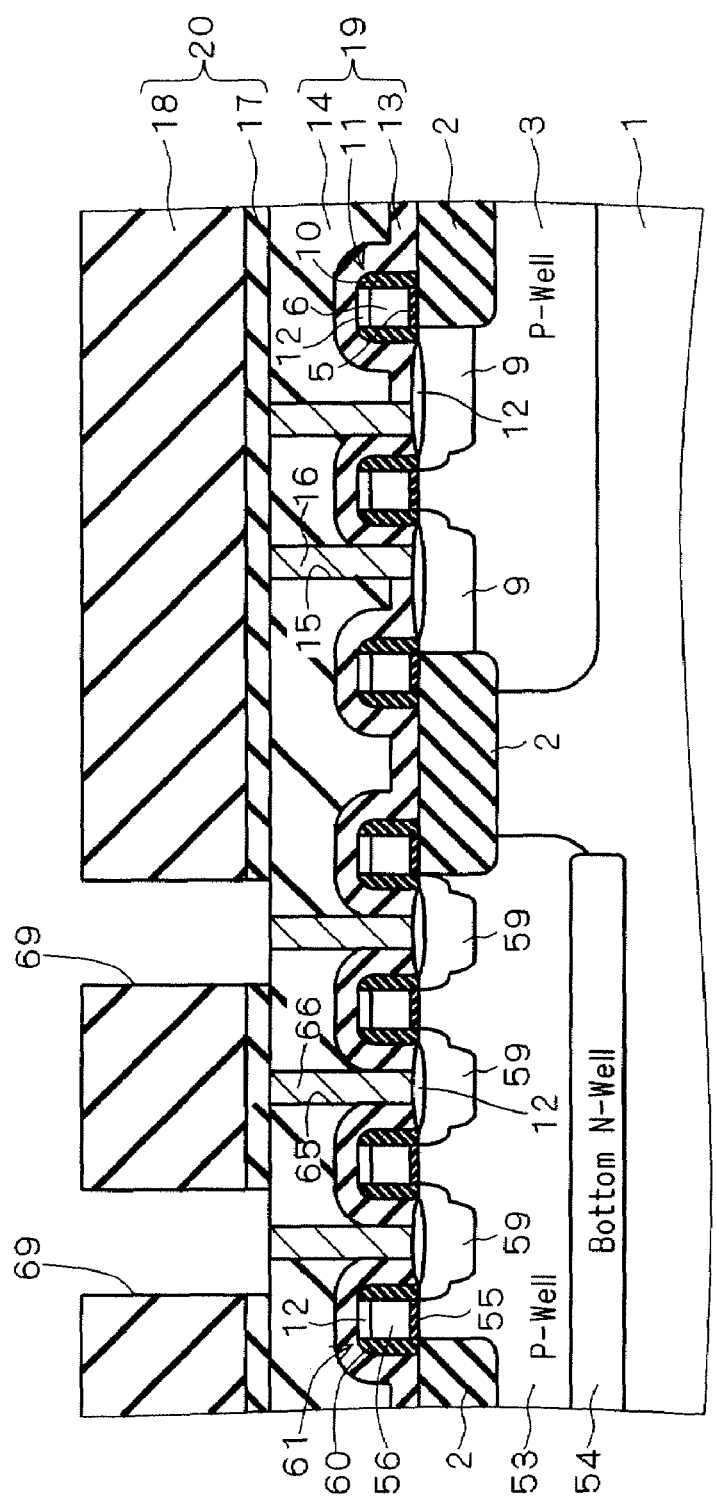
Figure 47:
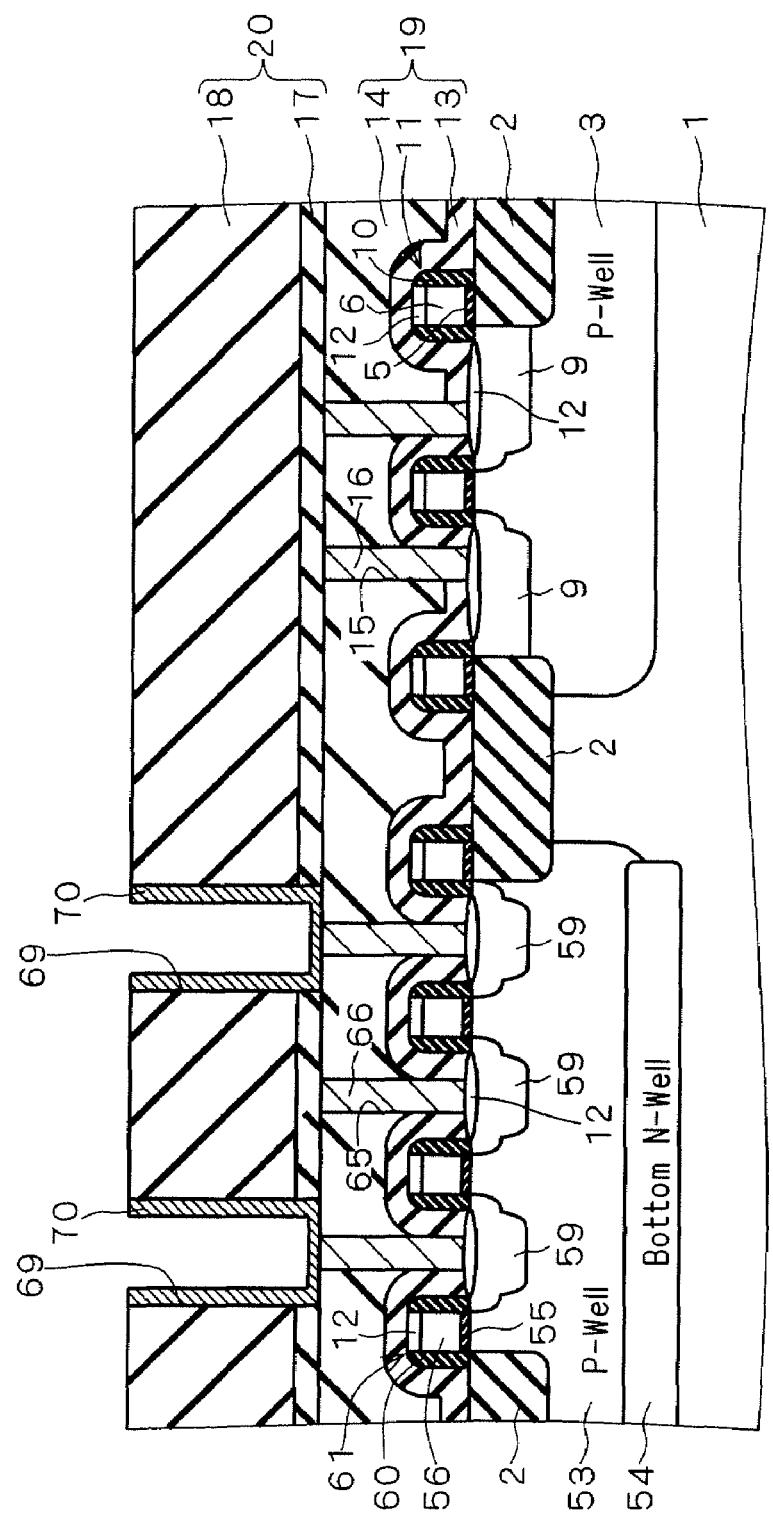
Figure 49:
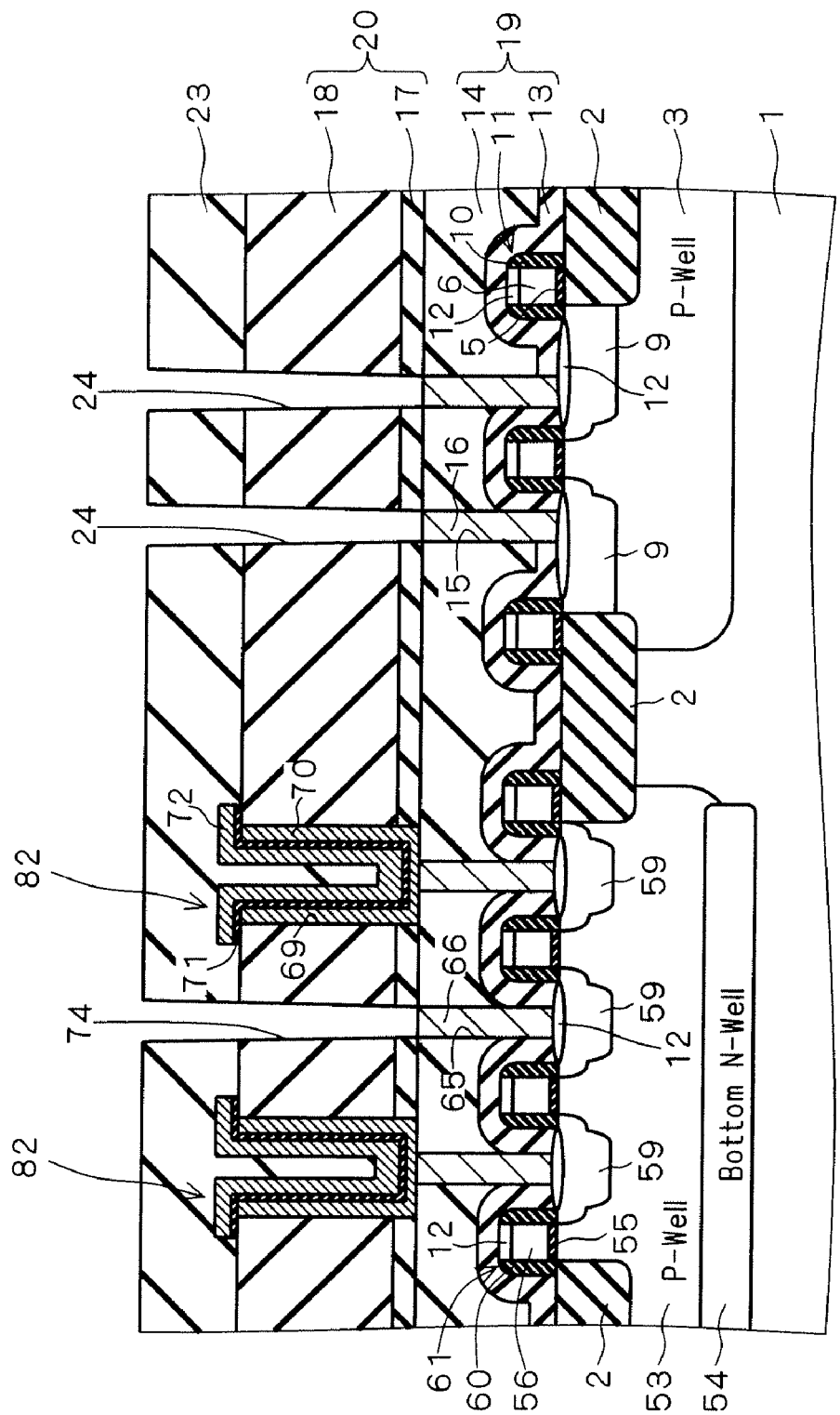

In the aforementioned semiconductor device manufacturing method according to the first preferred embodiment, in order to form the openings 69 (see FIG. 46) or the contact holes 15, 65, 24 and 74 (see FIGS. 44 and 49), the interlayer insulation films 14 and 18 are etched using the stopper films 13 and 17 as etch stops and thereafter, the stopper films 13 and 17 are etched. At this time, if the interlayer insulation films 14 and 18 are etched using the aforementioned gas mixture, a fluorocarbon (CxFy) deposition film is deposited on the upper surfaces of the stopper films 13 and 17. The formation of the deposition film improves etch selectivity between the interlayer insulation films 14, 18 and the stopper films 13, 17.

However, if the stopper films 13 and 17 are etched with the deposition film remaining thereon, the stopper films 13 and 17 cannot properly be etched since the deposition film serves as a mask. To avoid this problem, before the etching of the stopper films 13 and 17, the deposition film is removed in the process of removing a photoresist.

In this way, in order to form the openings 69 or the contact holes 15, 65, 24 and 74, the semiconductor device manufacturing method according to the first preferred embodiment requires the process of etching the interlayer insulation films 14, 18 and the process of etching the stopper films 13 and 17, and also requires, between those processes, the process of removing a photoresist. Thus, replacement of manufacturing equipment, e.g., replacement of etching equipment by ashing equipment or vice versa, is necessary for formation of the openings 69 or the contact holes 15, 65, 24 and 74. As a result, the manufacture of the semiconductor device takes time.

The second preferred embodiment and a third preferred embodiment later to be described provide manufacturing methods that allow reduction in the semiconductor device manufacturing time as compared with the aforementioned manufacturing method according to the first preferred embodiment.

FIGS. 4 through 11 are cross-sectional views showing a sequence of process steps in a semiconductor device manufacturing method according to the second preferred embodiment of the present invention. The semiconductor device according to the second preferred embodiment is a memory- and logic-equipped semiconductor device and employs, for example, a DRAM with memory cells having CUB structures for its memory device and a salicided dual gate CMOS transistor for its logic device. Hereinbelow, the semiconductor device manufacturing method according to the second preferred embodiment is described with reference to FIGS. 4 through 11.

Figure 42:
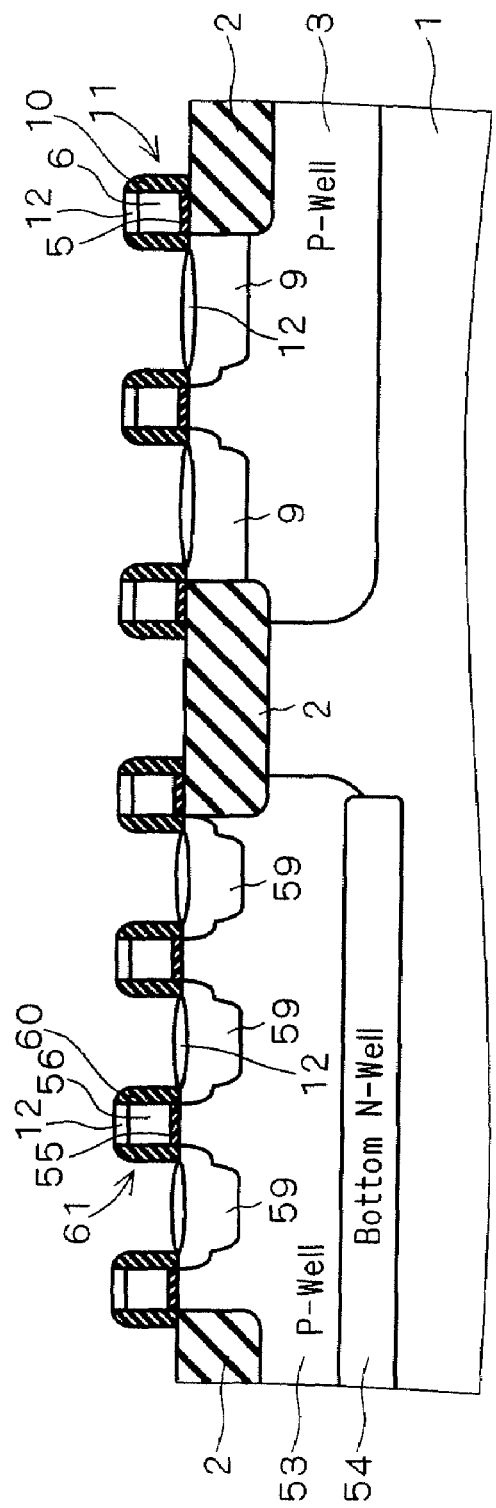

First, the structure shown in FIG. 42 is formed by using the previously-described conventional semiconductor device manufacturing method.

Figure 4:
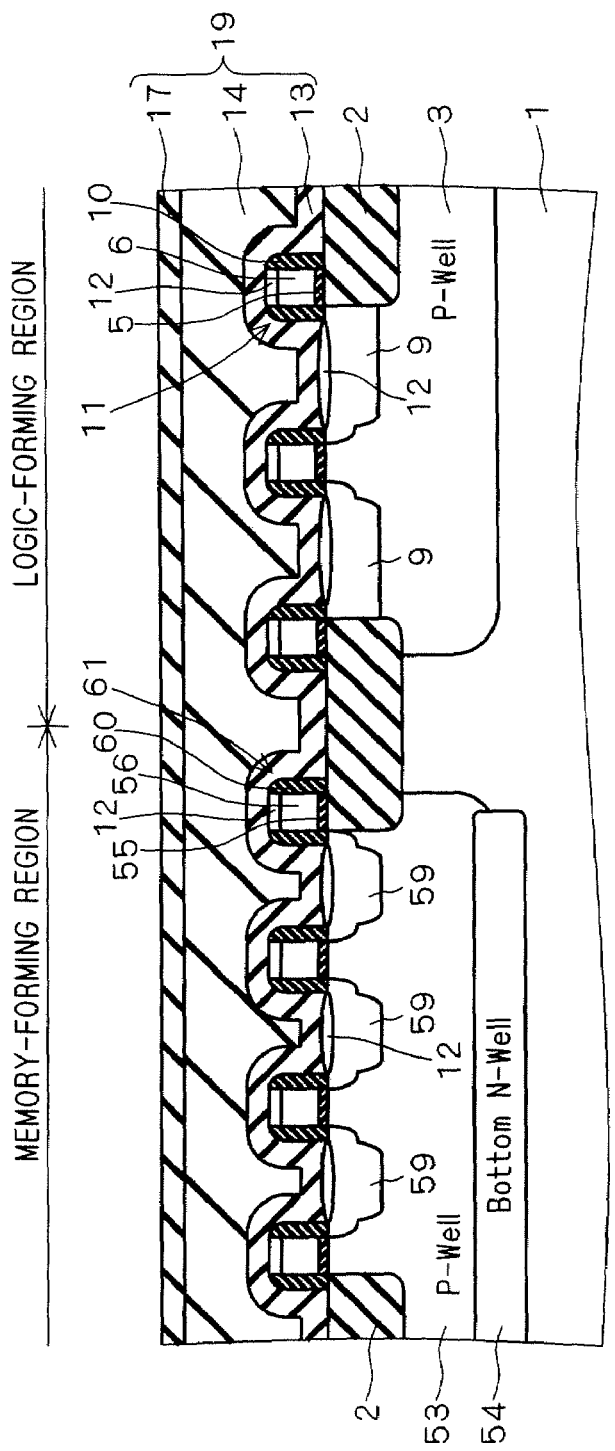
FIGS. 4 through 11 are cross-sectional views showing a sequence of process steps in a semiconductor device manufacturing method according to a second preferred embodiment of the present invention.

Then, as shown in FIG. 4, the insulating layer 19 consisting of the stopper films 13, 17 and the interlayer insulation film 14 is formed on the semiconductor substrate 1 to cover the gate structures 11 and 61. More specifically, the stopper film 13 is formed over the entire surface and the interlayer insulation film 14 is formed on the stopper film 13. Then, the stopper film 17 is formed on the interlayer insulation film 14.

While in the aforementioned first preferred embodiment the stopper film 17 is contained in the insulating layer 20, the stopper film 17 in this second preferred embodiment is contained in the insulating layer 19, not in the insulating layer 20 later to be described. That is, the insulating layer 19 contains the stopper film 17 in its upper part, so the insulating layer 20 later to be described does not contain the stopper film 17.

Figure 5:
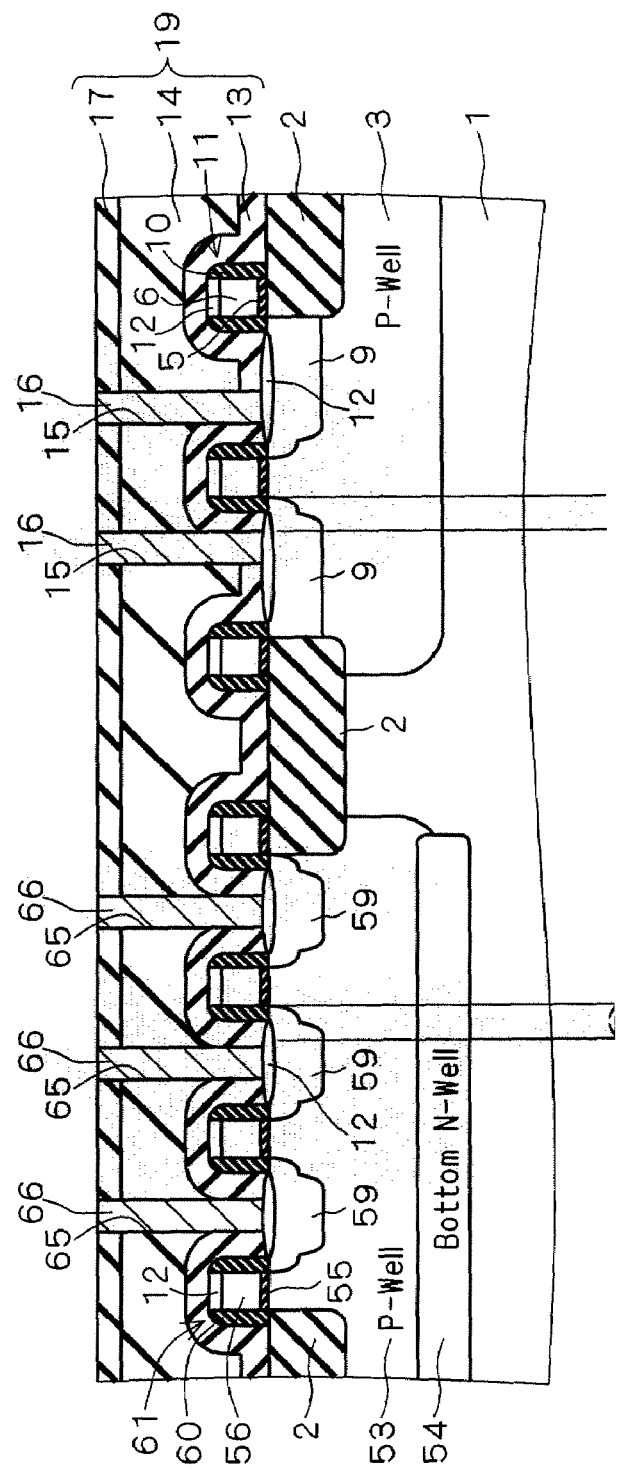

Then, as shown in FIG. 5, the contact plugs 16 and 66 are formed in the insulating layer 19. The contact plugs 16 are electrically connected through the cobalt silicide films 12 to the semiconductor substrate 1 in the logic-forming region, and their upper surfaces are exposed from the stopper film 17 of the insulating layer 19. The contact plugs 66 are electrically connected through the cobalt silicide films 12 to the semiconductor substrate 1 in the memory-forming region, and their upper surfaces are exposed from the stopper film 17 of the insulating layer 19. Hereinbelow, concrete expression is given to a method of forming the contact plugs 16 and 66.

First, the contact holes 65 which extend to the cobalt silicide films 12 on the semiconductor substrate 1 in the memory-forming region, and the contact holes 15 which extend to the cobalt silicide films 12 on the semiconductor substrate 1 in the logic-forming region are formed in the insulating layer 19.

To form the contact holes 15 and 65, a photoresist (not shown) having a predetermined opening pattern is first formed by photolithographic techniques on the stopper film 17 of the insulating layer 19. Then, using the photoresist as a mask, the stopper film 17 is removed by etching. The etching at this time adopts, for example, anisotropic dry etching using a gas mixture of $CHF_3$, $O_2$ and Ar.

Then, etching conditions such as a gas to be used is altered and the interlayer insulation film 14 of the insulating layer 19 is etched using again the photoresist on the stopper film 17 as a mask. At this time, the stopper film 13 serves as an etch stop. The etching at this time uses, for example, a gas mixture of $C_5F_8$, $O_2$ and Ar.

After removal of the photoresist, etching is performed on the entire surface to remove the exposed stopper film 13. The etching at this time adopts anisotropic dry etching using a gas mixture of $CHF_3$, $O_2$ and Ar. Thereby, the contact holes 15 which are located on the sides of the gate electrodes 6 and above the source/drain regions 9 and the contact holes 65 which are located on the sides of the gate electrodes 56 and above the source/drain regions 59 are formed in the insulating layer 19 in the logic-forming region and the memory-forming region, respectively. In the etching of the stopper film 13, the stopper film 17 is also etched since etching is performed on the entire surface. Thus, the thickness of the stopper film 17 should be set so that the stopper film 17 of a predetermined thickness remains after the completion of the etching of the stopper film 13.

Then, a multilayer film formed of a barrier metal layer of, for example, titanium nitride and a high-melting metal layer of, for example, titanium or tungsten is formed over the entire surface. Then, the multilayer film on the upper surface of the insulating layer 19 is removed by CMP. This forms the contact plugs 16 which are formed of the barrier metal layer and the high-melting metal layer and fill in the contact holes 15, and the contact plugs 66 which are formed of the barrier metal layer and the high-melting metal layer and fill in the contact holes 65. Consequently, electrical connections are provided between the source/drain regions 59 and the contact plugs 66 and between the source/drain regions 9 and the contact plugs 16. Although not shown, contact plugs which are electrically connected through the cobalt silicide films 12 to the gate electrodes 56 or 6 are also formed in the insulating layer 19.

Figure 6:
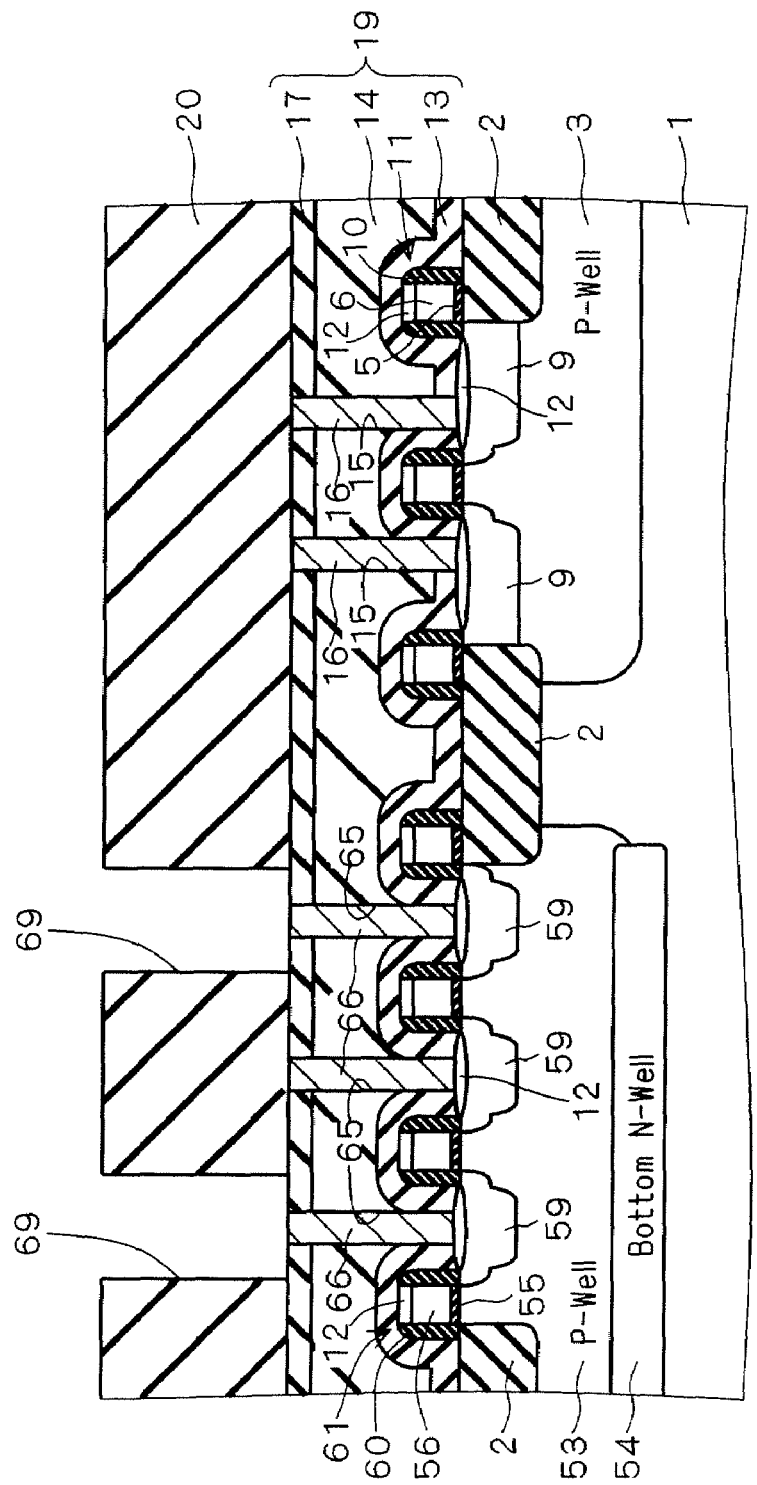

Then, as shown in FIG. 6, the insulating layer 20 consisting of the interlayer insulation film 18 is formed over the entire surface. That is, the insulating layer 20 or the interlayer insulation film 18 is formed on the stopper film 17 of the insulating layer 19 and the contact plugs 16 and 66. Then, a photoresist (not shown) having a predetermined opening pattern is formed on the insulating layer 20 and, using the photoresist as a mask and the stopper film 17 and the contact plugs 66 as etch stops, the insulating layer 20 is removed by etching. The photoresist is then removed. The etching at this time adopts anisotropic dry etching using a gas mixture of $C_5F_8$, $O_2$ and Ar. Thereby, the openings 69 are formed in the insulating layer 20 to expose the contact plugs 66 which are each electrically connected to one of the adjacent source/drain regions 59.

In the etching technique employed for removal of the insulating layer 20, the contact plugs 66 are hard to etch and, in general, etch selectivity between the insulating layer 20 and the contact plugs 66 is high enough. Thus, like the stopper film 17, the contact plugs 66 can also be used as etch stops to prevent the openings 69 from extending to the gate electrodes 56 or to the semiconductor substrate 1.

Figure 7:
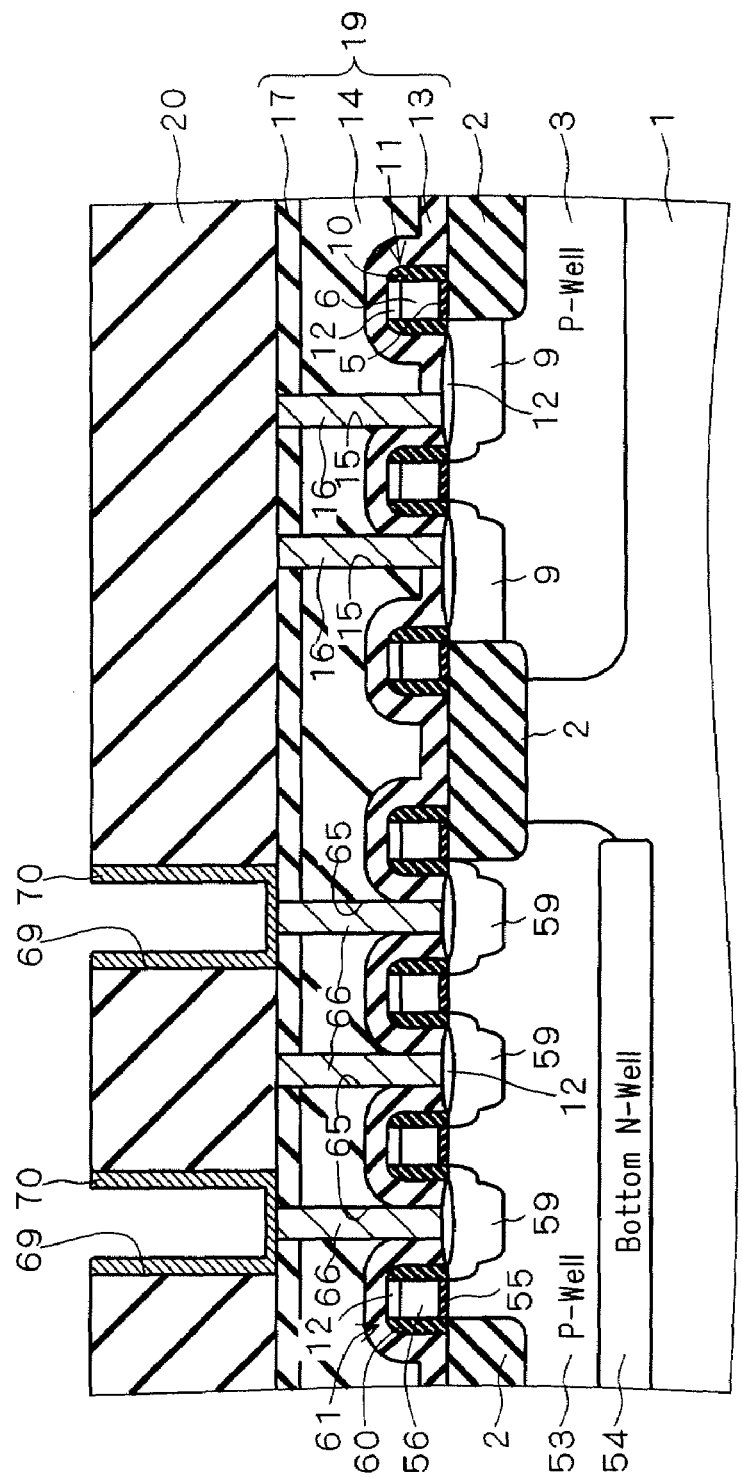

Then, the DRAM memory cell capacitors 82 which are in contact with the contact plugs 66 are formed in the openings 69. More specifically, a metal film including a high-melting metal such as ruthenium is first formed over the entire surface. Then, the openings 69 are covered with a photoresist (not shown) and the metal film on the upper surface of the insulating layer 20 is removed by anisotropic dry etching. This forms, as shown in FIG. 7, the lower electrodes 70 of the capacitors in the openings 69. Although the metal film on the upper surface of the insulating layer 20 is removed by anisotropic dry etching, it may be removed by CMP.

Figure 8:
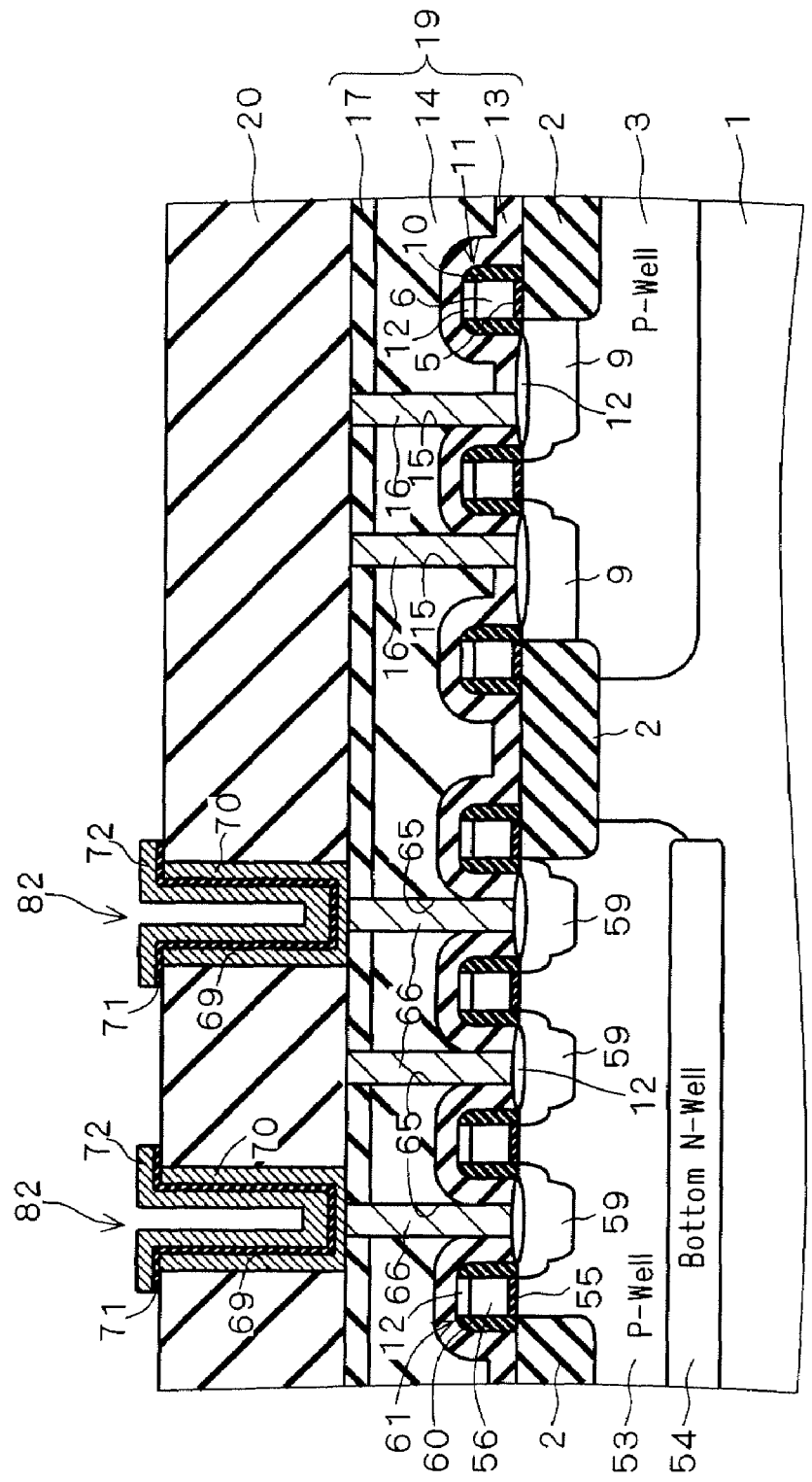

Then, after an insulation film of tantalum pentoxide and a metal film including a high-melting metal such as ruthenium are stacked in this order over the entire surface, those films are patterned using a photoresist. This forms, as shown in FIG. 8, the dielectric films 71 and the upper electrodes 72 of the capacitors, thereby completing the formation of the capacitors 82 in the openings 69.

Figure 9:
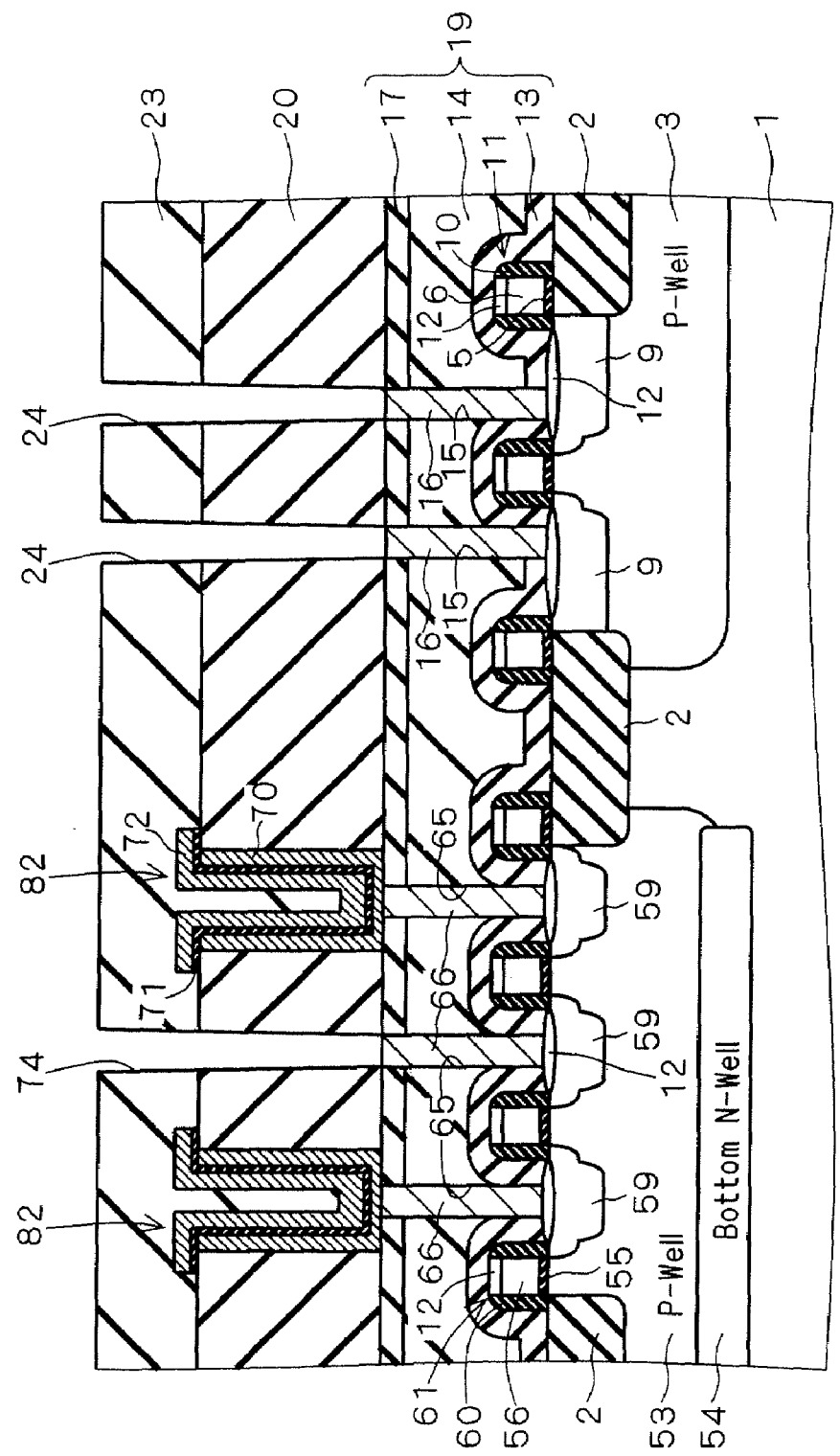

Then, as shown in FIG. 9, the insulating layer 23 is formed over the entire surface and planarized by CMP. That is, the insulating layer 23 is formed on the insulating layer 20 to cover the capacitors 82. Also, the contact holes 24 and 74 are formed in the insulating layers 20 and 23. More specifically, a photoresist (not shown) having a predetermined opening pattern is formed on the insulating layer 20 and, using the photoresist as a mask and the stopper film 17 and the contact plugs 16, 66 as etch stops, the insulating layers 20 and 23 are removed by etching. The photoresist is then removed. The etching at this time adopts anisotropic dry etching using a gas mixture of $C_5F_8$, $O_2$ and Ar.

This forms the contact holes 24 which extend from the upper surface of the insulating layer 23 to the contact plugs 16, and the contact holes 74 which extend from the upper surface of the insulating layer 23 to the contact plugs 66 not in contact with the capacitors 82.

In the etching technique employed for removal of the insulating layers 20 and 23, the contact plugs 16 and 66 are hard to etch and, in general, etch selectivity between the insulating layers 20, 23 and the contact plugs 16, 66 is high enough. Thus, the contact plugs 16 and 66 can be used as etch stops. Although not shown, contact holes which extend from the upper surface of the insulating layer 23 to the upper electrodes 72 are also formed in the insulating layer 23.

Figure 10:
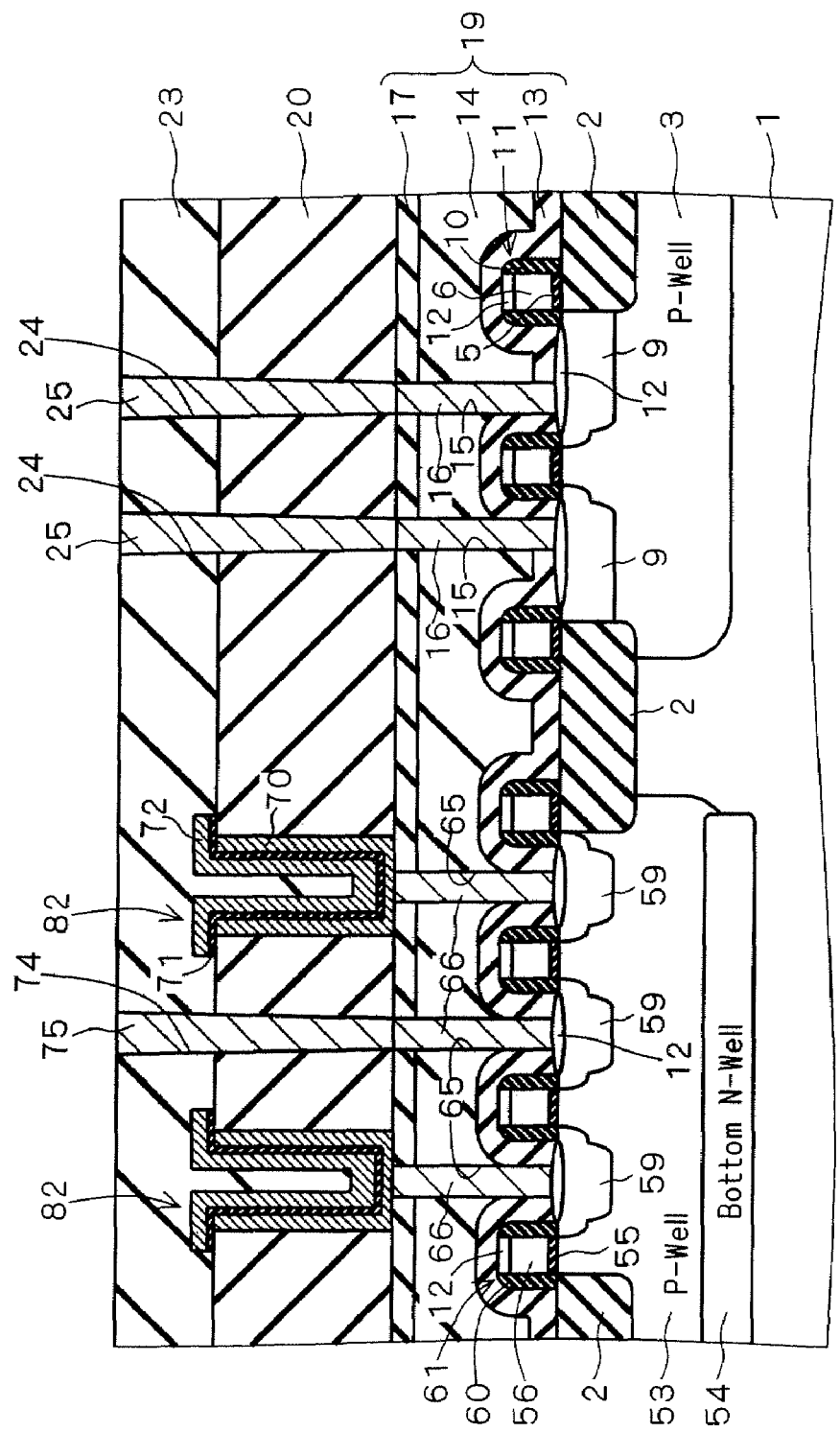
Figure 11:
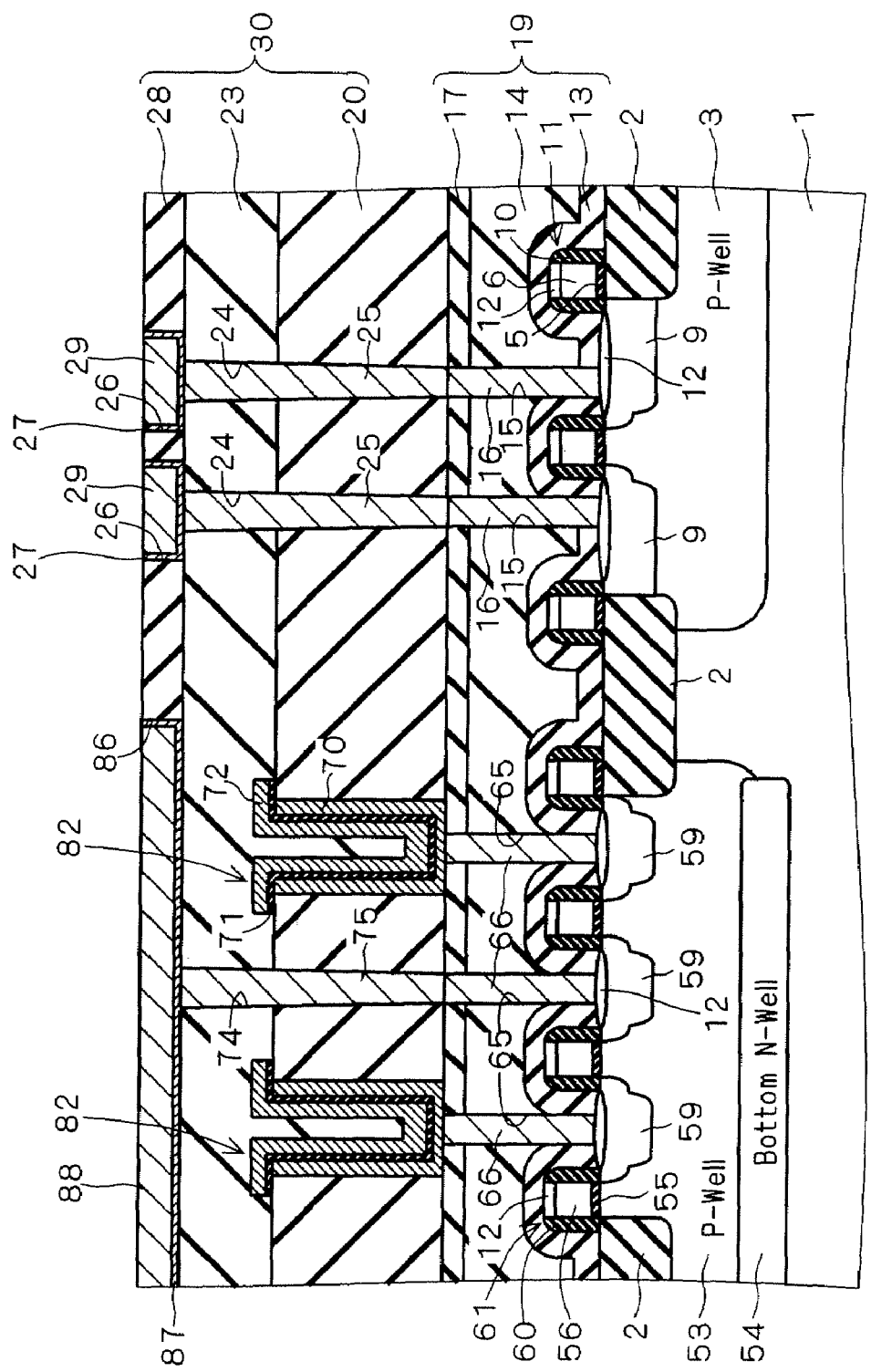

Then, a multilayer film formed of a barrier metal layer of, for example, titanium nitride and a high-melting metal layer of, for example, titanium or tungsten is formed over the entire surface. Then, the multilayer film on the upper surface of the insulating layer 23 is removed by CMP. This forms, as shown in FIG. 10, the contact plugs 25 which fill in the contact holes 24 and the contact plugs 75 which fill in the contact holes 74.

Then, the insulating layer 28, the openings 26 and 86, the barrier metal layers 27 and 87, and the copper interconnections 29 and 88 are formed according to the manufacturing method identical to that in the aforementioned first preferred embodiment. This results in the structure shown in FIG. 11.

Through the above process steps, a memory device is formed in the memory-forming region and a logic device is formed in the logic-forming region.

As above described, in the semiconductor device manufacturing method according to the second preferred embodiment, since the contact plugs 16 and 66 are formed also in the stopper film 17, the stopper film 17 is not to be etched at the time of formation of the openings 69 or the contact holes 24 and 74. Although the method according to the second preferred embodiment requires replacement of etching equipment by ashing equipment since the photoresist needs to be removed after etching of the interlayer insulation films, unlike the aforementioned manufacturing method according to the first preferred embodiment, it does not require replacement of ashing equipment by etching equipment for formation of the openings 69 or the contact holes 24 and 74. This reduces the time required to form the openings 69 or the contact holes 24 and 74. Consequently, the semiconductor device manufacturing time can be made shorter than in the manufacturing method according to the first preferred embodiment.

A comparison between the process of forming the contact holes 15, 65 in the second preferred embodiment (see FIG. 5) and that in the first preferred embodiment (see FIG. 44) indicates that the second preferred embodiment further requires the process of etching the stopper film 17. However, a process subsequent to the etching of the stopper film 17 is the process of etching the interlayer insulation film 14; therefore, without necessitating replacement of manufacturing equipment, only the etching conditions should be altered to switch from the process of etching the stopper film 17 to the process of etching the interlayer insulation film 14. Accordingly, an increase in the manufacturing time due to addition of the process step of etching the stopper film 17 becomes so small as compared with the aforementioned reduction in the manufacturing time and therefore have little effect on the total manufacturing time.

Third Preferred Embodiment

FIGS. 12 through 16 are cross-sectional views showing a sequence of process steps in a semiconductor manufacturing method according to a third preferred embodiment of the present invention. The semiconductor device according to the third preferred embodiment is a memory- and logic-equipped semiconductor device and employs, for example, a DRAM with memory cells having CUB structures for its memory device and a salicided dual gate CMOS transistor for its logic device. Hereinbelow, the semiconductor device manufacturing method according to the third preferred embodiment is described with reference to FIGS. 12 through 16.

Figure 44:
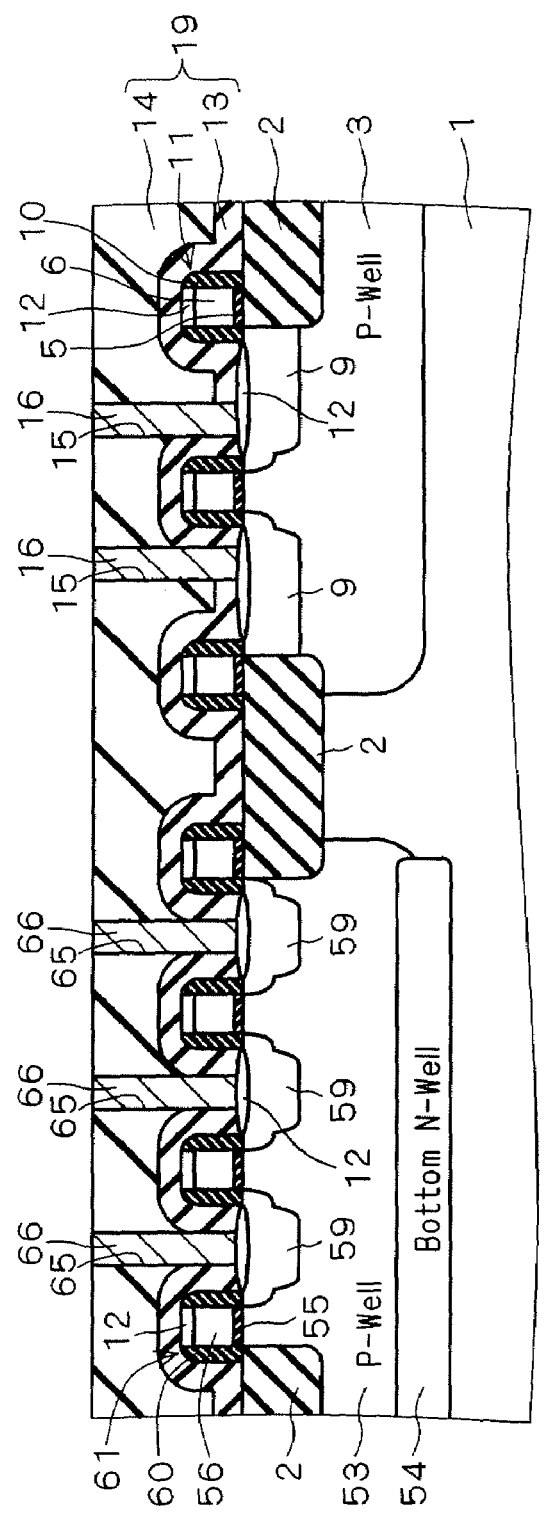
Figure 45:
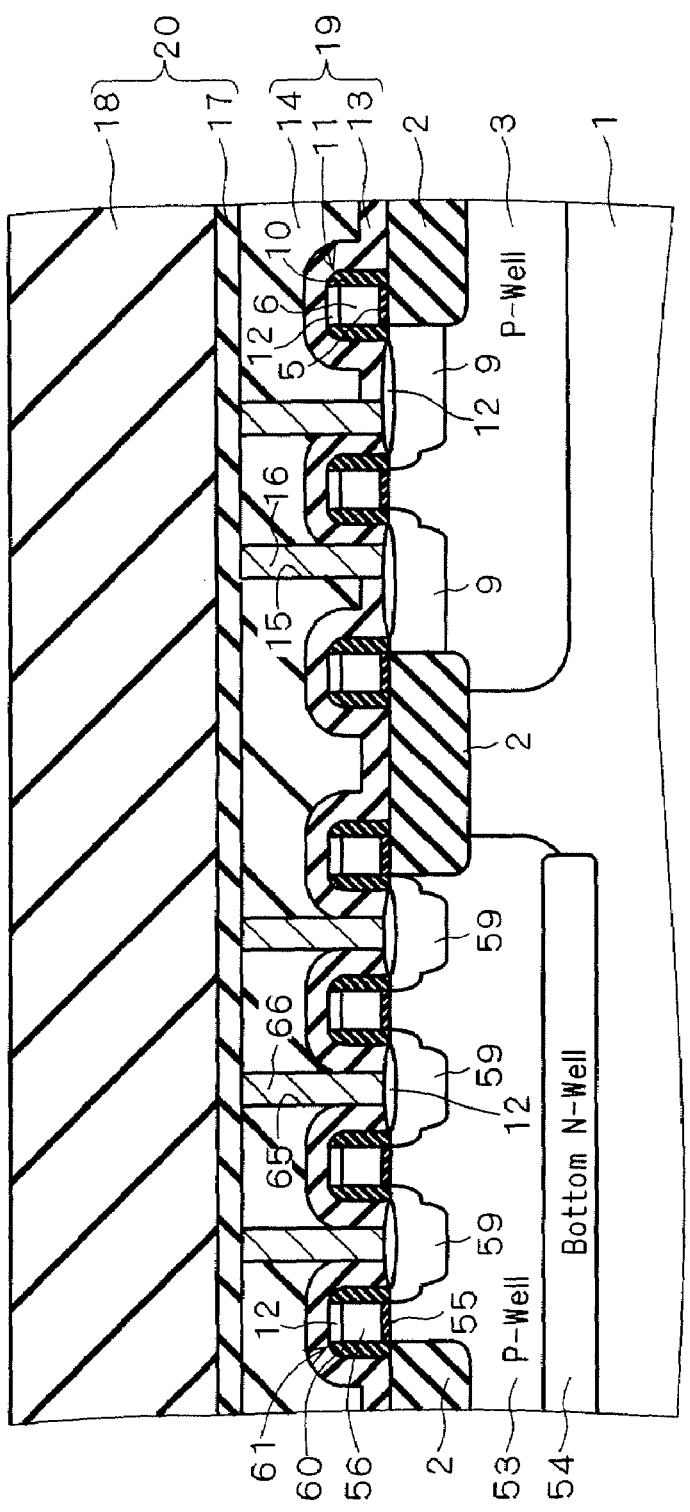

First, the structure shown in FIG. 44 is formed by using the previously-described conventional semiconductor device manufacturing method.

Figure 12:
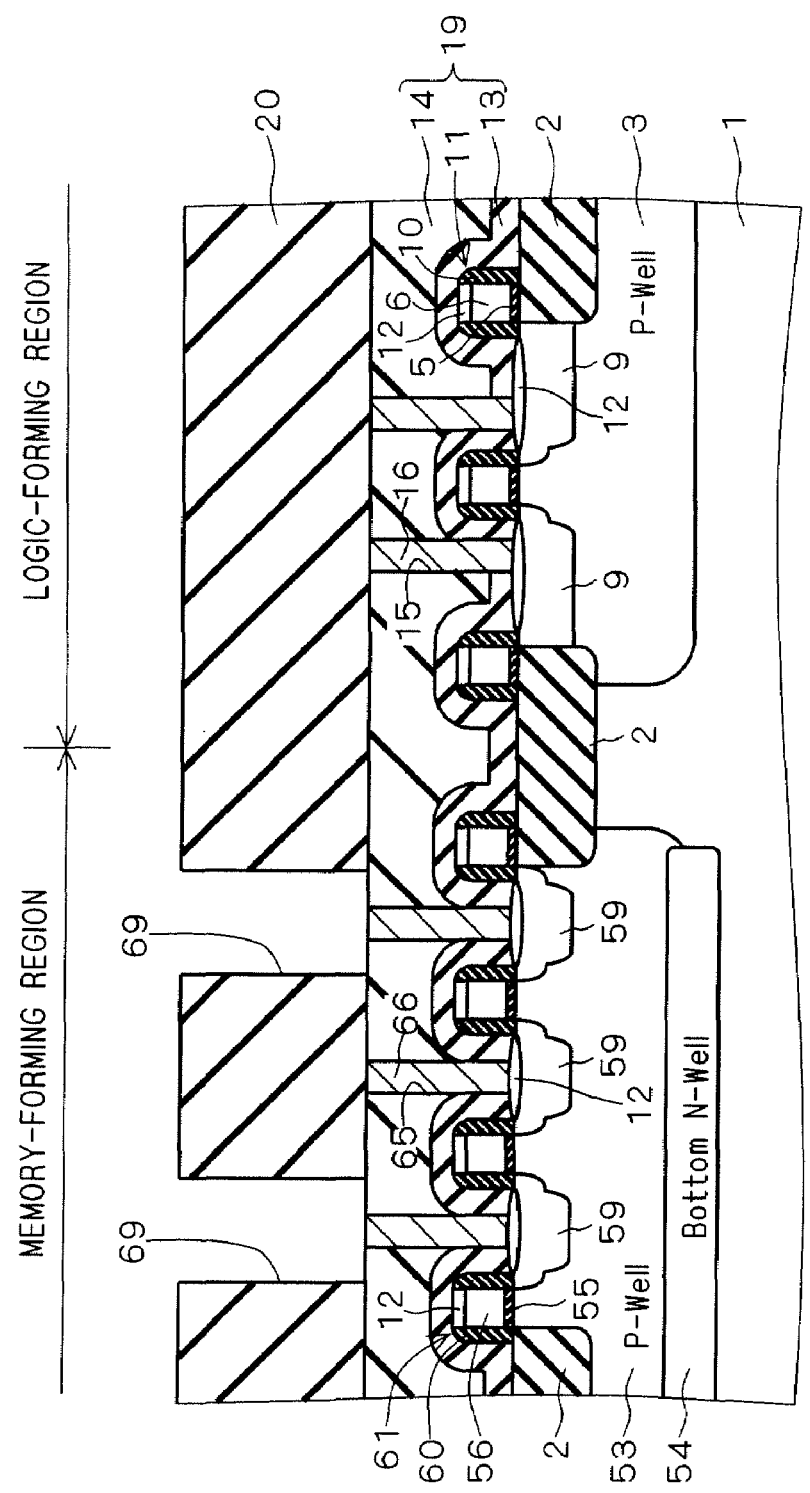
FIGS. 12 through 16 are cross-sectional views showing a sequence of process steps in a semiconductor device manufacturing method according to a third preferred embodiment of the present invention.

Then, as shown in FIG. 12, the insulating layer 20 consisting of the interlayer insulation film 18 is formed over the entire surface. That is, the insulating layer 20 is formed on the interlayer insulation film 14 of the insulating layer 19 and the contact plugs 16 and 66. While the insulating layer 20 in the aforementioned first preferred embodiment contains the stopper film 17, the insulating layer 20 in the third preferred embodiment does not contain the stopper film 17.

Then, a photoresist (not shown) having a predetermined opening pattern is formed on the insulating layer 20 and, using the photoresist as a mask, the insulating layer 20 is removed by etching. The photoresist is then removed. The etching at this time adopts anisotropic dry etching using a gas mixture of $C_5F_8$, $O_2$ and Ar. Thereby, the openings 69 are formed in the insulating layer 20 to expose the contact plugs 16 which are each electrically connected to one of the adjacent source/drain regions 59.

In the etching technique employed for removal of the insulating layer 20, the contact plugs 66 are hard to etch and, in general, etch selectivity between the insulating layer 20 and the contact plugs 66 is high enough. Further, the amount of overetch of the insulating layer 20 can be reduced by improving uniformity in the thickness of the insulating layer 20 and stabilizing the etch rate of the insulating layer 20. This prevents the openings 69 from extending to the gate electrodes 56 or to the semiconductor substrate 1.

Figure 13:
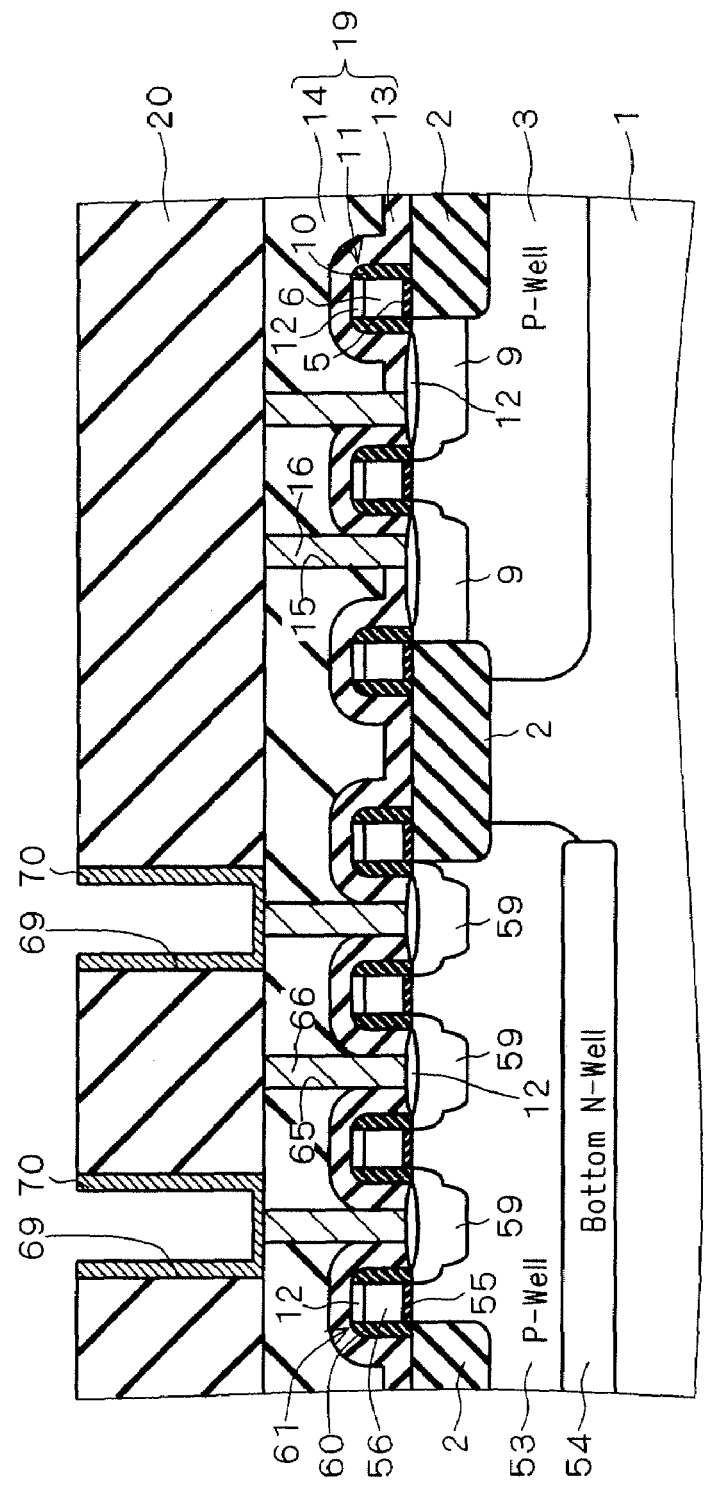

Then, the DRAM memory cell capacitors 82 which are in contact with the contact plugs 66 are formed in the openings 69. More specifically, a metal film including a high-melting metal such as ruthenium is first formed over the entire surface. Then, the openings 69 are covered with a photoresist (not shown) and the metal film on the upper surface of the insulating layer 20 is removed by anisotropic dry etching. This forms, as shown in FIG. 13, the lower electrodes 70 of the capacitors in the openings 69. Although the metal film on the upper surface of the insulating layer 20 is removed by anisotropic dry etching, it may be removed by CMP.

Figure 14:
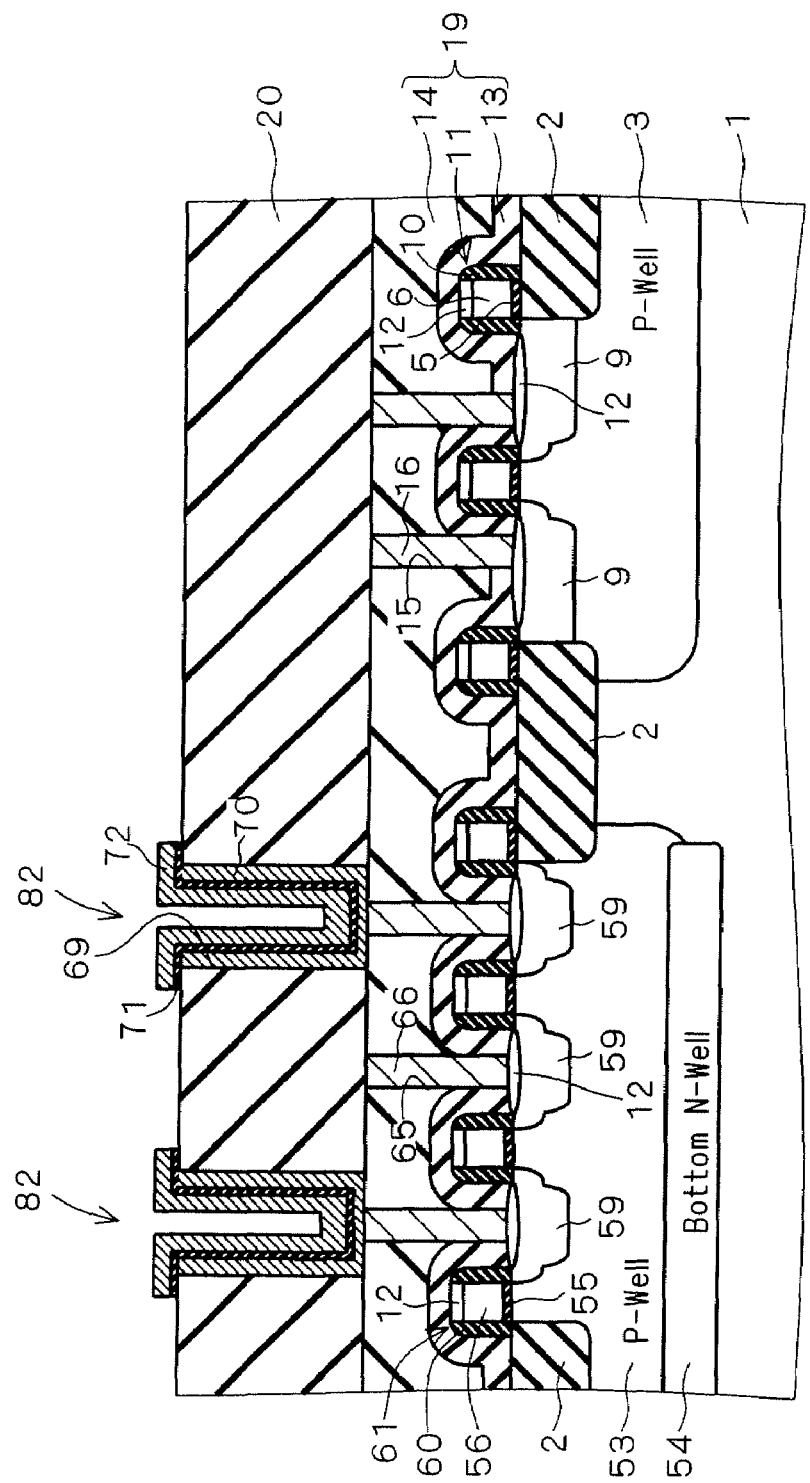

Then, after an insulation film of tantalum pentoxide and a metal film including a high-melting metal such as ruthenium are stacked in this order over the entire surface, those films are patterned using a photoresist. This forms, as shown in FIG. 14, the dielectric films 71 and the upper electrodes 72 of the capacitors, thereby completing the formation of the capacitors 82 in the openings 69.

Figure 15:
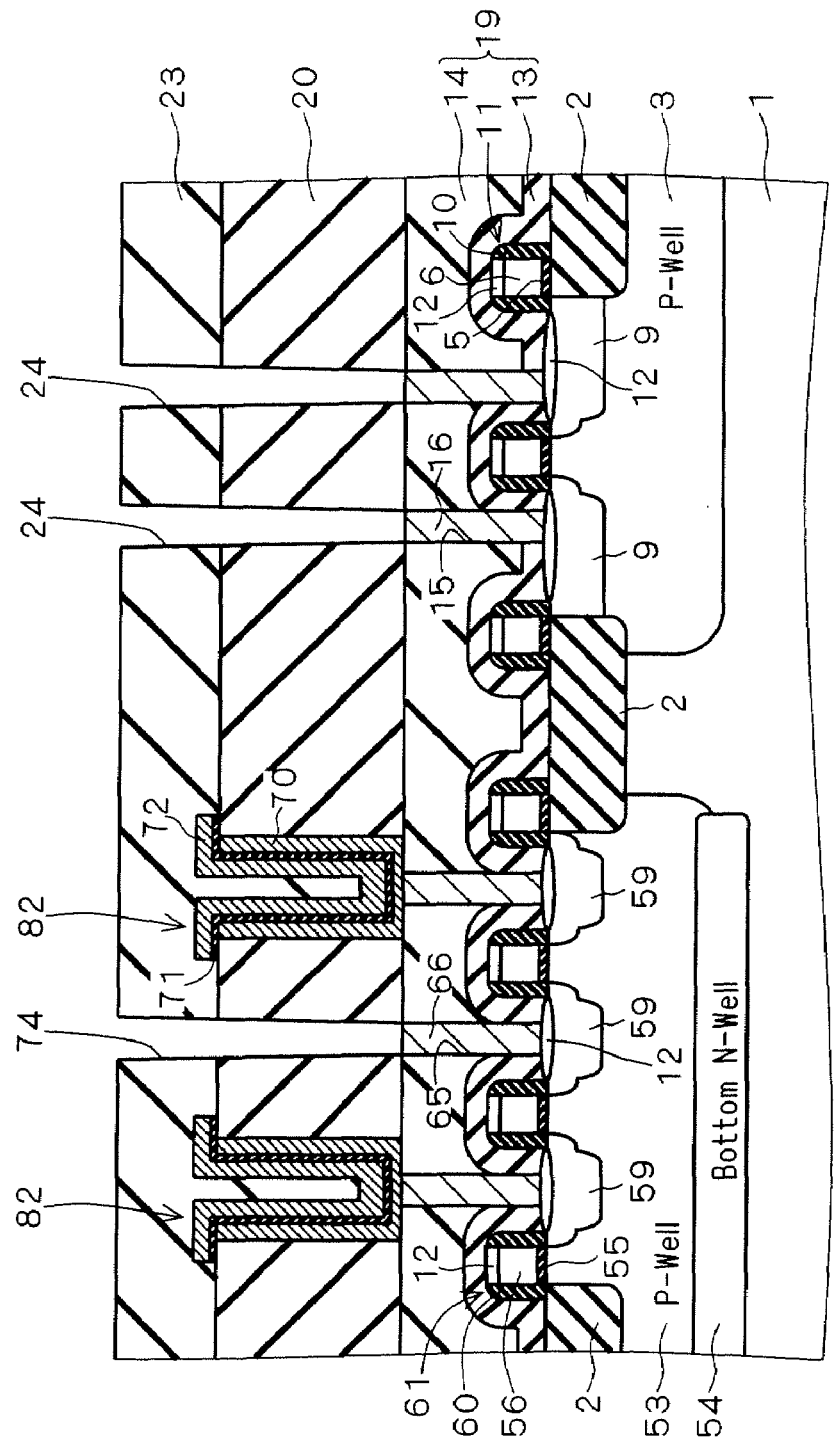
Figure 16:
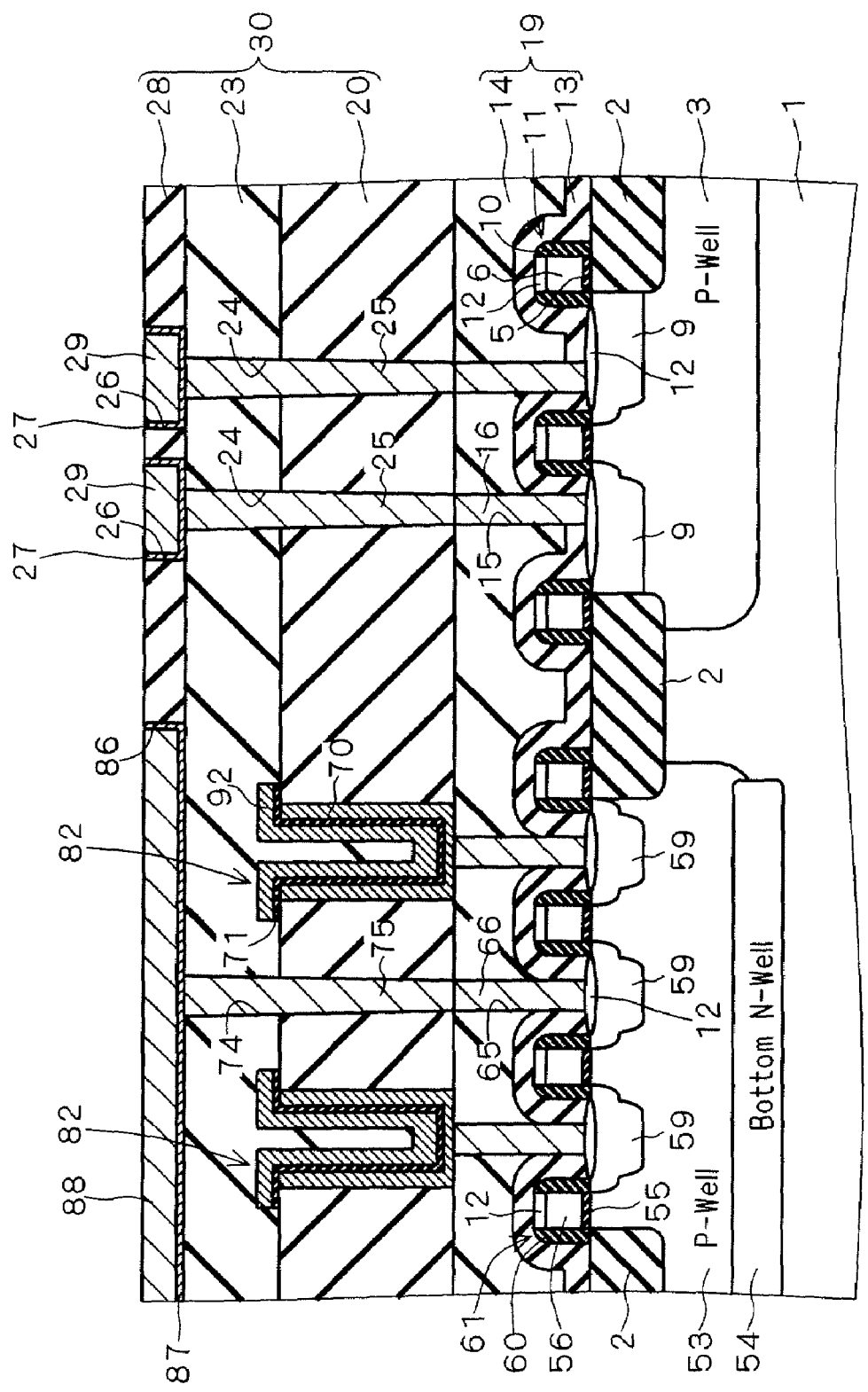

Then, as shown in FIG. 15, the insulating layer 23 is formed over the entire surface and planarized by CMP. That is, the insulating layer 23 is formed on the insulating layer 20 to cover the capacitors 82. Then, the contact holes 24 and 74 are formed in the insulating layers 20 and 23. More specifically, a photoresist (not shown) having a predetermined opening patter is formed on the insulating layer 23 and, using the photoresist as a mask, the insulating layers 20 and 23 are removed by etching. The photoresist is then removed. The etching at this time adopts anisotropic dry etching using a gas mixture of $C_5F_8$, $O_2$ and Ar.

This forms the contact holes 24 which extend from the upper surface of the insulating layer 23 to the contact plugs 16, and the contact holes 74 which extend from the upper surface of the insulating layer 23 to the contact plugs 66.

In the etching technique employed for removal of the insulating layers 20 and 23, the contact plugs 16 and 66 are hard to etch and, in general, etch selectivity between the insulating layers 20, 23 and the contact plugs 16, 66 is high enough. Further, the amounts of overetch of the insulating layers 20 and 23 can be reduced by improving uniformity in the thicknesses of the insulating layers 20, 23 and stabilizing the etch rates of the insulating layers 20, 23. Thus, even if the contact holes 24 and 74 are formed in misaligned positions, it is possible to prevent the contact holes 24 and 74 from extending to the gate electrodes 6 and 56 or to the semiconductor substrate 1. Although not shown, contact holes which extend from the upper surface of the insulating layer 23 to the upper electrodes 72 are also formed in the insulating layer 23.

Then, the contact plugs 25 and 75, the insulating layer 28, the openings 26 and 86, the barrier metal layers 27 and 87, and the copper interconnections 29 and 88 are formed according to the manufacturing method identical to that in the second preferred embodiment. This results in the structure shown in FIG. 16.

Through the above process steps, a memory device is formed in the memory-forming region and a logic device is formed in the logic-forming region.

As above described, in the semiconductor device manufacturing method according to the third preferred embodiment, the stopper film 17 is not formed, that is, the interlayer insulation film 18 is formed directly on the insulating layer 19 and the contact plugs 16 and 66. Thus, the process of etching a stopper film is not performed for formation of the openings 69 or the contact holes 24 and 74. In the third preferred embodiment, replacement of etching equipment by ashing equipment is necessary since the photoresist needs to be removed after etching of the interlayer insulation films; however, replacement of ashing equipment by etching equipment is unnecessary for the formation of the openings 69 or the contact holes 24 and 74. This manufacturing method can therefore reduce the time required to form the openings 69 or the contact holes 24 and 74 as compared with the manufacturing method according to the first preferred embodiment which requires replacement of ashing equipment by etching equipment in the above case. Consequently, the semiconductor device manufacturing time can be made shorter than in the manufacturing method according to the first preferred embodiment.

Further, unlike the semiconductor device manufacturing methods according to the first and second preferred embodiments, the method according to the third preferred embodiment does not require the process of forming the stopper film 17 and therefore can further shorten the manufacturing time.

Fourth Preferred Embodiment

In the aforementioned semiconductor device manufacturing methods according to the first through third preferred embodiments, for example as shown in FIG. 5, only the cobalt silicide films 12 exist between the upper surfaces of the gate electrodes 6 and 56 and the stopper film 13, with no insulating film therebetween. Thus, the contact holes 15 and 65 cannot be self-aligned to the gate electrodes 6 and 56, respectively. More specifically, if the contact holes 15 are formed above the gate electrodes 6 by, for example, misalignment, the cobalt silicide films 12 on the gate electrodes 6 are exposed and thereby the gate electrodes 6 and the contact plugs 16 are short-circuited. Similarly, if the contact holes 65 are formed above the gate electrodes 56, the cobalt silicide films 12 on the gate electrodes 56 are exposed and thereby the gate electrodes 56 and the contact plugs 66 are short-circuited.

In order to avoid short circuits between the contact plugs 16 and the gate electrodes 6 or between the contact plugs 66 and the gate electrodes 56, it is necessary to determine a design value for a distance m (see FIG. 5) between the contact holes 15 and the gate electrodes 6 or between the contact holes 65 and the gate electrodes 56 in consideration of (1) alignment accuracy; (2) variations in the dimensions of the contact holes; and (3) the dimensions of the insulation film large enough to ensure insulation between the gate electrodes and the contact plugs. Thus, if the contact holes 15 and 65 cannot be self-aligned to the gate electrodes 6 and 56, it is difficult in the manufacturing methods according to the first through third preferred embodiments to reduce the dimensions of the memory-forming region and the logic-forming region. This results in difficulty in reducing the dimensions of the semiconductor device.

The fourth preferred embodiment provides a semiconductor device manufacturing method that allows reduction in the dimensions of the memory- and logic-equipped semiconductor device even if the contact holes cannot be self-aligned to the gate electrodes.

First of all, the semiconductor device manufacturing method according to the fourth preferred embodiment of the present invention, which is associated with the first preferred embodiment, will be described with reference to FIGS. 17 through 21.

Figure 43:
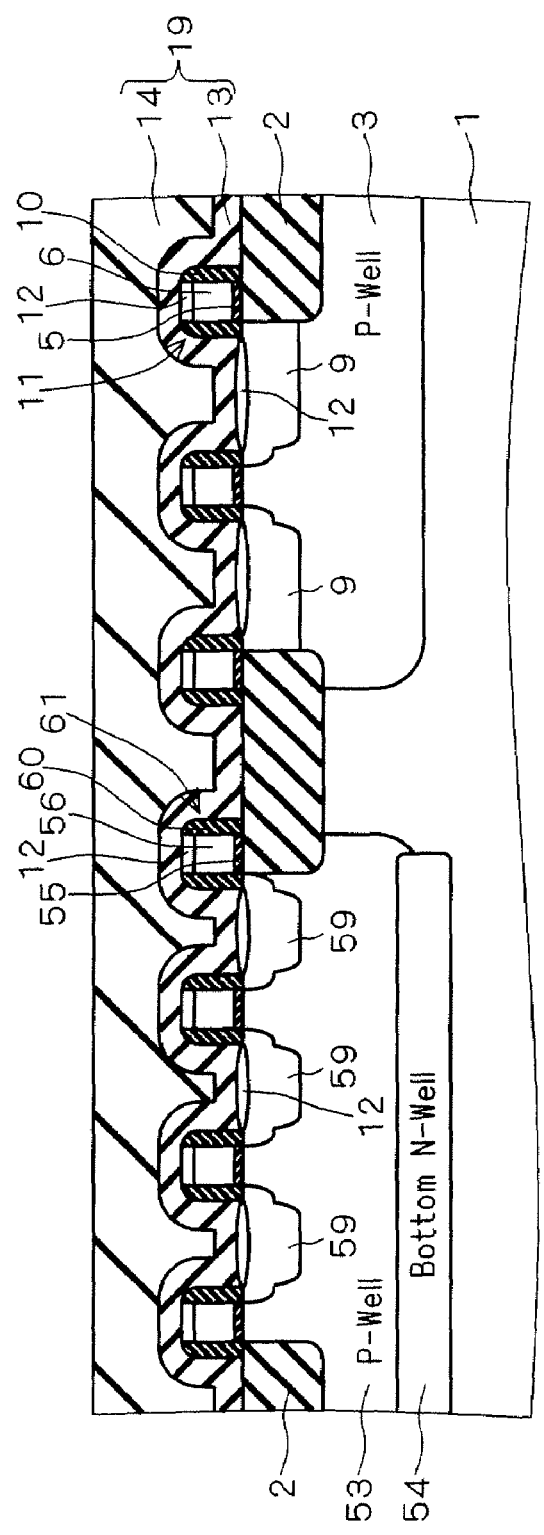

First, the structure shown in FIG. 43 is formed by using the previously-described conventional semiconductor device manufacturing method.

Figure 17:
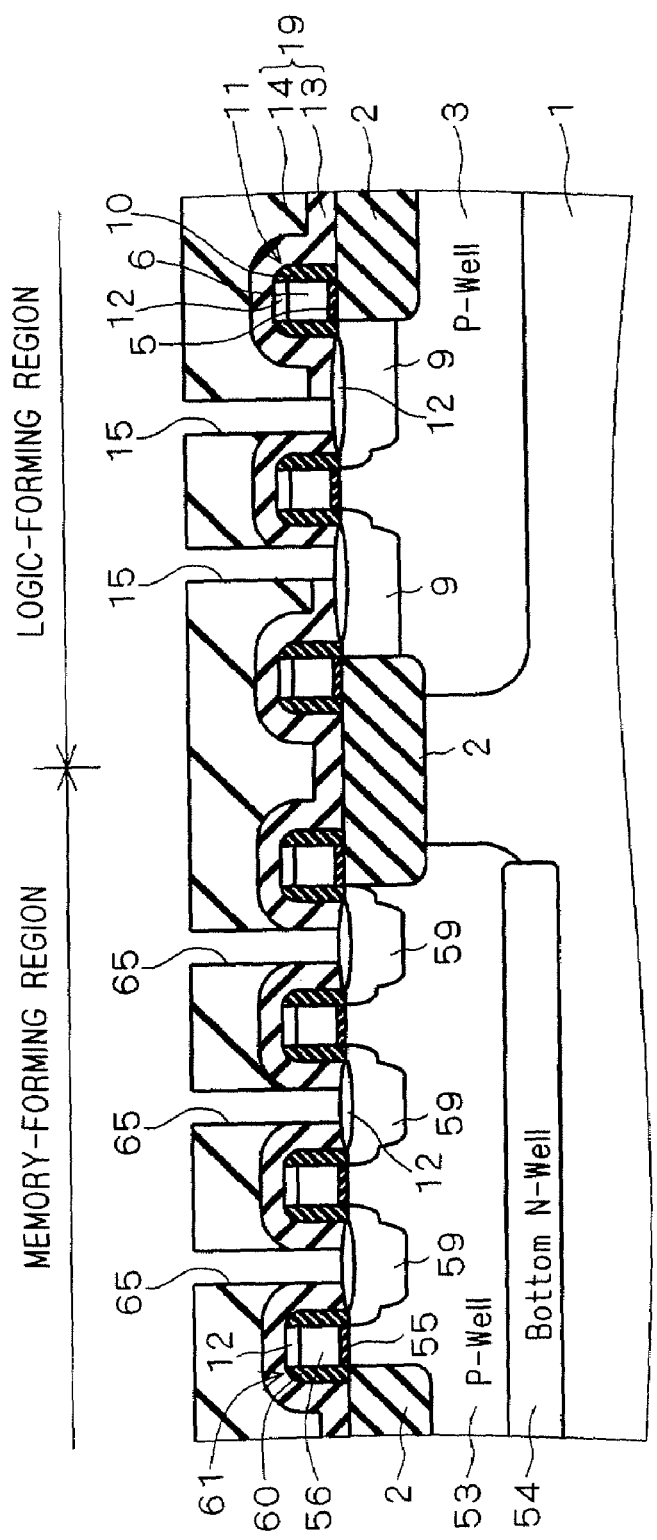
FIGS. 17 through 28 are cross-sectional views showing a sequence of process steps in a semiconductor device manufacturing method according to a fourth preferred embodiment of the present invention.

Then, as shown in FIG. 17, according to the manufacturing method identical to that in the first preferred embodiment, the contact holes 65 which extend to the cobalt silicide films 12 on the semiconductor substrate 1 in the memory-forming region, and the contact holes 15 which extend to the cobalt silicide films 12 on the semiconductor substrate 1 in the logic-forming region are formed in the insulating layer 19. Although not shown, contact holes which extend to the cobalt silicide films 12 on the gate electrodes 6 and 65 are also formed in the insulating layer 19, simultaneously with the contact holes 15 and 65.

Figure 18:
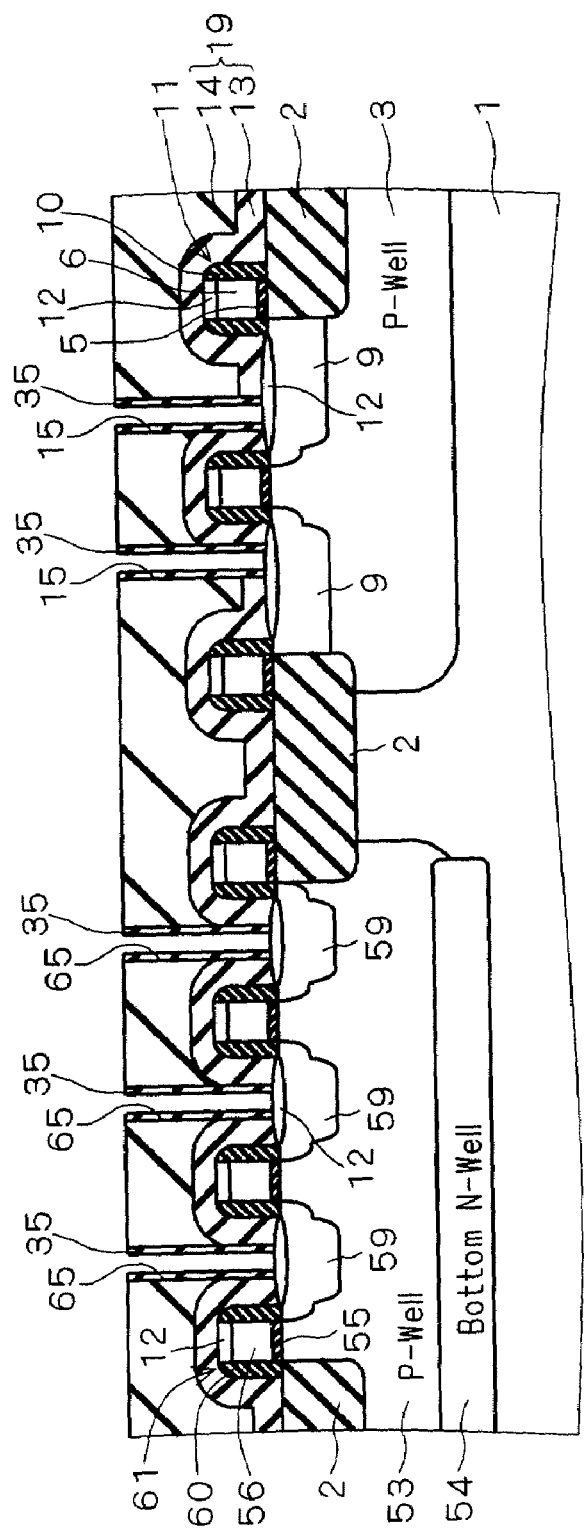

Then, an insulation film of, for example, silicon nitride film is formed over the entire surface and anisotropically etched from the upper surface. This forms, as shown in FIG. 18, insulation films 35 of, for example, silicon nitride film on the side surfaces of the contact holes 15, 65 and the contact holes (not shown) located above the gate electrodes 6 and 56.

Figure 19:
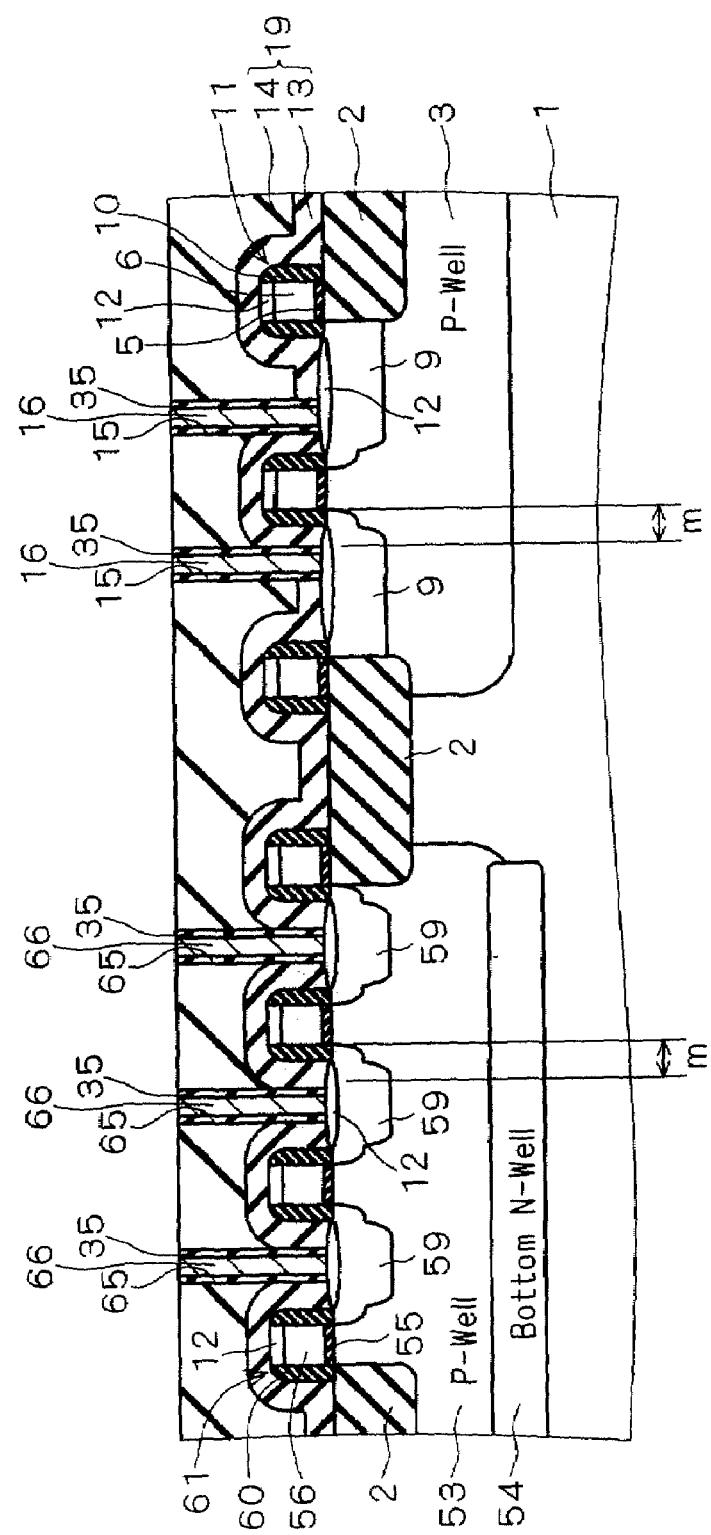

Then, as shown in FIG. 19, the contact plugs 16 are formed to fill in the contact holes 15 and the contact plugs 66 are formed to fill in the contact holes 65. The contact plugs 16 are electrically connected through the cobalt silicide films 12 to the semiconductor substrate 1 in the logic-forming region, and their upper surfaces are exposed from the interlayer insulation film 14 of the insulating layer 19. The contact plugs 66 are electrically connected through the cobalt silicide films 12 to the semiconductor substrate 1 in the memory-forming region, and their upper surfaces are exposed from the interlayer insulation film 14. Hereinbelow, concrete expression is given to a method of forming the contact plugs 16 and 66.

First, a multilayer film formed of a barrier metal layer of, for example, titanium nitride and a high-melting metal layer of, for example, titanium or tungsten is formed over the entire surface, with the barrier metal layer under the high-melting metal layer. Then, the multilayer film on the upper surface of the insulating layer 19 is removed by CMP. This forms the contact plugs 16 which are formed of the barrier metal layer and the high-melting metal layer and which fill in the contact holes 15, and the contact plugs 66 which are formed of the barrier metal layer and the high-melting metal layer and which fill in the contact holes 65. Consequently, electrical connections are provided between the source/drain regions 59 and the contact plugs 66 and between the source/drain regions 9 and the contact plugs 16. In the formation of the contact plugs 16 and 66, contact plugs which fill in the contact holes located above the gate electrodes 6 and 56 are also formed simultaneously. As a result, the contact plugs which are electrically connected through the cobalt silicide films 12 to the gate electrodes 6 and 56 are formed in the insulating layer 19.

Figure 20:
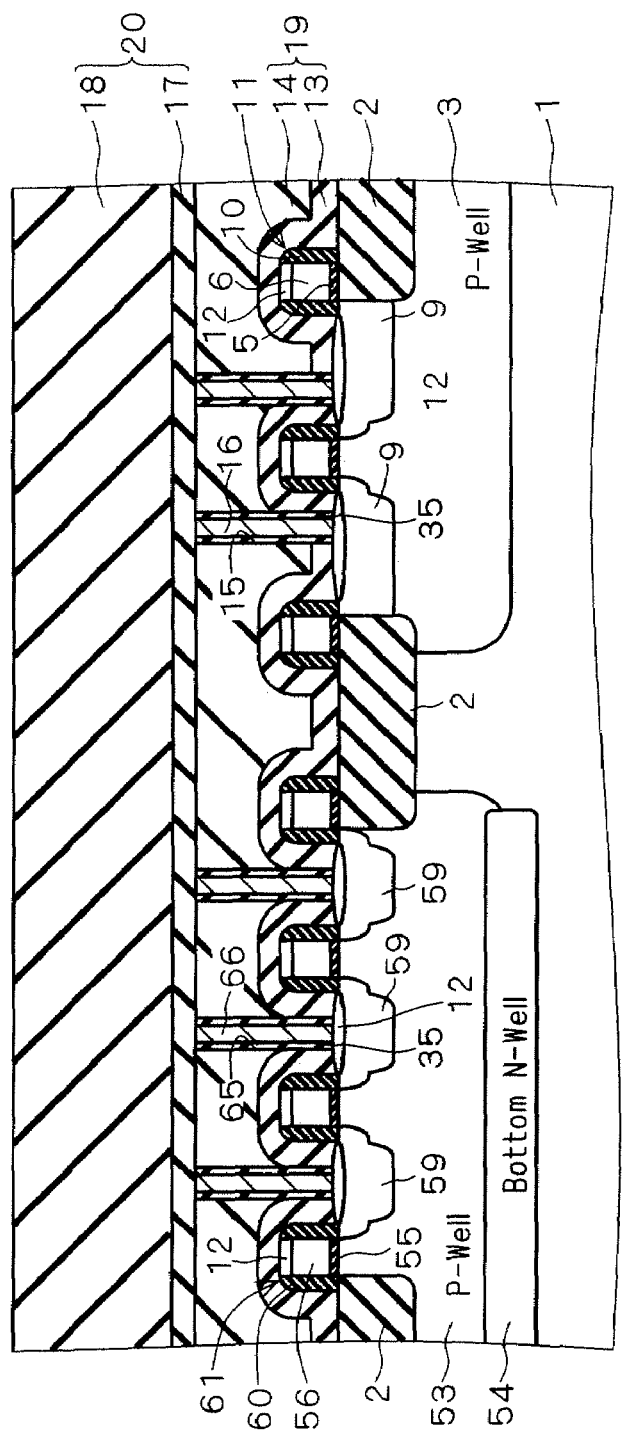
Figure 21:
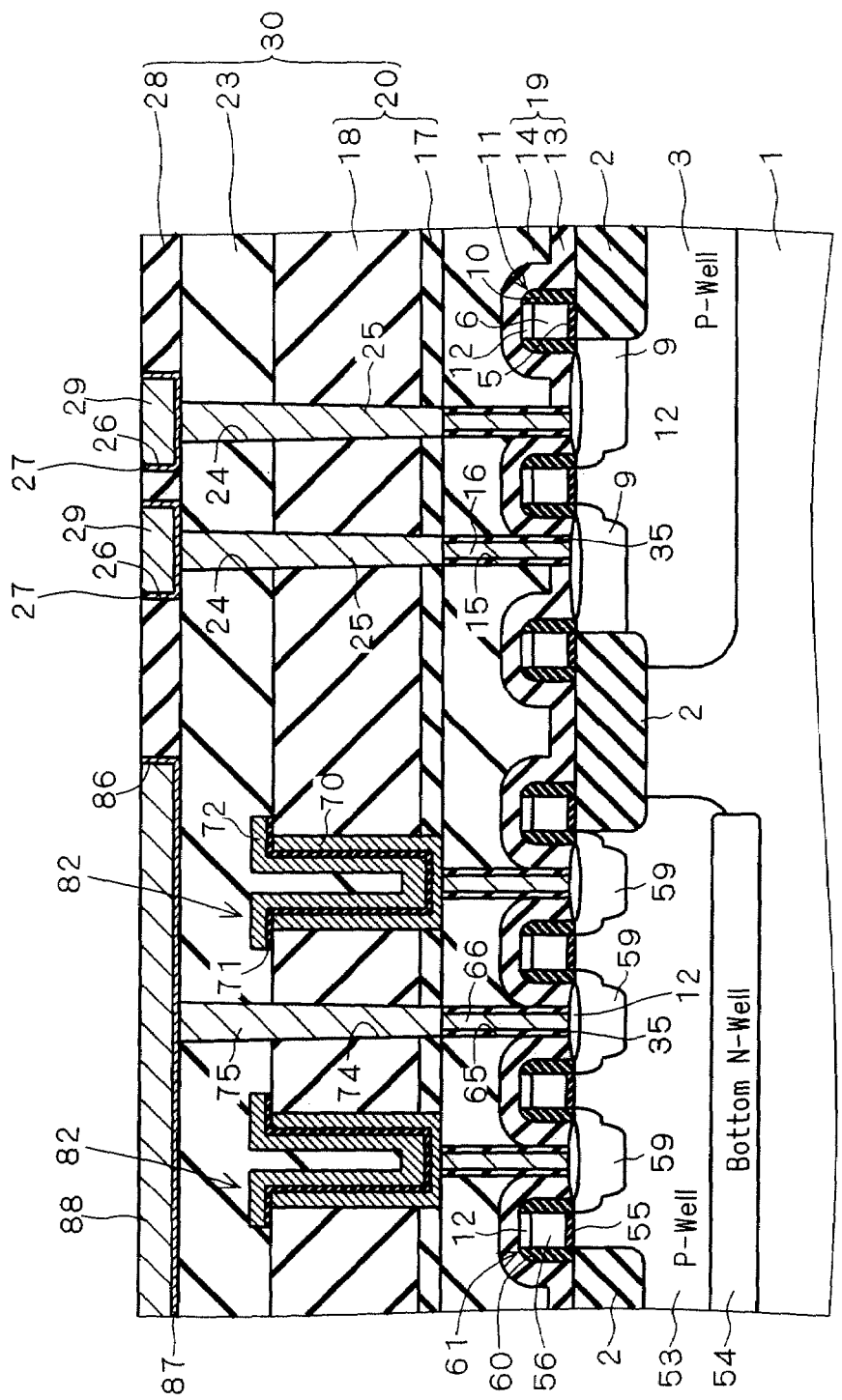

Then, as shown in FIG. 20, the insulating layer 20 consisting of the stopper film 17 and the interlayer insulation film 18 is formed over the entire surface. More specifically, the stopper film 17 is first formed over the entire surface, and the interlayer insulation film 18 is formed on the stopper film 17. Thereby, the insulating layer 20 is formed on the insulating layer 19 and on the contact plugs 16 and 66.

Then, according to the manufacturing method identical to that in the aforementioned first preferred embodiment, the insulating layers 23 and 28, the capacitors 82, the contact holes 24 and 74, the contact plugs 25 and 75, the openings 26 and 86, the barrier metal layers 27 and 87, and the copper interconnections 29 and 88 are formed. This results in the structure shown in FIG. 21.

As above described, in the semiconductor device manufacturing method according to the fourth preferred embodiment associated with the first preferred embodiment, the insulation films 35 are formed on the side surfaces of the contact holes 15 and 65 (see FIG. 18) and thereafter, the contact plugs 16 and 66 are formed to fill in the contact holes 15 and 65, respectively (see FIG. 19).

Thus, the insulation film 35 is provided between the contact holes 15 and the gate electrodes 6 and between the contact holes 65 and the gate electrodes 56. From this, if the thickness of the insulation films 35 is set to a dimension large enough to ensure insulation between the gate electrodes 6 and the contact plugs 16, the design value for the distance m (see FIG. 19) between the contact holes 15 and the gate electrodes 6 can be determined in consideration of only the aforementioned (1) alignment accuracy and (2) variations in the dimensions of the contact holes, without necessitating consideration of (3) the dimensions of the insulation film large enough to ensure insulation between the gate electrodes and the contact plugs. In other words, it is not necessary to consider insulation between the gate electrodes 6 and the contact plugs 16 when determining the design value for the distance m between the contact holes 15 and the gate electrodes 6.

Similarly, if the thickness of the insulation films 35 is set to a dimension large enough to ensure insulation between the gate electrodes 56 and the contact plugs 66, the design value for the distance m between the gate electrodes 56 and the contact holes 65 can be determined without consideration of the aforementioned (3) dimensions of the insulation film large enough to ensure insulation between the gate electrodes and the contact plugs.

Accordingly, even if the contact holes cannot be self-aligned to the gate electrodes, the design value for the distance m between the contact holes and the gate electrodes can be made smaller than in the semiconductor device manufacturing method according to the first preferred embodiment. Thus, the memory-forming region and the logic-forming region can be reduced in dimension. This results in a reduction in the dimensions of the semiconductor device as compared with those in the first preferred embodiment.

Next, the semiconductor device manufacturing method according to the fourth preferred embodiment of the present invention, which is associated with the second preferred embodiment, will be described with reference to FIGS. 22 through 26.

First, the structure shown in FIG. 42 is formed by using the previously-described conventional semiconductor device manufacturing method.

Figure 22:
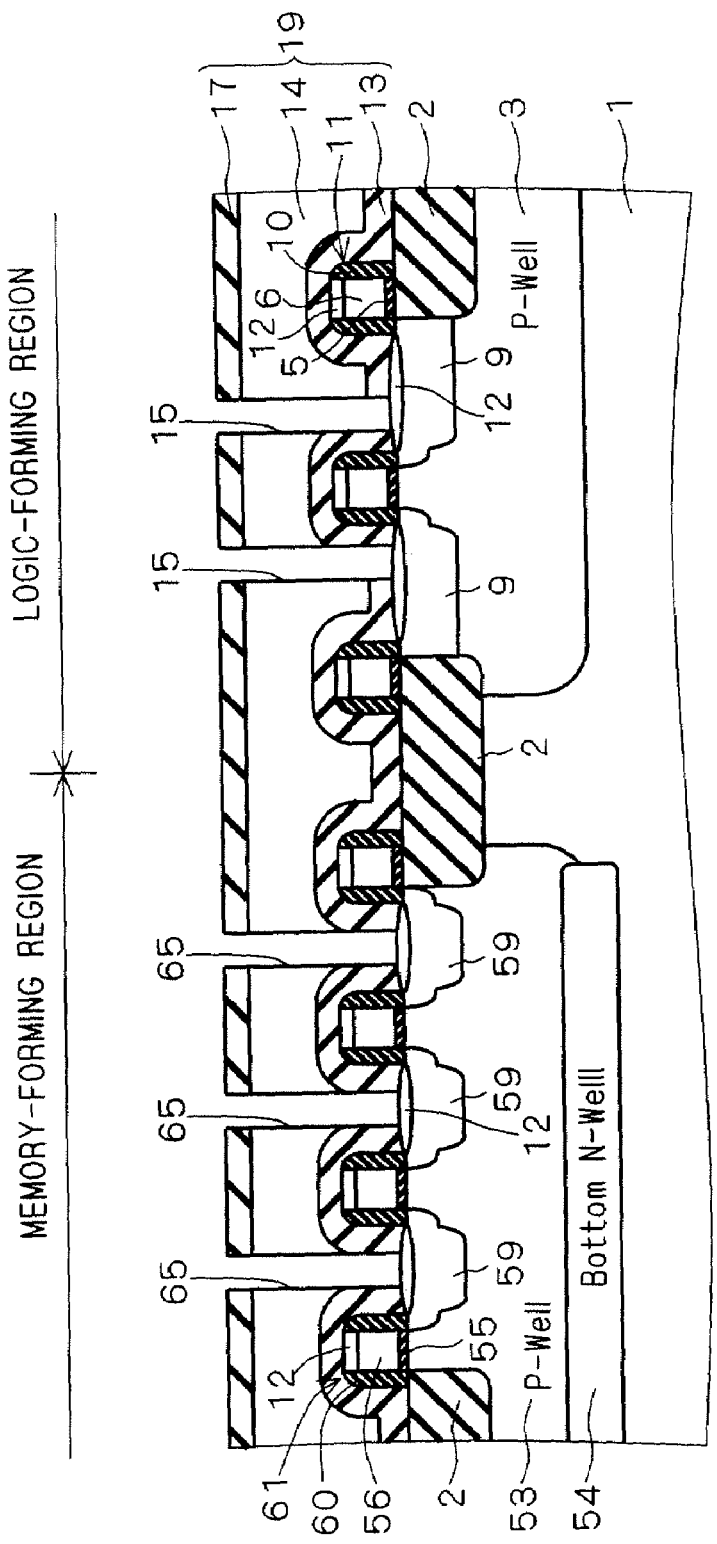

Then, as shown in FIG. 22, the insulating layer 19 and the contact holes 15, 65 are formed according to the manufacturing method identical to that in the aforementioned second preferred embodiment. Although not shown, contact holes which extend to the cobalt silicide films 12 on the gate electrodes 6 and 56 are also formed in the insulating layer 19, simultaneously with the contact holes 15 and 16.

Figure 23:
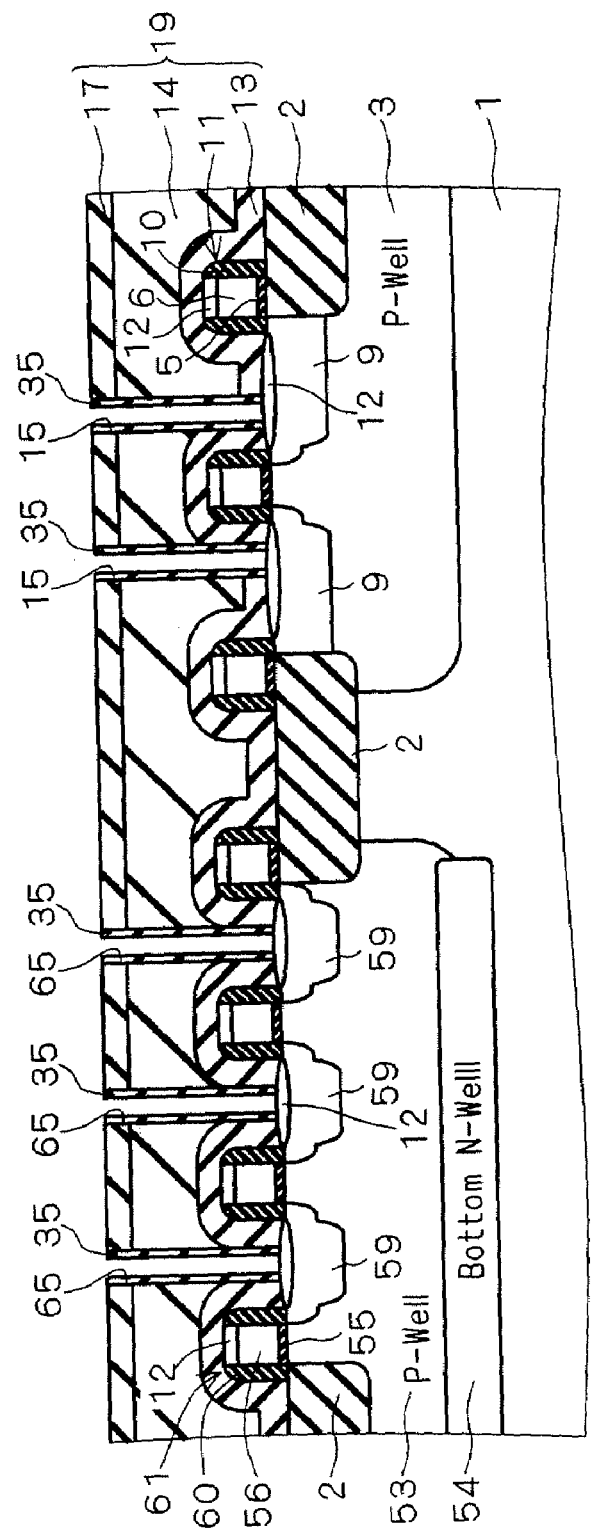

Then, an insulation film of, for example, silicon nitride film is formed over the entire surface and anisotropically etched from the upper surface. Thereby, as shown in FIG. 23, the insulation films 35 are formed on the side surfaces of the contact holes 15 and 16 and the contact holes (not shown) located above the gate electrodes 6 and 56.

Figure 24:
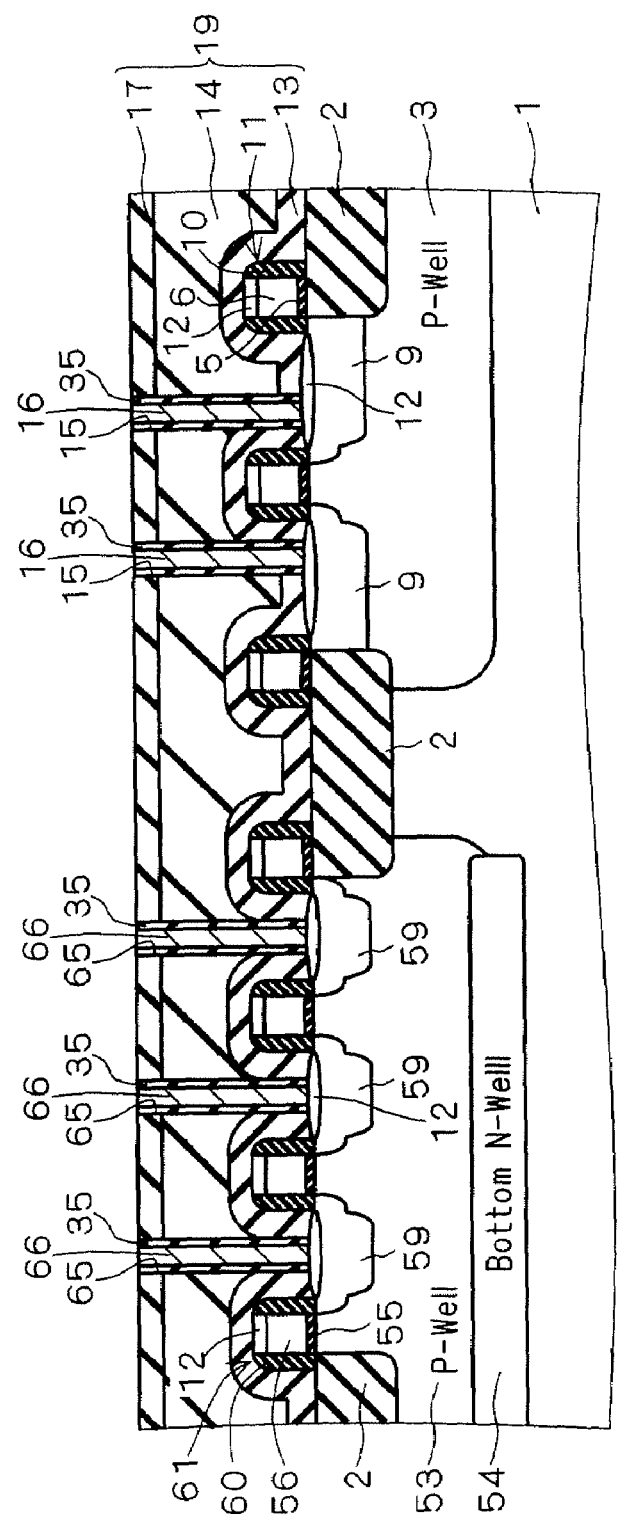

Then, as shown in FIG. 24, the contact plugs 16 are formed to fill in the contact holes 15 and the contact plugs 66 are formed to fill in the contact holes 65. The contact plugs 16 are electrically connected through the cobalt silicide films 12 to the semiconductor substrate 1 in the logic-forming region, and their upper surfaces are exposed from the stopper film 17.

The contact plugs 66 are electrically connected through the cobalt silicide films 12 to the semiconductor substrate 1 in the memory-forming region, and their upper surfaces are exposed from the stopper film 17. Hereinbelow, concrete expression is given to a method of forming the contact plugs 16 and 66.

First, a multilayer film formed of a barrier metal layer of, for example, titanium nitride and a high-melting metal layer of, for example, titanium or tungsten is formed over the entire surface, with the barrier metal layer under the high-melting metal layer. Then, the multilayer film on the upper surface of the stopper film 17 is removed by CMP. This forms the contact plugs 16 which fill in the contact holes 15, and the contact plugs 66 which fill in the contact holes 65. Consequently, electrical connections are provided between the source/drain regions 59 and the contact plugs 66 and between the source/drain regions 9 and the contact plugs 16. In the formation of the contact plugs 16 and 66, contact plugs which fill in the contact holes above the gate electrodes 6 and 56 are also formed simultaneously. As a result, the contact plugs which are electrically connected through the cobalt silicide films 12 to the gate electrodes 6 and 56 are formed in the insulating layer 19.

Figure 25:
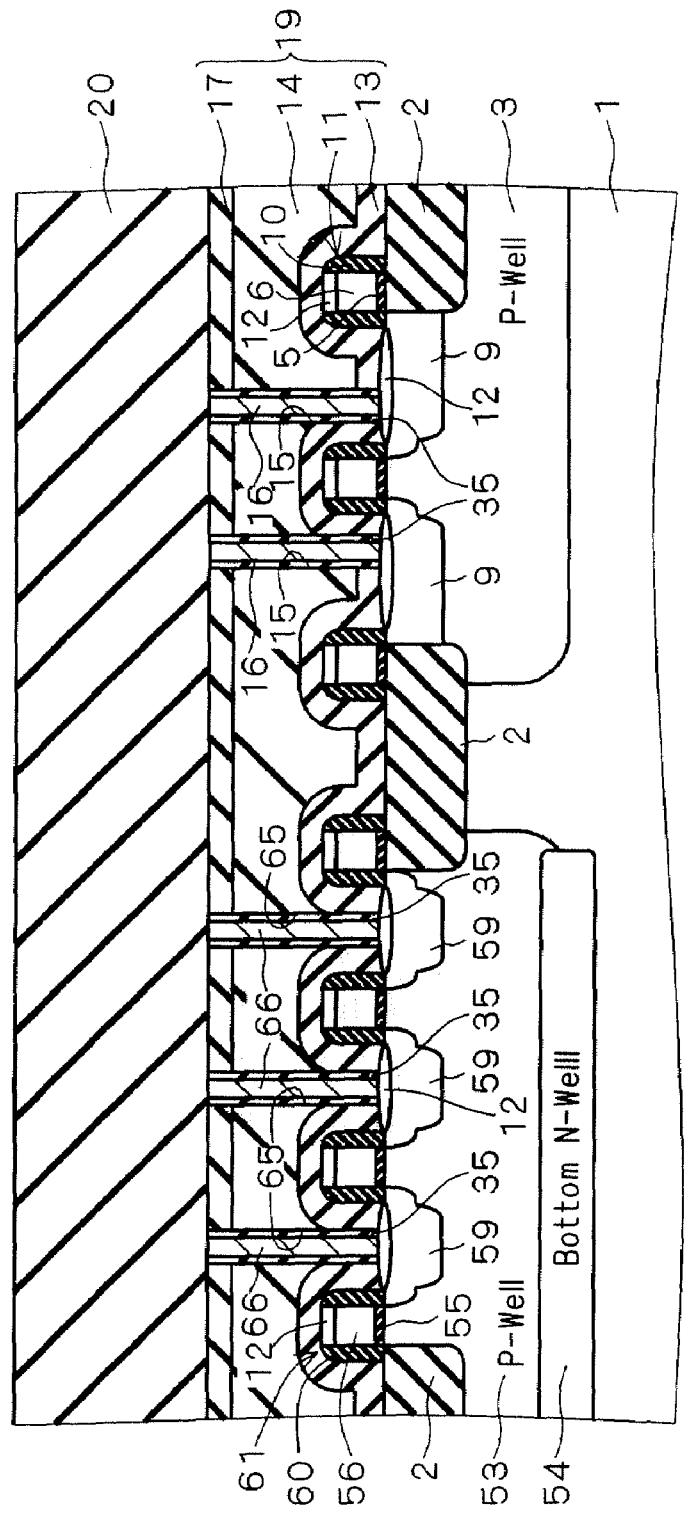
Figure 26:
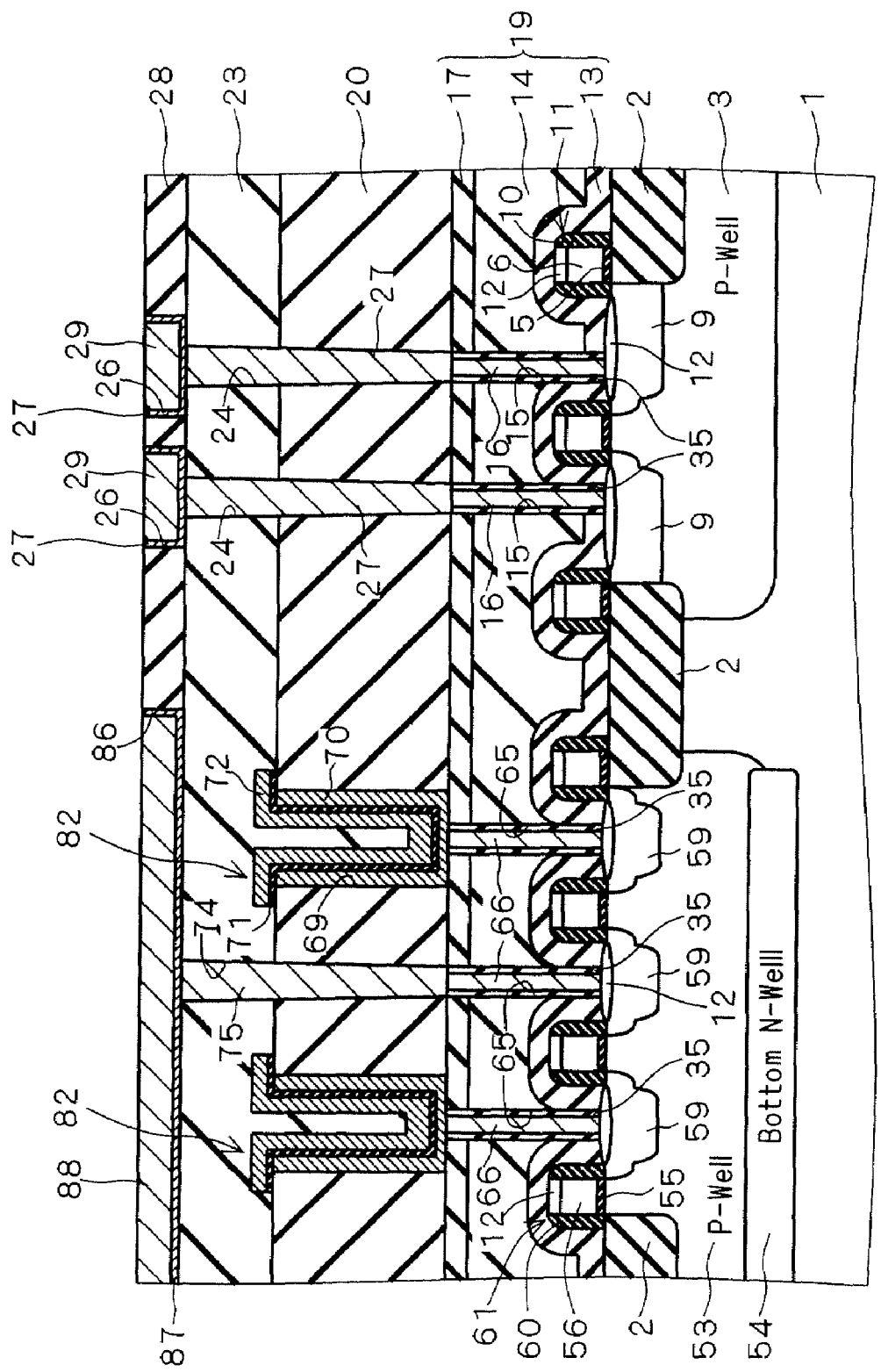

Then, as shown in FIG. 25, the insulating layer 20 consisting of the interlayer insulation film 18 is formed over the entire surface. That is, the insulating layer 20 is formed on the stopper film 17 of the insulating layer 19 and the contact plugs 16 and 66.

Then, according to the manufacturing method identical to that in the second preferred embodiment, the openings 26, 69 and 86, the capacitors 82, the insulating layers 23 and 28, the contact holes 24 and 74, the contact plugs 25 and 75, the barrier metal layers 27 and 87, and the copper interconnections 29 and 88 are formed. This results in the structure shown in FIG. 26.

As above described, in the semiconductor device manufacturing method according to the fourth preferred embodiment associated with the second preferred embodiment, the insulation films 35 are formed on the side surfaces of the contact holes 15 and 65 (see FIG. 23) and thereafter, the contact plugs 16 and 66 are formed to fill in the contact holes 15 and 65, respectively (see FIG. 24). Therefore, for the same reason as above described, the semiconductor device can be made smaller in dimension than in the manufacturing method according to the second preferred embodiment.

Figure 27:
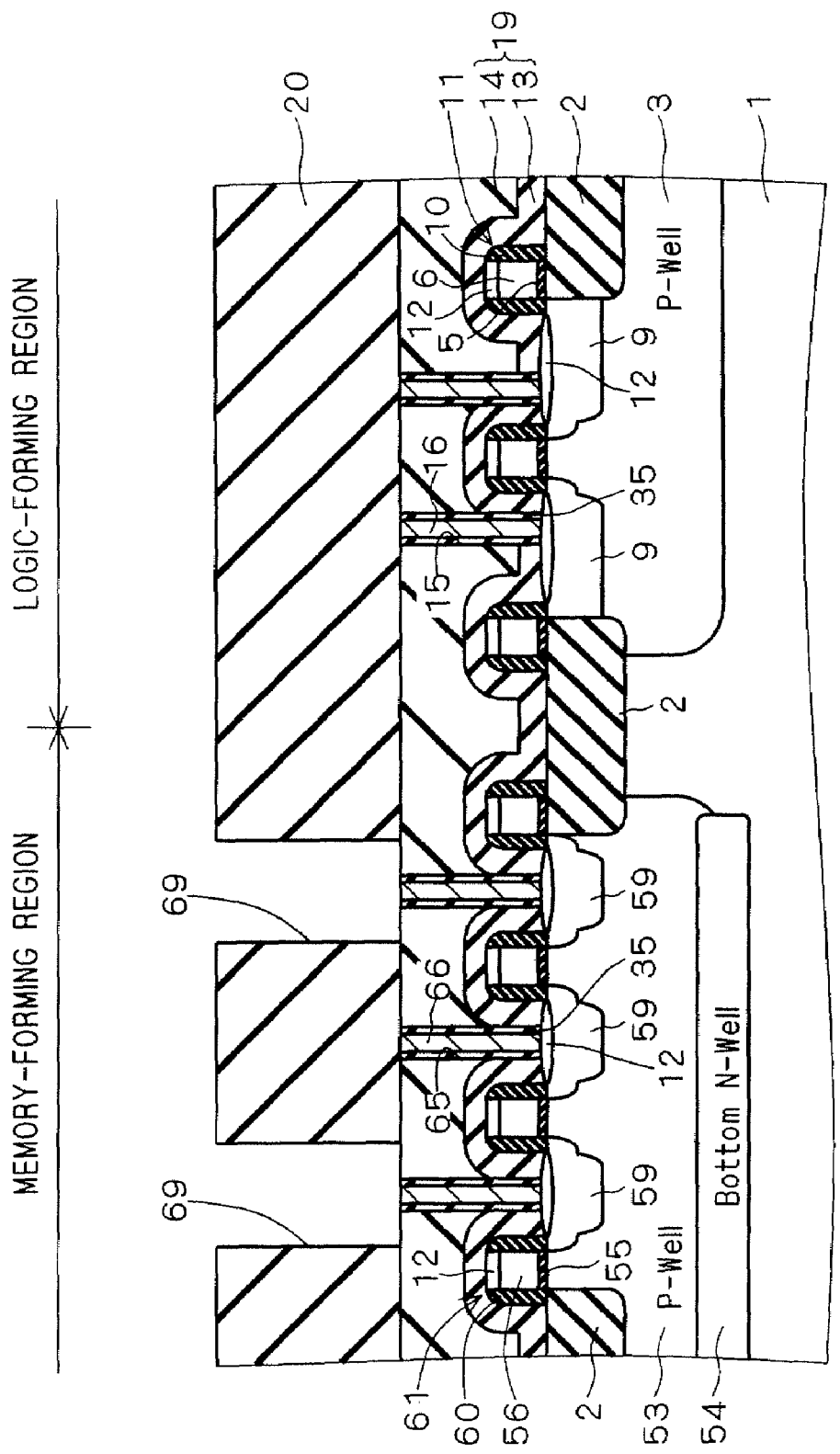
Figure 28:
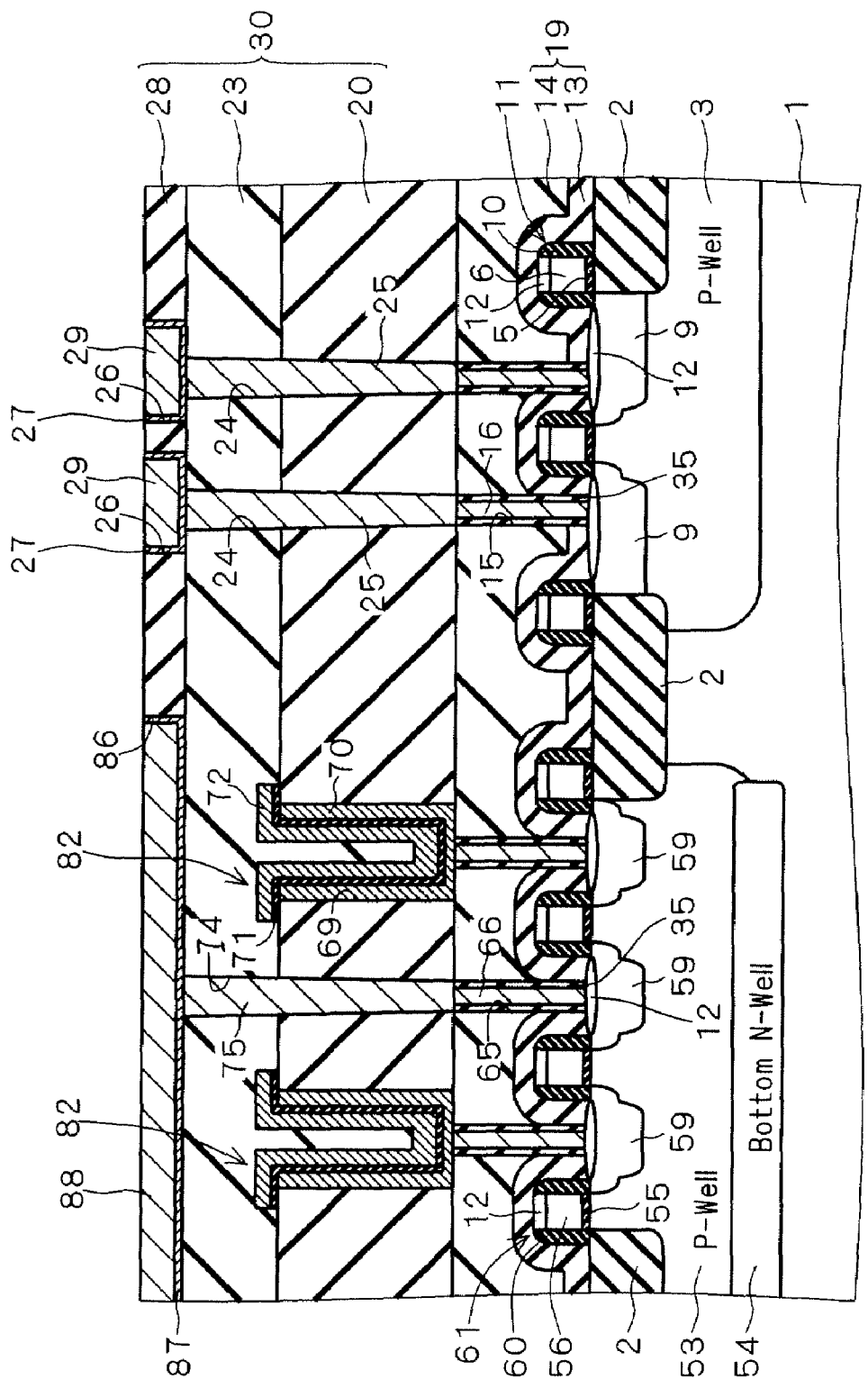

Next, the semiconductor device manufacturing method according to the fourth preferred embodiment of the present invention, which is associated with the third preferred embodiment, will be described with reference to FIGS. 27 and 28.

First, the structure shown in FIG. 19 is formed according to the aforementioned manufacturing method. Then, as shown in FIG. 27, the insulating layer 20 consisting of the interlayer insulation film 18 is formed over the entire surface. That is, the insulating layer 20 is formed on the insulating layer 19 and the contact plugs 16 and 66.

Then, a photoresist (not shown) having a predetermined opening pattern is formed on the insulating layer 20, and using the photoresist as a mask, the insulating layer 20 is removed by etching. The photoresist is then removed. The etching at this time adopts anisotropic dry etching using a gas mixture of $C_5F_8$, $O_2$ and Ar. Thereby, the openings 69 are formed in the insulating layer 20 to expose the contact plugs 16 which are each electrically connected to one of the adjacent source/drain regions 59.

Then, according to the manufacturing method identical to that in the aforementioned third preferred embodiment, the capacitors 82, the insulating layers 23 and 28, the contact holes 24 and 74, the contact plugs 25 and 75, the openings 26 and 86, the barrier metal layers 27 and 87, and the copper interconnections 29 and 88 are formed. This results in the structure shown in FIG. 28.

As above described, in the semiconductor device manufacturing method according to the fourth preferred embodiment associated with the third preferred embodiment, the insulation films 35 are formed on the side surfaces of the contact holes 15, 65 and thereafter, the contact plugs 16 and 66 are formed to fill in the contact holes 15 and 65, respectively. Thus, for the same reason as above described, the semiconductor device can be made smaller in dimension than in the manufacturing method according to the third preferred embodiment.

Fifth Preferred Embodiment

Figure 29:
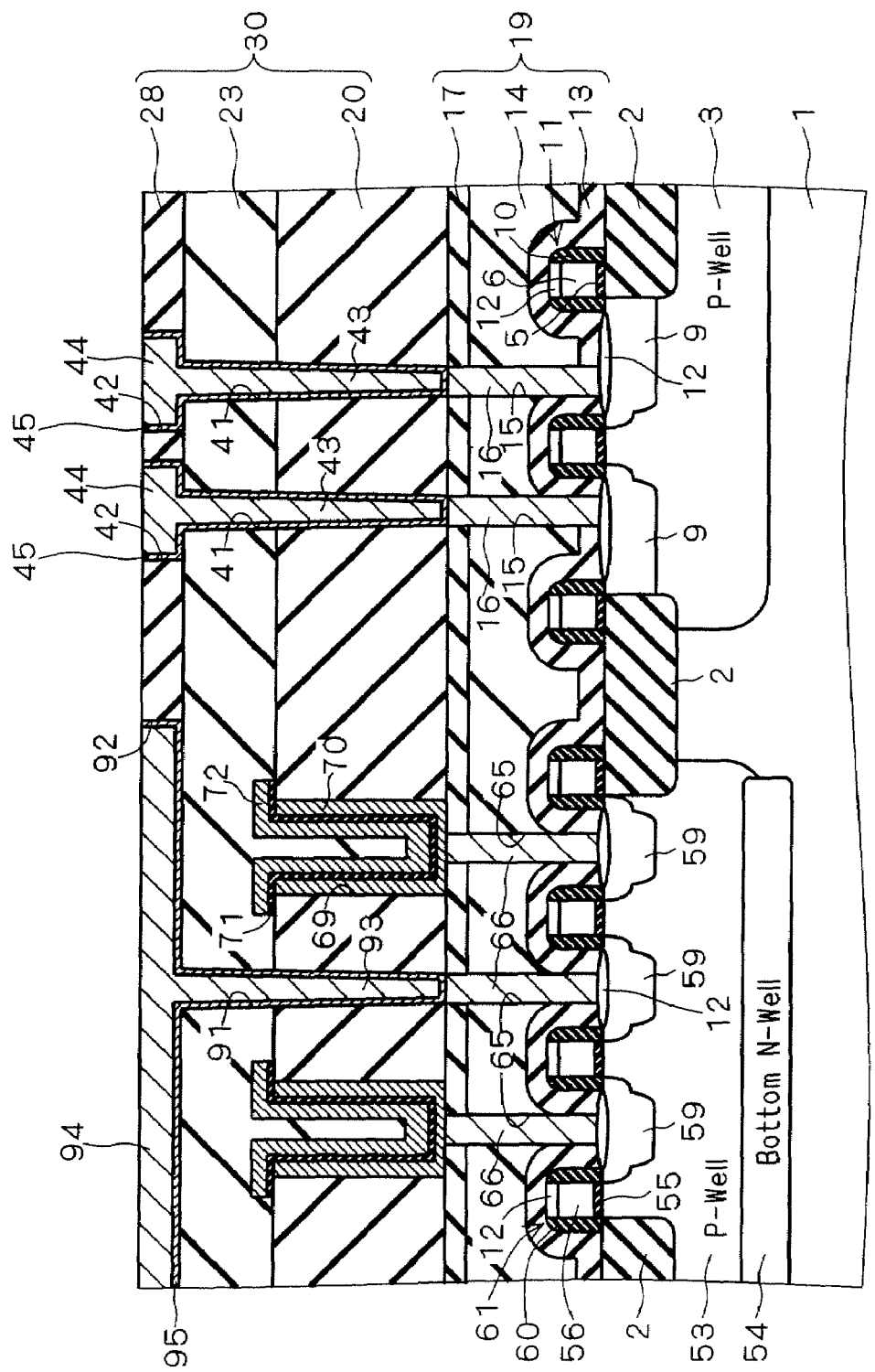
FIGS. 29 through 38 are cross-sectional views showing a sequence of process steps in a semiconductor device manufacturing method according to a fifth preferred embodiment of the present invention.

FIG. 29 is a cross-sectional view showing the structure of a semiconductor device according to a fifth preferred embodiment of the present invention. The semiconductor device according to the fifth preferred embodiment is basically similar to that according to the aforementioned first preferred embodiment, except that contact plugs and copper interconnections in the insulating layer 30 are formed integrally with each other. Contact plugs 43, 93 and copper interconnections 44, 94 shown in FIG. 29 correspond respectively to the contact plugs 25, 75 and the copper interconnections 29, 88 in the first preferred embodiment.

As shown in FIG. 29, the semiconductor device according to the fifth preferred embodiment comprises the semiconductor substrate 1, the insulating layers 19 and 30, and the plurality of contact plugs 16 and 66. The semiconductor device further comprises the capacitors 82, the plurality of contact plugs 43 and 93, and the copper interconnections 44 and 94, all of which are formed in the insulating layer 30.

The contact plugs 43 are electrically connected through barrier metal layers 45 to the contact plugs 16, and the contact plugs 93 are electrically connected through barrier metal layers 95 to the contact plugs 66 which are not in electrical contact with the capacitors 82. The contact plugs 43 and 93 are formed of copper. The contact plugs 43 and the copper interconnections 44 are formed integrally with each other, and the contact plugs 93 and the copper interconnections 94 are formed integrally with each other. The copper interconnections 94 are bit lines of the DRAM memory cells and located above the capacitors 82.

Thus, in the semiconductor device according to the fifth preferred embodiment, the contact plugs 43 and the copper interconnections 44, or the contact plugs 93 and the copper interconnections 94 are formed integrally with each other.

In the semiconductor device according to the aforementioned first preferred embodiment, as shown in FIG. 1, since the contact plugs 25 and the copper interconnections 29, or the contact plugs 75 and the copper interconnections 88 are formed separately, contact resistance is produced between the contact plugs 25 and the copper interconnections 29 or between the contact plugs 75 and the copper interconnections 88. Thus, it is not easy for the structure shown in FIG. 1 to handle a requirement of further reduction in electrical resistance between the copper interconnections 29, 88 and the source/drain regions 9, 59.

In the semiconductor device according to the fifth preferred embodiment, on the other hand, since the contact plugs 43 and the copper interconnections 44, or the contact plugs 93 and the copper interconnections 94 are formed integrally with each other, there is no boundary between the contact plugs 43 and the copper interconnections 44 and between the contact plugs 93 and the copper interconnections 94. Accordingly, no contact resistance is produced between the contact plugs 43 and the copper interconnections 44 and between the contact plugs 93 and the copper interconnections 94. Thus, the contact resistance can be reduced and it becomes possible to fully handle the requirement of further reduction in electrical resistance between the copper interconnections 44, 94 and the source/drain regions 9, 59.

Now, a method of manufacturing the semiconductor device shown in FIG. 29 will be described. FIGS. 29 through 33 are cross-sectional views showing a sequence of process steps in the semiconductor device manufacturing method according to the fifth preferred embodiment. The semiconductor device manufacturing method according to the fifth preferred embodiment is similar to that in the aforementioned first preferred embodiment, except that the contact holes 24 and 74, the contact plugs 25 and 75, the openings 26 and 86, the barrier metal layers 27 and 87 and the copper interconnections 29 and 88 are replaced with contact holes 41 and 91, the contact plugs 43 and 93, openings 42 and 92, the barrier metal layers 45 and 95 and the copper interconnections 44 and 94. Hereinbelow, the method of manufacturing the semiconductor device shown in FIG. 29 is described with reference to FIGS. 29 through 33.

Figure 48:
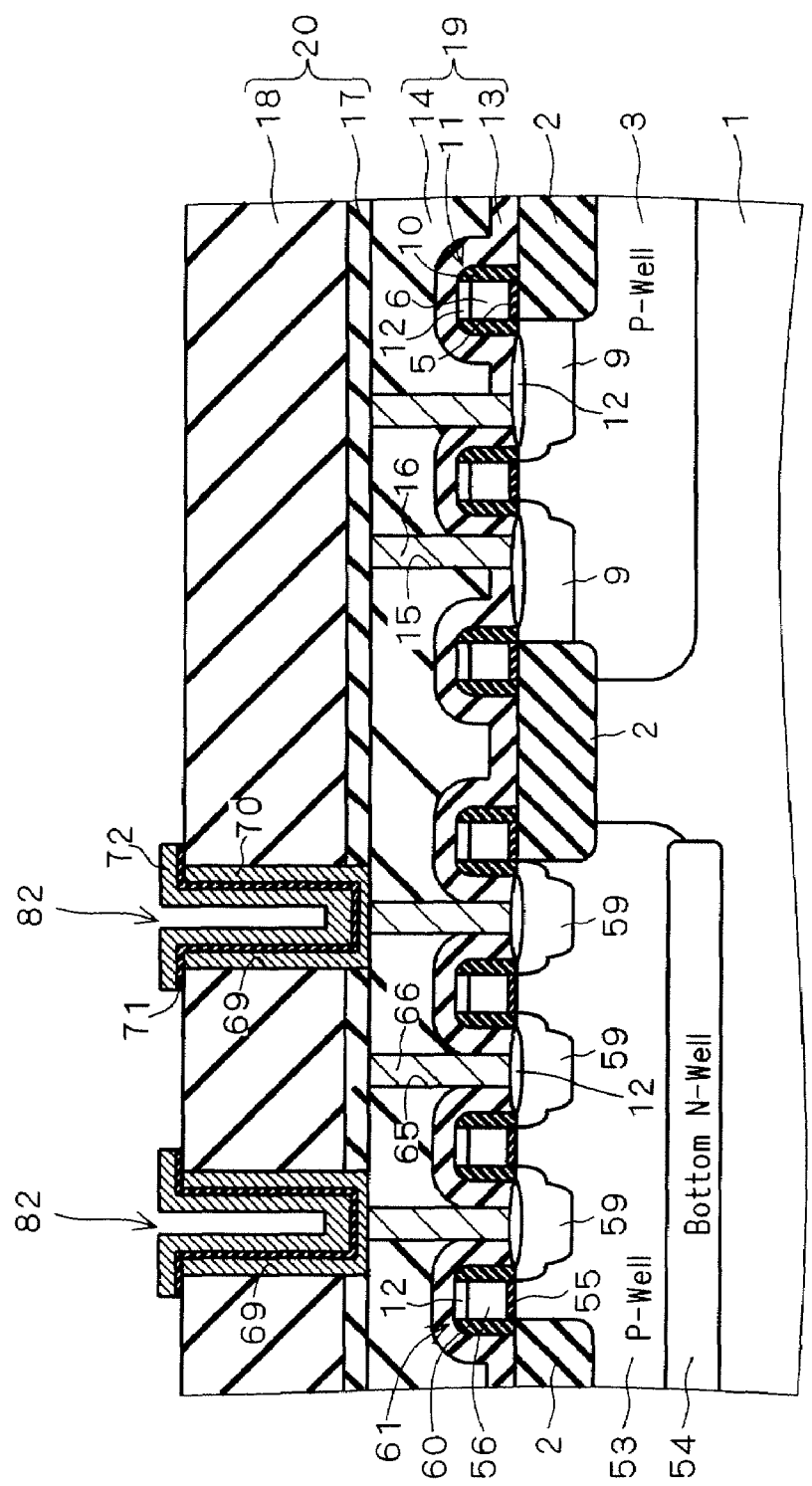

First, the structure shown in FIG. 48 is formed by using the previously-described conventional semiconductor device manufacturing method.

Figure 30:
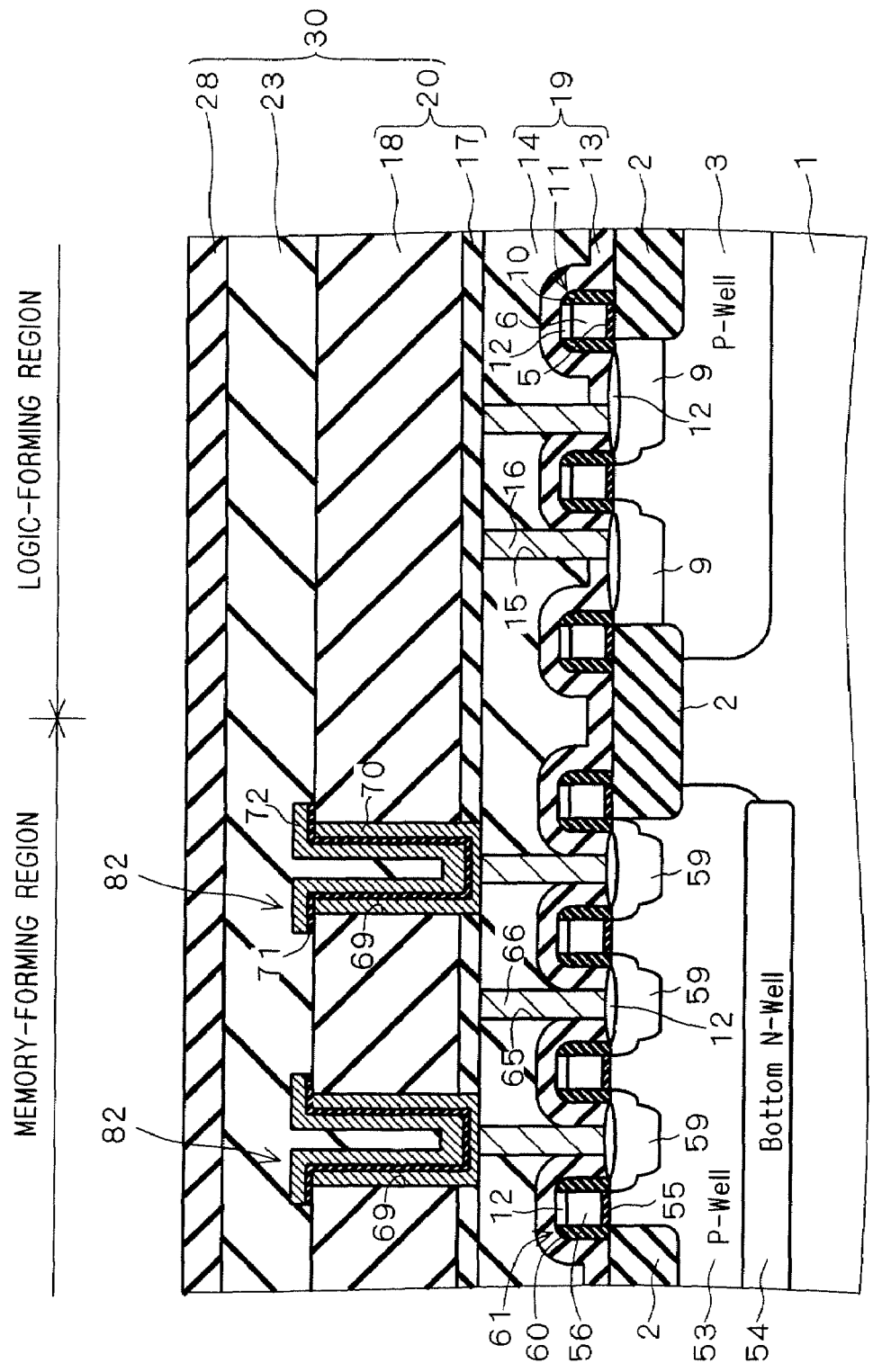

Then, as shown in FIG. 30, the insulating layers 23 and 28 are formed in this order over the entire surface and planarized by, for example, CMP. Alternatively, the insulating layers 23 and 28 may be a single insulating layer and such a single insulating layer may be deposited at a time over the entire surface.

Figure 31:
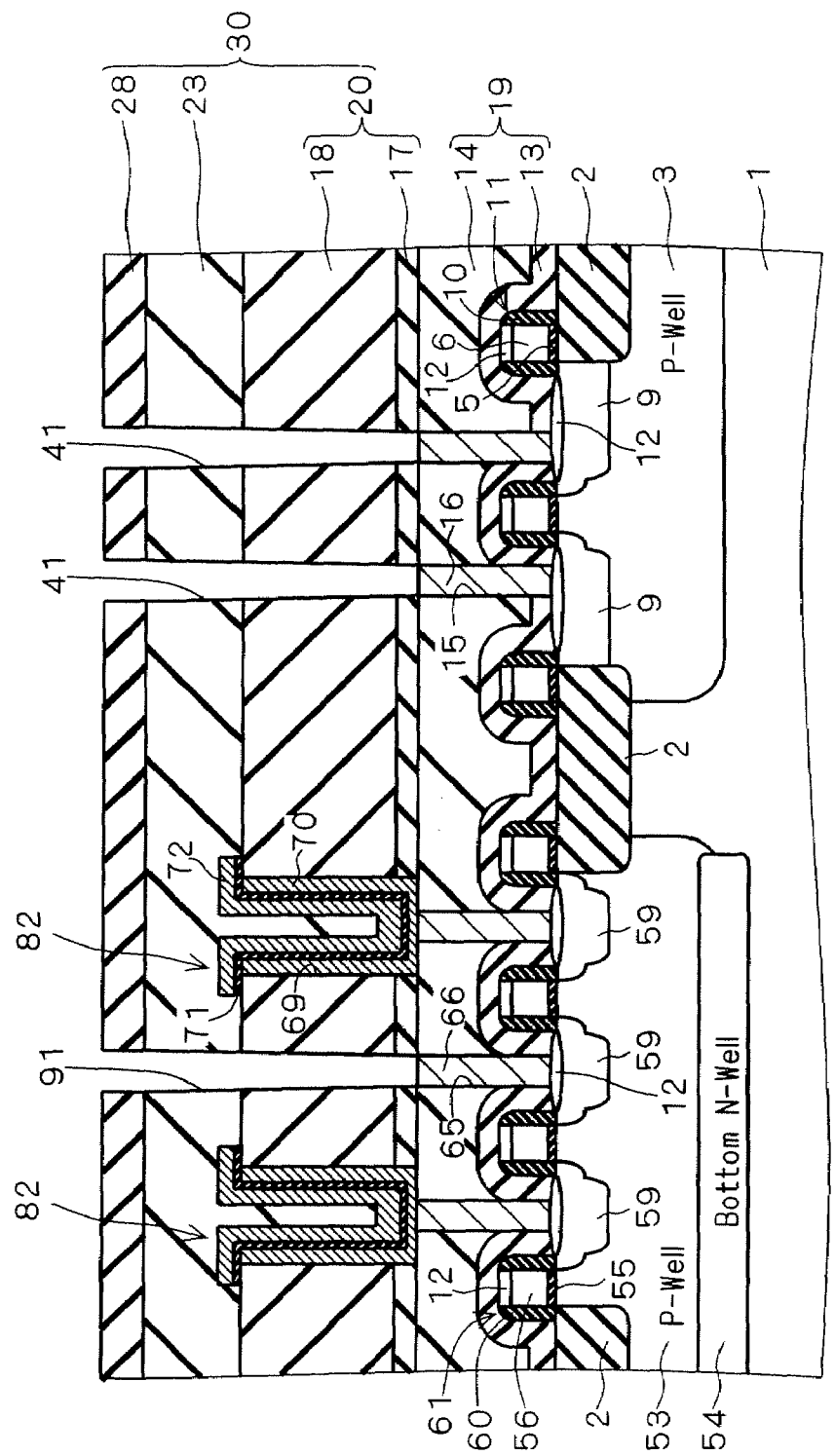

Then, as shown in FIG. 31, the contact holes 41 and 91 are formed in the insulating layer 30. The contact holes 41 extend from the upper surface of the insulating layer 28 to the contact plugs 16, and the contact holes 91 extend from the upper surface of the insulating layer 28 to the contact plugs 66 which are not in contact with the capacitors 82.

To form the contact holes 41 and 91, a photoresist (not shown) having a predetermined opening pattern is first formed on the insulating layer 28 and, using the photoresist as a mask and the stopper film 17 as an etch stop, the insulating layers 23 and 28 and the interlayer insulation film 18 are removed by etching. The etching at this time adopts anisotropic dry etching using a gas mixture of $C_5F_8$, $O_2$ and Ar. The photoresist is then removed and the exposed stopper film 17 is also removed by etching. The etching at this time adopts anisotropic dry etching using a gas mixture of $CHF_3$, $O_2$ and Ar. This forms the contact holes 41 and 91 in the insulating layer 30. Although not shown, contact holes which extend from the upper surfaces of the insulating layers 23 and 28 to the upper electrodes 72 are also formed in the insulating layers 23 and 28, simultaneously with the contact holes 41 and 91.

Figure 32:
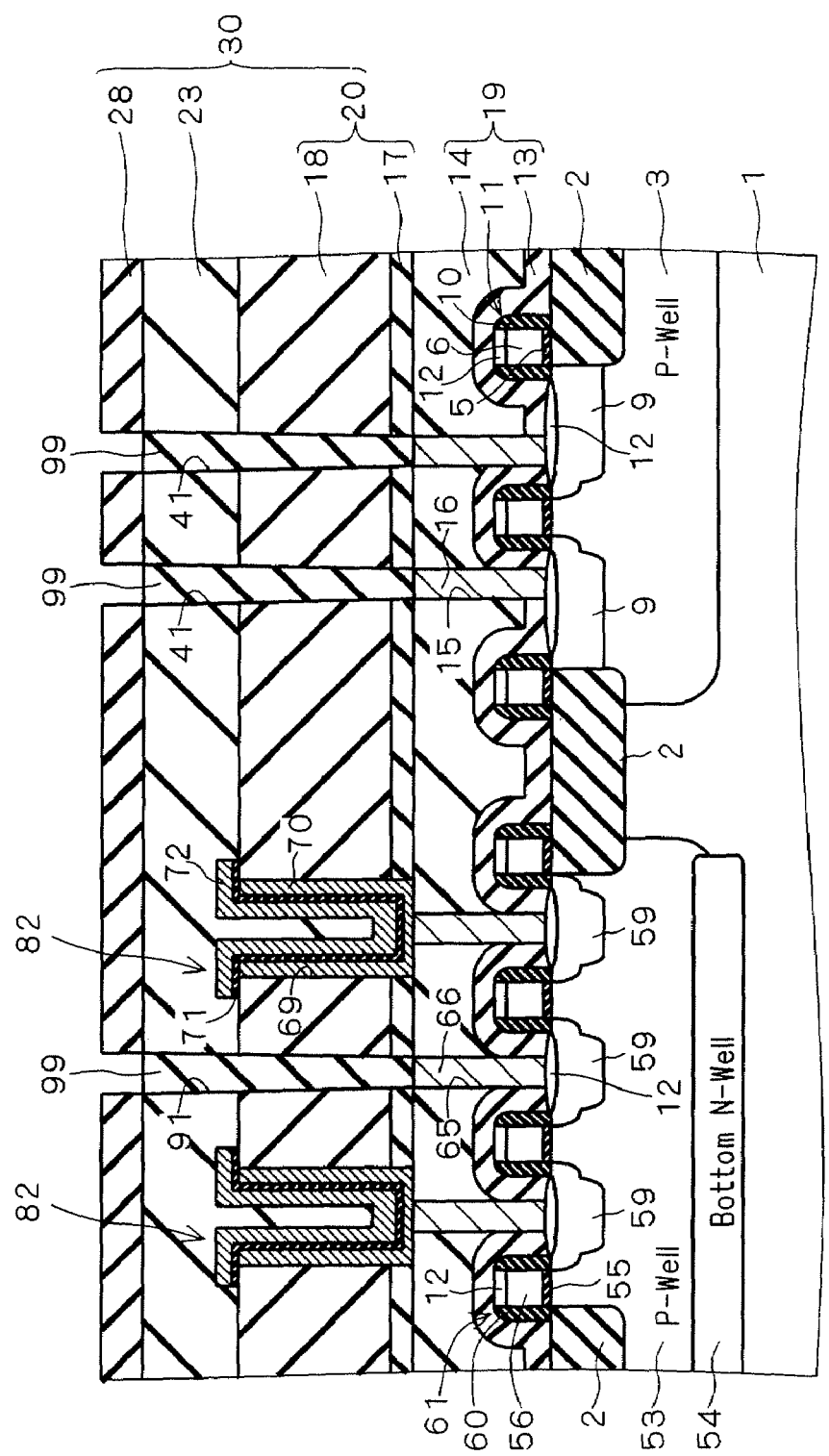

Then, a resist 99 is applied to the entire surface to fill in the contact holes 41 and 91. The resist 99, as shown in FIG. 32, is dry etched from its upper surface, and its upper part above the insulating layer 23 is removed.

Figure 33:
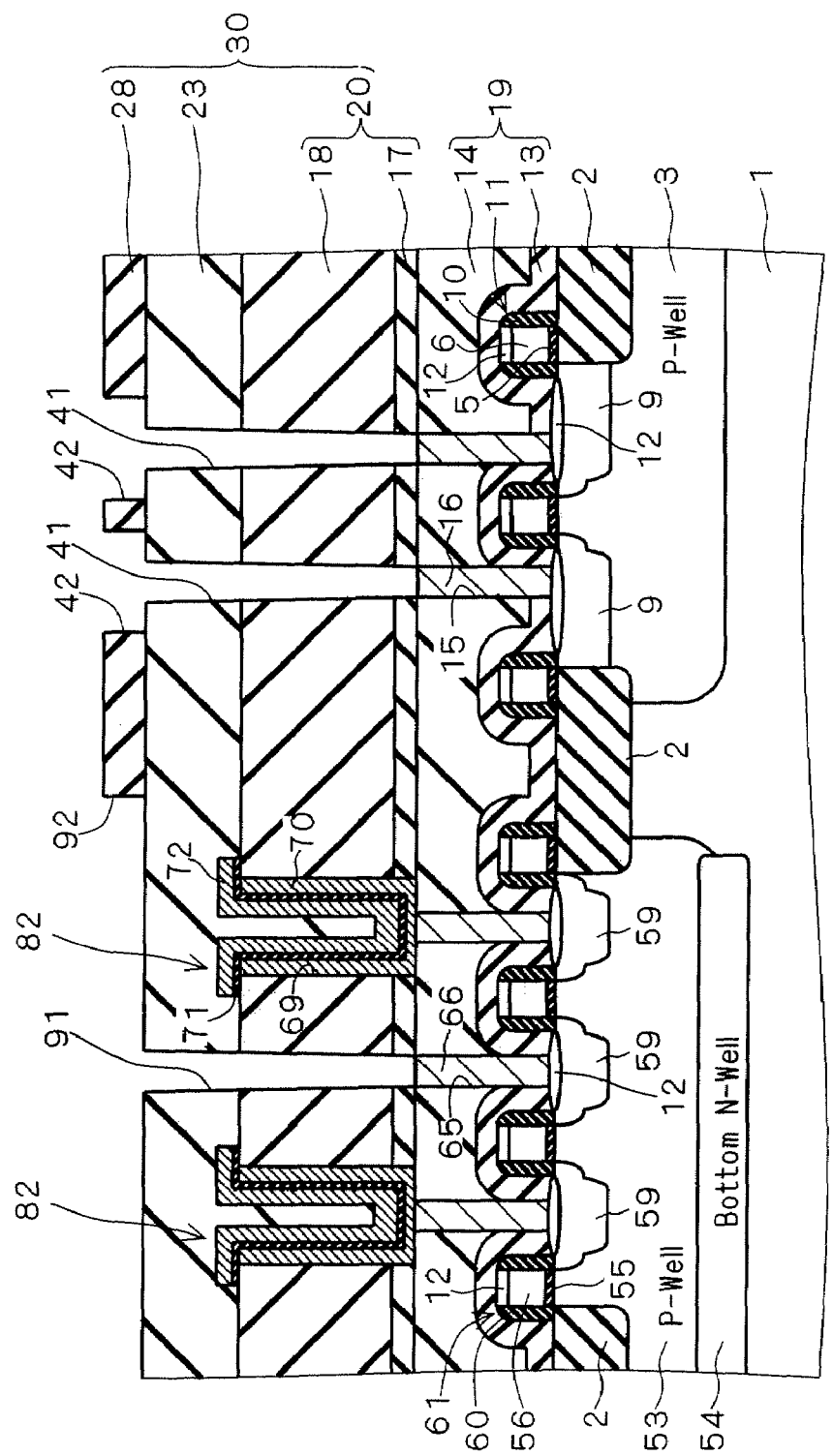

Then, a photoresist (not shown) having a predetermined pattern is formed on the insulating layer 28 and, using the photoresist and the resist 99 as masks, the insulating layer 28 is removed by etching. The photoresist and the resist 99 are then removed. Thereby, as shown in FIG. 33, the openings 42 connected with the contact holes 41 and the openings 92 connected with the contact holes 91 are formed in the insulating layer 28.

Then, a barrier metal layer of, for example, tantalum nitride is formed over the entire surface and thereafter, a copper material is formed at a time on the insulating layer 28 to fill in the contact holes 41, 91 and the openings 42, 92. Then, the barrier metal layer and the copper material on the upper surface of the insulating layer 28 are removed by, for example, CMP. This completes the structure shown in FIG. 29, i.e., forms the barrier metal layers 45 which cover the surfaces of the contact holes 41 and the openings 42, the contact plugs 43 which fill in the contact holes 41, and the copper interconnections 44 which fill in the openings 42. At the same time, there are also formed the barrier metal layers 95 which cover the surfaces of the contact holes 91 and the openings 92, the contact plugs 93 which fill in the contact holes 91, and the copper interconnections 94 which fill in the openings 92.

Thus, in the semiconductor device manufacturing method according to the fifth preferred embodiment, since the contact holes 41 and the openings 42 are filled at one time with the copper material, the contact plugs 43 and the copper interconnections 44 are formed at the same time. Similarly, since the contact holes 91 and the openings 92 are filled at one time with the copper material, the contact plugs 93 and the copper interconnections 94 are formed at the same time.

In the aforementioned first preferred embodiment, on the other hand, after formation of the contact plugs 25 and 75, the openings 26 and 86 are formed and thereafter, the copper interconnections 29 and 88 are formed. That is, the contact plugs 25 and the copper interconnections 29, or the contact plugs 75 and the copper interconnections 88 are formed at different steps, i.e., they are not formed at the same time.

Thus, the semiconductor device manufacturing method according to the fifth preferred embodiment can reduce the number of manufacturing steps and have excellent mass productivity, as compared with that according to the first preferred embodiment in which the contact plugs and the copper interconnections are formed at different steps.

In the semiconductor device manufacturing methods according to the aforementioned second through fourth preferred embodiments, the contact holes 24 and 74, the contact plugs 25 and 75, the openings 26 and 86, the barrier metal layers 27 and 87, and the copper interconnections 29 and 88 may be replaced respectively with the contact holes 41 and 91, the contact plugs 43 and 93, the openings 42 and 92, the barrier metal layers 45 and 95, and the copper interconnections 44 and 94.

Figure 34:
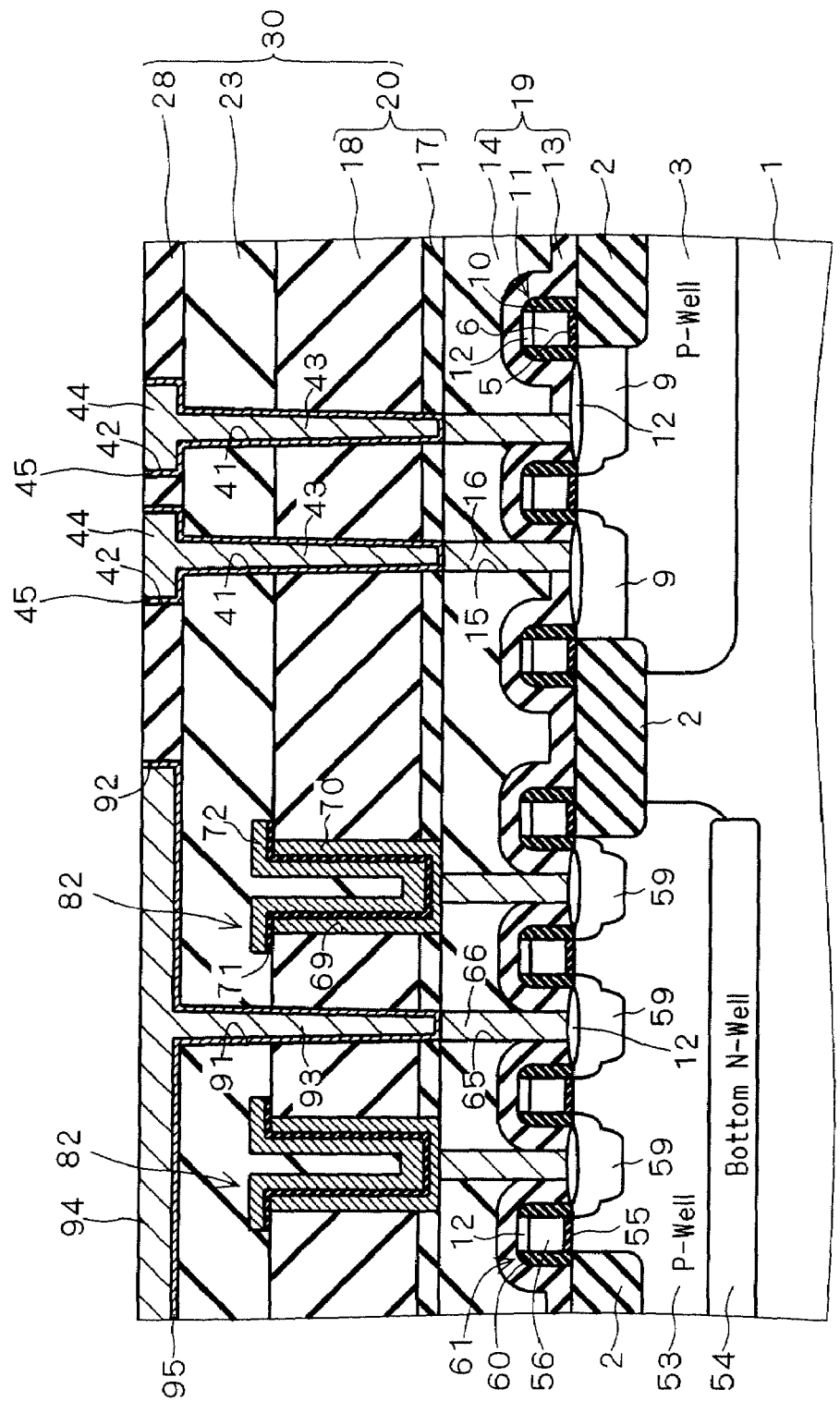
Figure 35:
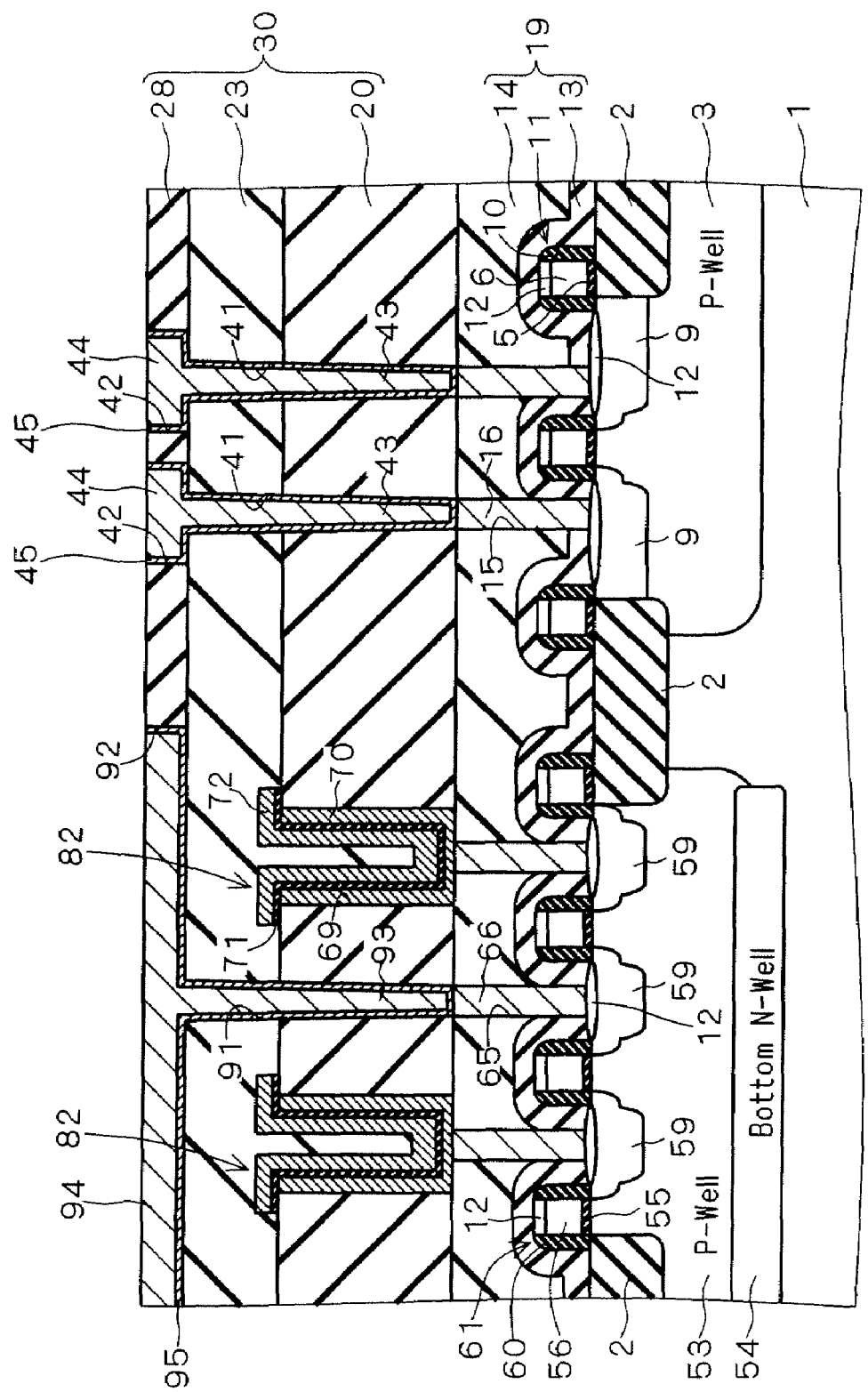
Figure 36:
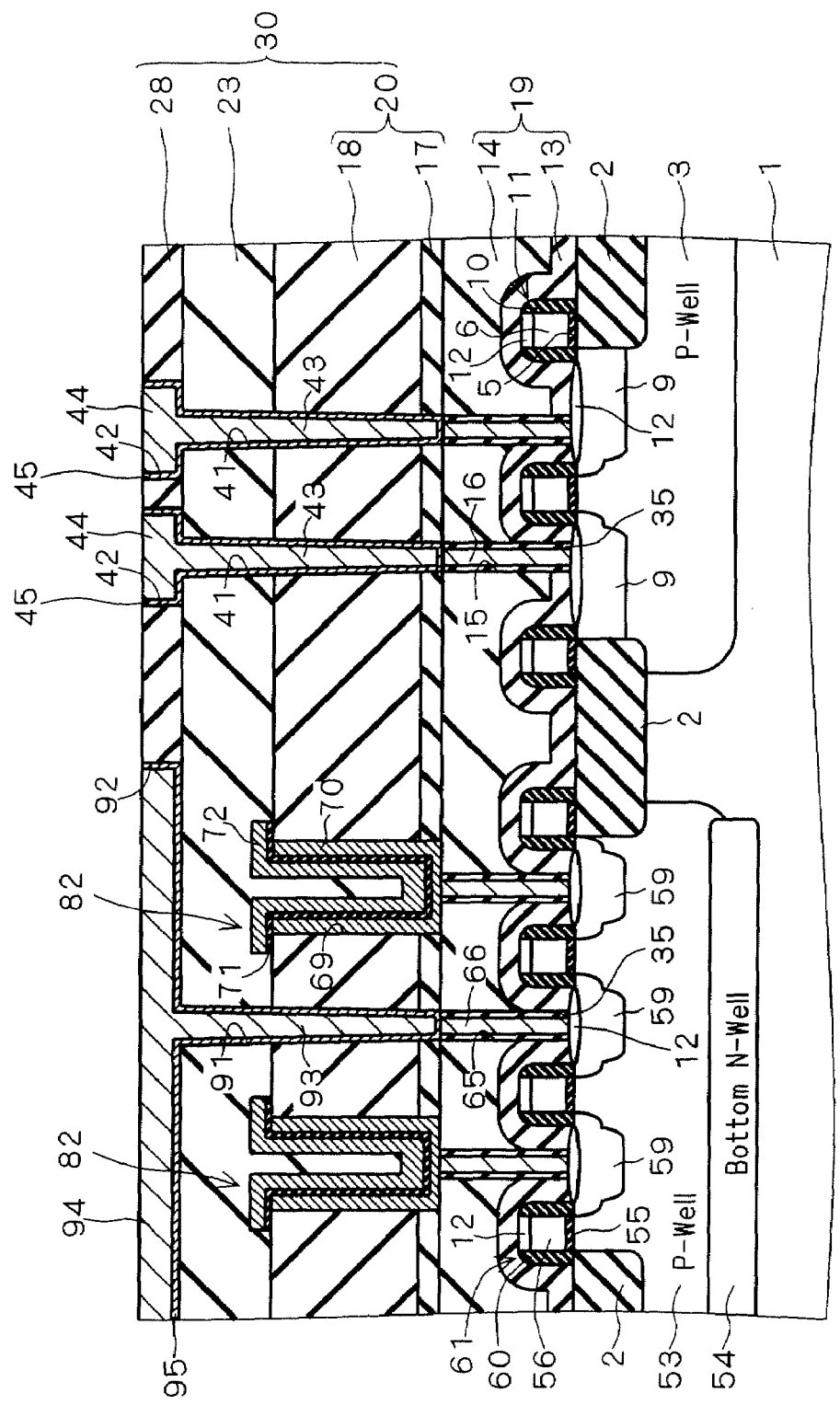
Figure 37:
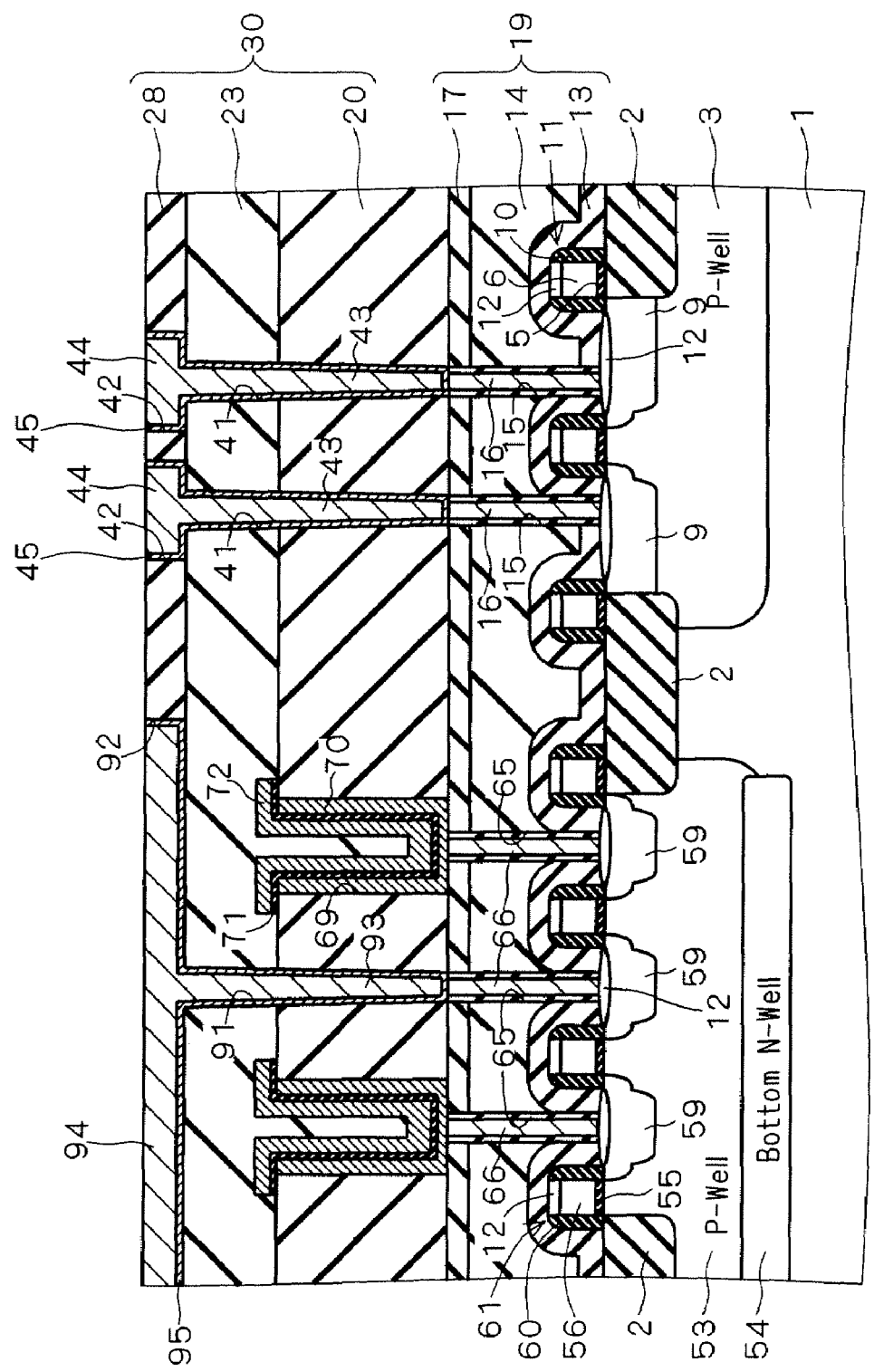
Figure 38:
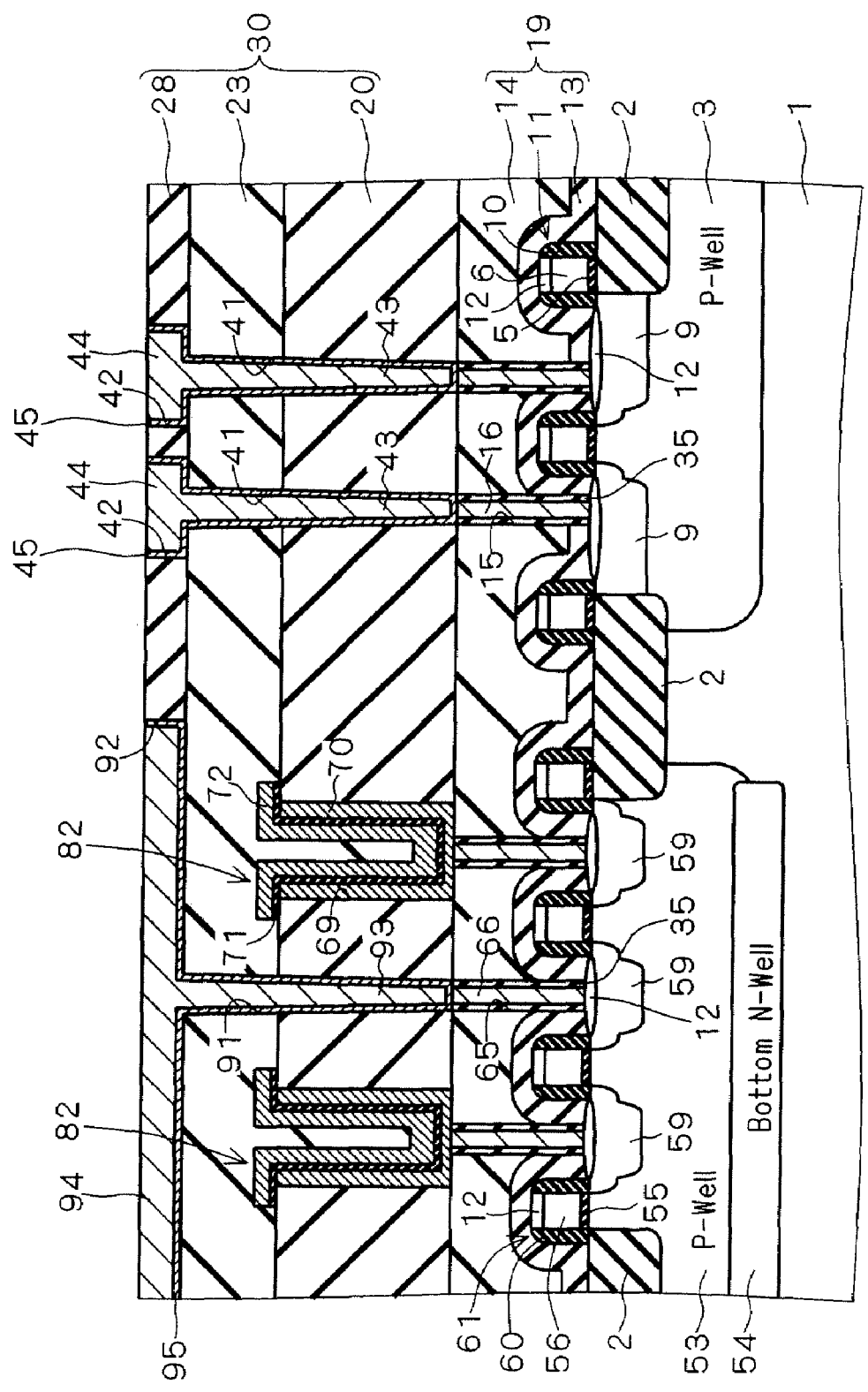
Figure 39:
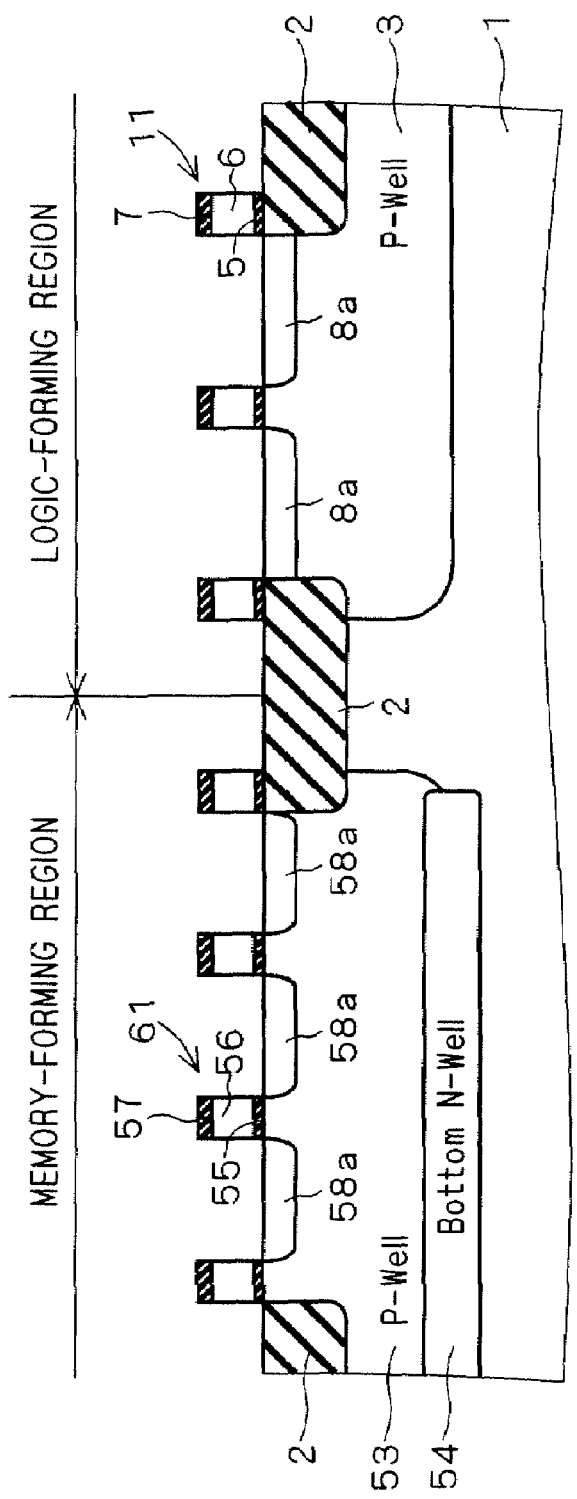
FIGS. 39 through 51 are cross-sectional views showing a sequence of process steps in a conventional semiconductor device manufacturing method.
Figure 40:
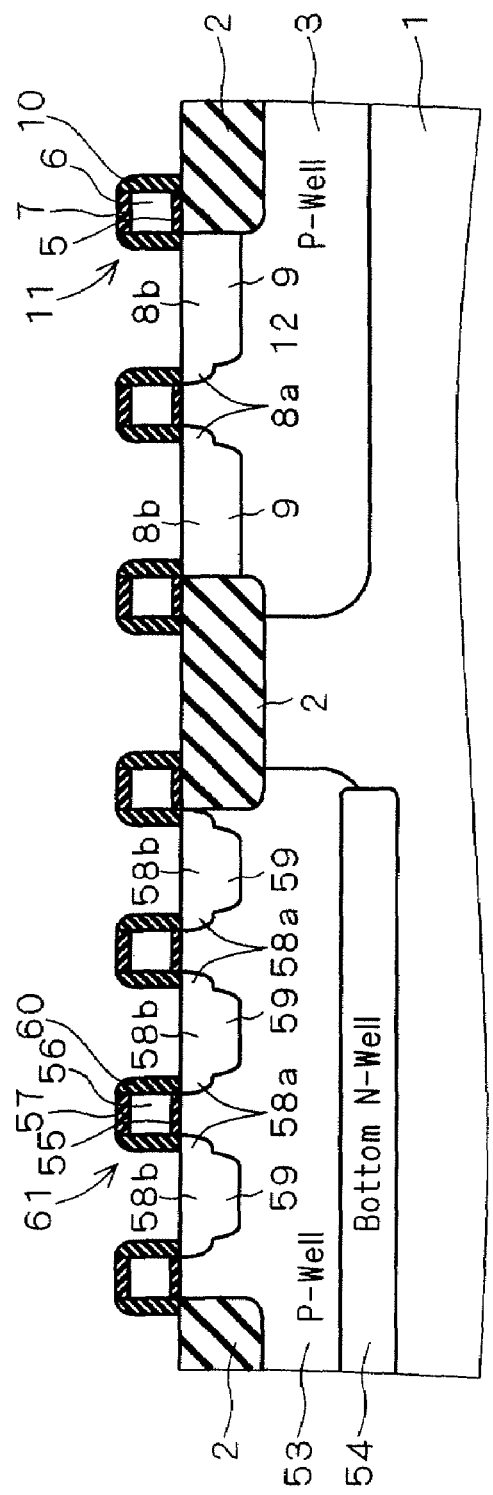
Figure 41:
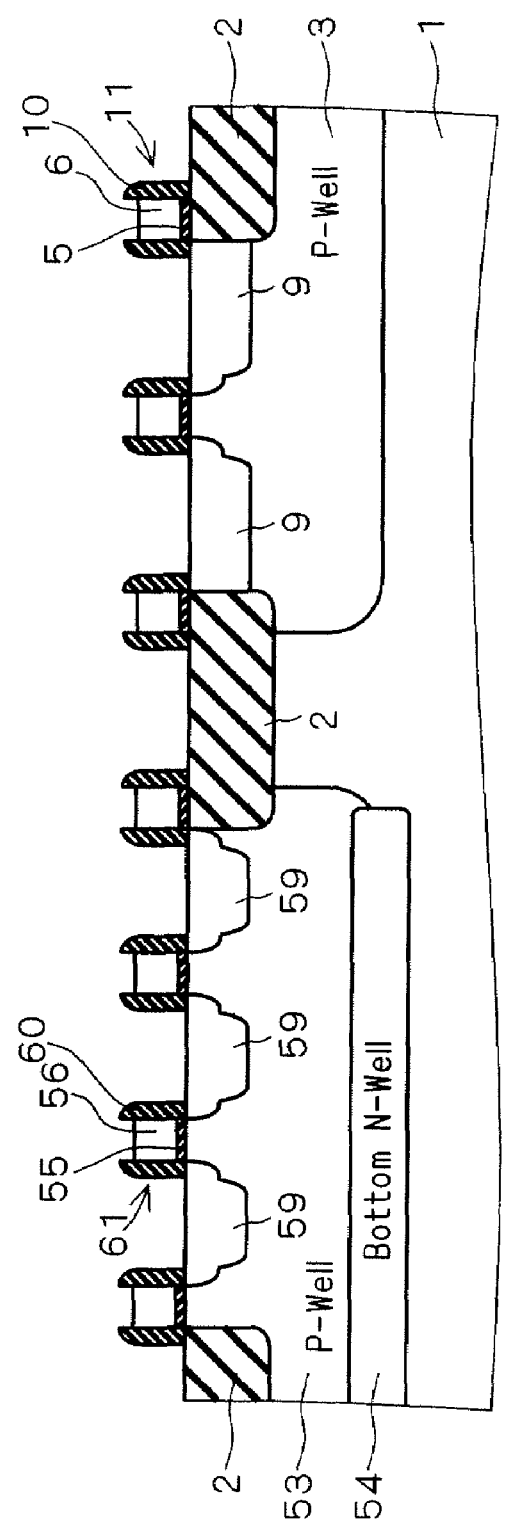

More specifically, in each of the second through fourth preferred embodiments, after formation of the capacitors 82, the insulating layers 23 and 28 are formed in this order over the entire surface (see FIG. 30) and thereafter, the contact holes 41, 91 and the openings 42, 92 are formed according to the aforementioned manufacturing method (see FIGS. 31 to 33). Then, a barrier metal layer is formed over the entire surface and a copper material is formed at one time on the insulating layer 28 to fill in the contact holes 41, 92 and the openings 42, 92. After that, the barrier metal layer and the copper material on the upper surface of the insulating layer 28 are removed by, for example, CMP. This results in the structures shown in FIGS. 34 to 38. The structures shown in FIGS. 34 and 35 correspond respectively to the second and third preferred embodiment. The structures shown in FIGS. 36 to 38 correspond to the examples of the fourth preferred embodiment which are associated respectively with the first to third preferred embodiments.

By applying the inventive features of the fifth preferred embodiment to the semiconductor device manufacturing methods according to the aforementioned second through fourth preferred embodiments, the effect as above described can be achieved in addition to the effects obtained from the respective preferred embodiments.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
   (a) preparing a semiconductor substrate having a first region where a memory device is formed and a second region where a logic device is formed;
   (b) forming a first insulating layer on said semiconductor substrate;
   (c) forming first through third contact plugs in said first insulating layer, said first and second contact plugs being electrically connected to said semiconductor substrate in said first region and having their upper surfaces exposed from said first insulating layer, said third contact plug being electrically connected to said semiconductor substrate in said second region and having its upper surface exposed from said first insulating layer;
   (d) forming a second insulating layer on said first insulating layer and on said first through third contact plugs;
   (e) forming a first opening in said second insulating layer to expose said first contact plug;
   (f) forming a capacitor, which is in contact with said first contact plug, in said first opening;
   (g) forming a third insulating layer on said second insulating layer to cover said capacitor;
   (h) forming fourth and fifth contact plugs in said second and third insulating layers, said fourth contact plug being electrically connected to said second contact plug and having its upper surface exposed from said third insulating layer, said fifth contact plug being electrically connected to said third contact plug and having its upper surface exposed from said third insulating layer;
   (i) forming a fourth insulating layer on said third insulating layer and on said fourth and fifth contact plugs;
   (j) forming second and third openings in said fourth insulating layer to expose said fourth and fifth contact plugs, respectively; and
   (k) forming a first copper interconnection which fills in said second opening and is electrically connected to said fourth contact plug, and a second copper interconnection which fills in said third opening and is electrically connected to said fifth contact plug.

2. The method of manufacturing a semiconductor device according to claim 1, wherein
   said first insulating layer includes a stopper film in its uppermost part,
   in said step (c), said first through third contact plugs are formed to be exposed from said stopper film,
   in said step (d), said second insulating layer is formed on said stopper film and on said first through third contact plugs,
   in said step (e), said first opening is formed by etching said second insulating layer using said stopper film and said first contact plug as etch stops, and
   said steps (h) includes the steps of:
   (h-1) etching said second and third insulating layer, using said stopper film and said second and third contact plugs as etch stops, thereby to form a first contact hole extending to said second contact plug and a second contact hole extending to said third contact plug in said second and third insulating layers; and (h-2) forming said fourth contact plug which fills in said first contact hole, and said fifth contact plug which fills in said second contact hole.

3. The method of manufacturing a semiconductor device according to claim 1, wherein in said step (a), said semiconductor substrate is prepared in which a first gate structure including a first gate electrode is formed on an upper surface in said first region and a second gate structure including a second gate electrode is formed on said upper surface in said second region, in said step (b), said first insulating layer is formed on said semiconductor substrate to cover said first and second gate structures, said step (c) includes the steps of:

(c-1) etching said first insulating layer to form third and fourth contact holes, each being located on a side of said first gate structure, in said first insulating layer in said first region and to form a fifth contact hole, which is located on a side of said second gate structure, in said first insulating layer in said second region;

(c-2) forming an insulation film on a side surface of each of said third through fifth contact holes;

(c-3) after said step (c-2), forming said first contact plug which fills in said third contact hole, said second contact plug which fills in said fourth contact hole, and said third contact plug which fills in said fifth contact hole.

4. The method of manufacturing a semiconductor device according to claim 1, wherein in said step (a), said semiconductor substrate is prepared in which first and second source/drain regions are formed in an upper surface in said first region with a predetermined distance from each other, and a gate structure is formed on said upper surface between said first and second source/drain regions, in said step (c), said first and second contact plugs are formed to be electrically connected to said first and second source/drain regions, respectively, and said first copper interconnection is a bit line of said memory device.

5. The method of manufacturing a semiconductor device according to claim 3, wherein in said step (a), said semiconductor substrate is prepared in which first and second source/drain regions are formed in an upper surface in said first region, with a predetermined distance from each other, said first gate structure is formed on said semiconductor substrate between said first and second source/drain regions, in said step (c), said first and second contact plugs are formed to be electrically connected to said first and second source/drain regions, respectively, and said first copper interconnection is a bit line of said memory device.

6. A method of manufacturing a semiconductor device, comprising the steps of:

(a) preparing a semiconductor substrate having a first region where a memory device is formed and a second region where a logic device is formed;

(b) forming a first insulating layer on said semiconductor substrate;

(c) forming first through third contact plugs in said first insulating layer, said first and second contact plugs being electrically connected to said semiconductor substrate in said first region and having their upper surfaces exposed from said first insulating layer, said third contact plug being electrically connected to said semiconductor substrate in said second region and having its upper surface exposed from said first insulating layer;

(d) forming a second insulating layer on said first insulating layer and on said first through third contact plugs;

(e) forming a first opening in said second insulating layer to expose said first contact plug;

(f) forming a capacitor, which is in contact with said first contact plug, in said first opening;

(g) forming a third insulating layer on said second insulating layer to cover said capacitor;

(h) forming a first contact hole extending to said second contact plug and a second contact hole extending to said third contact plug in said second and third insulating layers, and forming a second opening connected with said first contact hole and a third opening connected with said second contact hole in said third insulating layer; and (i) filling said first contact hole and said second opening at one time with a copper material to form a fourth contact plug which fills in said first contact hole and a first copper interconnection which fills in said second opening, and filling said second contact hole and said third opening at one time with a copper material to form a fifth contact plug which fills in said second contact hole and a second copper interconnection which fills in said third opening.

7. The method of manufacturing a semiconductor device according to claim 6, wherein said first insulating layer includes a stopper film in its uppermost part, in said step (c), said first through third contact plugs are formed to be exposed from said stopper film, in said step (d), said second insulating layer is formed on said stopper film and on said first through third contact plugs, in said step (e), said first opening is formed by etching said second insulating layer using said stopper film and said first contact plug as etch stops, and said step (h) includes the steps of:

(h-1) etching said second and third insulating layers, using said stopper film and said second and third contact plugs as etch stops, thereby to form said first and second contact holes in said second and third insulating layers; and (h-2) forming said second and third openings in said third insulating layer.

8. The method of manufacturing a semiconductor device according to claim 6, wherein in said step (a), said semiconductor substrate is prepared in which a first gate structure including a first gate electrode is formed on an upper surface in said first region, and a second gate structure including a second gate electrode is formed on said upper surface in said second region, in said step (b), said first insulating layer is formed on said semiconductor substrate to cover said first and second gate structures, and said step (c) includes the steps of:

(c-1) etching said first insulating layer to form third and fourth contact holes, each being located on a side of said first gate structure, in said first insulating layer in said first region, and to form a fifth contact hole, which is located on a side of said second gate structure, in said first insulating layer in said second region; and (c-2) forming an insulation film on a side surface of each of said third through fifth contact holes; and (c-3) after said step (c-2), forming said first contact plug which fills in said third contact hole, said second contact plug which fills in said fourth contact hole, and said third contact plug which fill in said fifth contact hole.

9. The method of manufacturing a semiconductor device according to claim 6, wherein in said step (a), said semiconductor substrate is prepared in which first and second source/drain regions are formed in an upper surface in said first region with a predetermined distance from each other, and a gate structure is formed on said upper surface between said first and second source/drain regions, in said step (c), said first and second contact plugs are formed to be electrically connected to said first and second source/drain regions, respectively, and said first copper interconnection is a bit line of said memory device.

10. The method of manufacturing a semiconductor device according to claim 8, wherein in said step (a), said semiconductor substrate is prepared in which first and second source/drain regions are formed in an upper surface in said first region, with a predetermined distance from each other, said first gate structure is formed on said semiconductor substrate between said first and second source/drain regions, in said step (c), said first and second contact plugs are formed to be electrically connected to said first and second source/drain regions, respectively, and said first copper interconnection is a bit line of said memory device.

* * * * *